United States Patent [19]

Schary

[11] Patent Number: 5,627,389

[45] Date of Patent: May 6, 1997

[54] HIGH-FREQUENCY TRAVELING WAVE FIELD-EFFECT TRANSISTOR

[76] Inventor: Alison Schary, 600 Warren Rd. Apt. 9-2D, Ithaca, N.Y. 14850

[21] Appl. No.: 275,999

[22] Filed: Jul. 15, 1994

[51] Int. Cl.$^6$ ................................................. H01L 29/80
[52] U.S. Cl. .......................... 257/275; 257/280; 257/282; 257/256
[58] Field of Search .......................... 257/280, 275, 257/282, 283, 285, 287, 256, 414

[56] References Cited

U.S. PATENT DOCUMENTS

| | | | |
|---|---|---|---|
| 3,737,743 | 6/1973 | Goronkin et al. | 257/280 |
| 3,951,708 | 4/1976 | Dean | 437/39 |
| 4,065,782 | 12/1977 | Gray et al. | 257/259 |
| 4,107,720 | 8/1978 | Pucel et al. | 257/256 |
| 4,297,718 | 10/1981 | Nishizawa et al. | 257/259 |
| 4,536,942 | 8/1985 | Chao et al. | 437/177 |
| 4,549,197 | 10/1985 | Brehm et al. | 257/275 |
| 4,587,541 | 5/1986 | Dalman et al. | 330/277 |
| 4,621,239 | 11/1986 | Tserng | 331/99 |
| 4,675,712 | 6/1987 | Oxley et al. | 257/259 |
| 4,733,195 | 3/1988 | Tserng et al. | 330/286 |
| 4,853,649 | 8/1989 | Seino et al. | 330/277 |
| 4,935,789 | 6/1990 | Calviello | 257/287 |
| 5,138,406 | 8/1992 | Calviello | 257/256 |
| 5,321,284 | 6/1994 | Scott et al. | 257/282 |

OTHER PUBLICATIONS

V.K. Tripathi, "Asymmetric Coupled Transmission Lines, etc." Sep. 1975, pp. 734–739.
G.W. McIver, "A Traveling–Wave Transistor", Nov. 1965, pp. 1747–1748.
A.S. Podgorski et al., "Theory of Traveling–Wave, etc.", Dec. 1982, pp. 1845–1853.
A.J. Holden et al., "Gallim Arsenide Traveling–Wave, etc.", Jan. 1985, pp. 61–66.
K. Rauschenbach, "Design and Frabrication of the Self–Aligned, etc.", Feb. 1992, pp. 219–225.

W. Heinrich, "Wave Propagation onf MESFET Electrodes, etc.", Jan. 1987, pp. 1–8.
W. Heinrich et al., "Distributed Equivalent–Circuit Model, etc.", May 1987, pp. 487–491.
W. Heinrih et al., "Field–theoretic analysis of wave, etc.", 1985, pp. 613–627.
S. El–Ghazaly et al., "Traveling–Wave Inverted–Gate, etc.", Jun. 1989, pp. 1027–1032.
S.E. Laux, "Techniques for Small–Signal Analysis, etc.", Oct. 1985, pp. 2028–2037.
S. D'Agostino et al., "Analytical Modeling and Design, etc.", Feb. 1992, pp. 202–208.
R.E. Collin, "Foundations for microwave engineering", 1966, pp. 77–82, 157–158.
R.E. Collin, "Field Theory of Guided Waves", 1991, pp. 247–252.

(List continued on next page.)

*Primary Examiner*—Sara W. Crane
*Assistant Examiner*—Fetsum Abraham
*Attorney, Agent, or Firm*—Edwin H. Paul; Stephen Y. Chow; Jerry Cohen

[57] ABSTRACT

A method of improving the performance of a traveling wave field-effect transistor operated at frequencies in the microwave range or above the microwave range comprising the steps of forming a depletion region beneath a gate electrode wherein, in a plane transverse to the direction of signal propagation, a depletion region edge has a first end portion located between the gate electrode and a drain electrode and a second end portion located between the gate electrode and a source electrode; and separating the depletion region edge from the drain electrode. Further improvements in the operation of the TWFET include adjusting the first end portion of the depletion region edge to be closer to the gate electrode relative to the distance between the second end portion of the depletion region edge and the gate electrode, controlling an effective conductivity of a semiconductor of the traveling-wave field effect transistor, and setting the length of the gate electrode at substantially 1.0 micron.

21 Claims, 78 Drawing Sheets

OTHER PUBLICATIONS

E.S. Kuh et al., "Theory of Linear Active Networks", 1967, pp. 216–257.

S.M. Sze, "Physics of Semiconductor Devices", 1981, pp. 29, 334, 336, 344.

S. Ramao et al., "Fields and Waves in Communication Electronics", 1965, pp. 314–316.

R.S. Muller et al., "Device Electronics for Integrated Circuits", 1986, pp. 203, 205–206.

S. Yngvesson, "Microwave Semiconductor Devices", 1991, pp. 330–332.

T. Enoki et al., "Characteristics Including Electron Velocity, etc.", Apr. 1990, pp. 935–941.

K. Yamasaki et al., "Self–Align Implantation for, etc.", Feb. 1982, pp. 119–121.

K. Kano, "Physical and Solid State Electrnics", 1972, pp. 295–299.

B.G. Streetman, "Solid State Electronic Devices", 1980, pp. 285–293.

A. van der Ziel, "Solid State Physical Electronics", 1976, pp. 436–440, 446–454.

A. van der Ziel et al., "Small–Signal, High–Frequency Theory, etc.", Apr. 1964, pp. 128–135.

P. Wolf, "Microwave Properties of Schottky–barrier, etc.", Mar. 1970. pp. 125–141.

C.A. Liechti, "Microwave Field–Effect Transistors", Jun. 1976, pp. 279–300.

A.J. Holden et al., "Computer Modelling of Travelling Wave Transistors", Jul. 1984, pp. 319–326

A.J. Holden et al., "Distributed Effects at High Frequency in Active, etc.", 1983, pp. 5/1–5/5.

A. Holden et al., "Travelling Wave Transistors: Modelling and Fabrication", Apr. 1986, pp. 11/1–11/5.

Leichti, Charles A., "Microwave Field–Effect Transistors–1976", IEEE Transactions on Microwave Theory and Techniques, Jun. 1976, pp. 279–300.

Device Electronics for Integrated Circuits, Second Edition Richard S. Muller, Theodore I. Kamins.

HIGH-FREQUENCY TRAVELING WAVE FIELD-EFFECT TRANSISTOR

BACKGROUND OF THE INVENTION

1. Field of the Invention

This invention relates to field-effect transistors, and in particular to traveling wave field-effect transistors (TWFETs) for use at frequencies in the microwave range and above the microwave range.

2. Description of the Prior Art

The prior art concepts for the design of high frequency semiconductor transistors, in particular field effect transistors (FETs), have obtained limited improvements in transistor performance in the aspects of signal power output and signal power gain at these high frequencies. Previous attempts to improve the performance of FETs for operation at these high frequencies have included the use of TWFETs. U.S. Pat. No. 4,065,782 presents the TWFET as an FET in which some of the FET's electrodes are adapted for use as coupled transmission lines. This concept was extended in U.S. Pat. No. 4,675,712, which presents a TWFET with a drain electrode that includes a meander segment. In U.S. Pat. No. 4,733,195, a TWFET is designed with unmatched termination impedances on the input and output transmission lines.

A TWFET comprises parallel elongated source, gate and drain electrodes disposed on a substrate of semiconductor material with an active channel connecting the electrodes. The direction of signal propagation is along the axis of these parallel electrodes. In the plane transverse to this direction of signal propagation, i.e. the cross-section of the TWFET, the arrangement of the electrodes and channel form an FET. In other attempts to improve the performance of TWFETs at high frequencies, this cross-section of the TWFET has been modified. For example, in U.S. Pat. No. 4,297,718 the TWFET's cross-section is designed as a vertical FET. In U.S. Pat. No. 4,587,541, the TWFET's cross-section is designed as dual-FETs.

All of these devices, however, achieve moderate increases in signal power output and signal power gain, particularly at high frequencies.

SUMMARY OF THE INVENTION

It is therefore a primary object of the present invention to provide signal power gain in a TWFET, operated at frequencies in the microwave range and above the microwave range, above the maximum frequency for which signal amplification would be possible for the FET contained in the cross-section of the TWFET.

It is another object of the present invention to increase the signal power amplification capability in a TWFET, operated at frequencies in the microwave range and above the microwave range, above the signal power amplification capability of the FET contained in the cross-section of the TWFET.

It is a further object of the present invention to provide signal power gain in a TWFET, operated at frequencies in the microwave range and above the microwave range, above the maximum signal power gain that would be possible for the FET contained in the cross-section of the TWFET.

These and other objects of the present invention are attained by forming a depletion region beneath a gate electrode wherein, in a plane transverse to the direction of signal propagation, a depletion region edge has a first end portion located between the gate electrode and a drain electrode and a second end portion located between the gate electrode and a source electrode; and separating the depletion region edge from the drain electrode. Further improvements in the operation of the TWFET include adjusting the first end portion of the depletion region edge to be closer to the gate electrode relative to the distance between the second end portion of the depletion region edge and the gate electrode, controlling an effective conductivity of a semiconductor of the traveling-wave field effect transistor, and setting the length of the gate electrode at substantially 1.0 micron.

BRIEF DESCRIPTION OF THE DRAWING

For a better understanding of these and other objects of the present invention, reference is made to the detailed description of the invention which is to be read in conjunction with the following figures of the drawing, wherein.

DESCRIPTION OF THE PREFERRED EMBODIMENT

Figure 1:
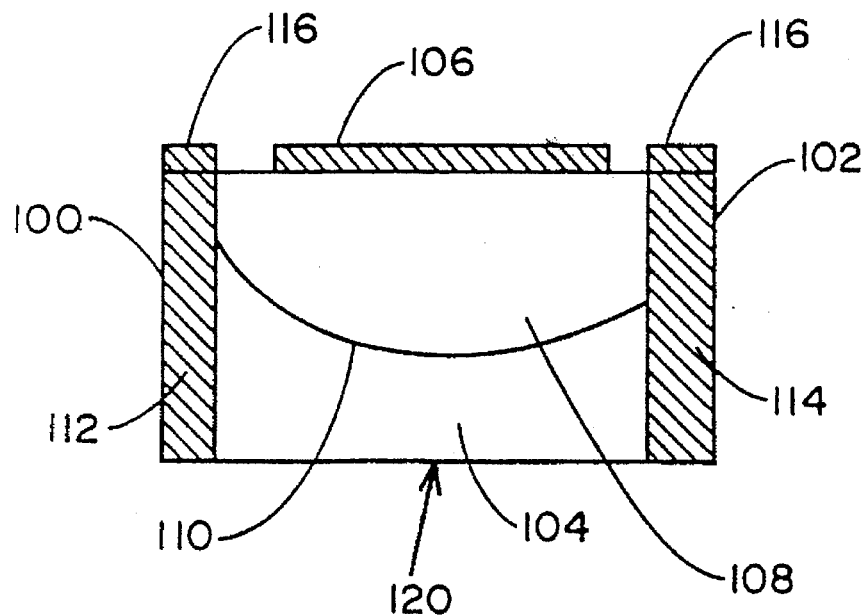
FIG. 1 is a schematic cross-section of a prior art FET.

The present invention makes use of a physical effect in the structure of a TWFET called non-reciprocal inductive coupling. The description of the preferred embodiment begins the discussion of non-reciprocal inductive coupling with a description of ideal coupled transmission lines. This includes a description of the inductance and admittance coupling matrices in ideal coupled transmission lines, using the TEM mode analysis. The description of the preferred embodiment then uses the TEM mode analysis to discuss the operation of the TWFET structure, in which the inductance and admittance coupling matrices can be non-reciprocal. The TEM mode analysis provides a good approximation to the distribution of transverse electric and magnetic fields of the propagating mode in the TWFET. These transverse electric and magnetic fields are the equivalent, in the TWFET structure, to the voltage and current waves of the transmission line.

In the case of ideal transmission lines, perfectly conducting rods are used to guide the propagating wave. These rods are imbedded in a homogeneous, linear medium, are aligned along the direction of wave propagation, and are uniform along this axis. A transmission line structure of n coupled transmission lines is formed from (n+1) conducting rods. The TEM mode which propagates along this transmission line structure can be considered to provide a voltage wave in the plane orthogonal to the direction of propagation. This voltage wave arises from the nature of the TEM mode which allows an electrostatic potential to be defined in the plane orthogonal to the direction of propagation. Consequently, in this transverse plane, each of the n conductors can have a potential defined relative to a reference potential on the (n+1)rst conductor. This (n+1)rst conductor is often designated as the ground conductor of the coupled transmission lines.

Accompanying this voltage configuration within this plane is a distribution of charge quantifies on the (n+1) conductors. This charge distribution propagates with the voltage wave, varying with time and along the direction of propagation, to provide the current wave of the TEM mode. In the case of a single transmission line formed from two conducting rods, the voltage and current distributions are what is commonly known as the voltage and current of the transmission line. In a system of n coupled transmission lines, any propagating TEM wave can be formed from a superposition of the eigenmodes of voltage and current waves for the system of transmission lines.

The equation for the propagation of the voltage wave of an eigenmode for the system of transmission lines provides an important relationship between the charge coupling and the inductive coupling of the transmission lines.

The voltage eigenmode is defined as:

$$v = v_0 e^{(j\omega t - \gamma z)}$$

where $v$ is a vector of the voltages on the n conductors relative to the (n+1)rst reference conductor, $j$ is $\sqrt{-1}$, $\omega$ is the angular frequency, $z$ is the direction of propagation, $t$ is time, and $\gamma$ is the propagation constant of the voltage wave eigenmode.

The charge matrix, K, which relates the voltage and charge distribution for the n transmission lines, is defined as:

$$q = Kv$$

where $q$ is a vector of charges on the n conductors, and K is an n×n matrix relating the charge vector, $q$, to the voltage vector $v$.

Based on the preceding notation, the relationship between the voltage and current eigenmodes is defined as:

$$\begin{aligned}
\frac{d}{dz} v &= -\gamma v \\
&= -\gamma K^{-1} q \\
&= -j\omega \mu_0 \epsilon K^{-1} i \\
&= -j\omega L i \\
&= -Z i
\end{aligned}$$

where $v$ and $i$ represent voltage and current vectors, and $\epsilon$ and $\mu_0$ represent the dielectric constant and permeability of the medium surrounding the transmission lines. In this equation, the permeability of the surrounding medium is assumed to be the permeability of free space. Therefore, $\mu = \mu_0$ is used. This result can be recognized as the transmission line equation for the z-derivative of the voltage eigenvector. It can be seen to follow from the relationship between the inductive coupling matrix, L and the charge matrix, K:

$$L = \mu_0 \epsilon K^{-1} = \left( \frac{1}{v_c^2} \right) K^{-1}$$

where $v_c$ is the speed of light in the medium containing the transmission lines. In this case of ideal transmission lines, the impedance coupling matrix, Z, is equated to the product $j\omega L$.

The preceding relationship between voltage and current vectors provides one of the two well-known transmission line equations. The other equation is defined as:

$$\begin{aligned}
\frac{d}{dz} i &= -\left( \left( \frac{\sigma}{\epsilon} \right) + j\omega \right) K v \\
&= -Y v
\end{aligned}$$

This last equation implies a definition for the admittance matrix of the coupled transmission lines which can be stated as:

$$Y = \left( \frac{\sigma}{\epsilon} + j\omega \right) K$$

In these equations, $\sigma$ is the conductivity of the surrounding medium, and $\epsilon$ is its dielectric constant.

In this case of ideal transmission lines, the Y matrix can be seen to describe the transverse current flow between the electrodes of the transmission lines with the presence of an inter-electrode potential in this transverse plane. For example, consider the case of ideal transmission lines imbedded in a homogeneous medium with finite conductivity. The Y matrix would describe the shunt conductance of an equivalent parallel R-C circuit element model for a differential length section of the structure, with conductance given by the term $$\left( \frac{\sigma}{\epsilon} \right) K$$

and capacitive coupling of these lines given by the term $$(j\omega K)$$

The Z matrix, which is contained in the other transmission line equation for the z-derivative of the voltage eigenvector, describes the change in the voltage with longitudinal direction as related to current flow along the electrodes in the direction of signal propagation in the coupled transmission lines. The i vector corresponds to the surface current flow along the electrodes, which arises with the presence of surface charges on these conductors. In view of this fact, it can be seen that Z, L, and K matrices all pertain to the longitudinal current flow, which is present in all transmission line structures.

In this case of ideal transmission lines (assuming the surrounding medium is linear and reciprocal), it is important to note that the charge matrix of the ideal (passive) transmission line structure is reciprocal and provides reciprocal inductive coupling in these structures. This can be defined in terms of a matrix element, $m_{k1}$, in which $m_{k1} = m_{1k}$. This means that the charge induced on conductor 1 by the presence of a voltage on conductor k is equal to the charge induced on conductor k by the presence of the same voltage on conductor 1.

The equivalences between voltage and current on a transmission line to transverse electric and magnetic fields in non-ideal transmission line structures allows the use of the same equations for ideal coupled transmission lines for the analysis of the TWFET. A detailed derivation of these transmission line equations is presented in Appendix A. In addition, the TEM mode analysis provides a good approximation to the transverse electric and magnetic fields. Therefore, it will be used here to describe the operation of the present invention.

In the present TWFET invention, the Y and Z matrices are considered as 2×2 matrices for the 3 conductors formed by the elongated source, gate, and drain electrodes. While a common source configuration is assumed, it will be obvious to those skilled in the art that the analysis can include other configurations.

In a TWFET, the Y matrix elements are complex valued and describe the FET activity in the plane transverse to the direction of signal propagation by relating the inter-electrode transverse current flow to AC potential difference between the electrodes. Most often, this activity is evaluated using circuit models. An important difference of the Y matrix of the TWFET structure as compared to that of the ideal transmission lines is the nonreciprocity in the Y matrix of the TWFET. At low frequencies, this property appears in the transconductance component of circuit element models for the FET. The presence of this transconductance provides non-reciprocity in that the AC gate voltage transfers an AC particle current to the drain electrode, but an AC drain voltage does not transfer an approximately equal AC particle current to the gate electrode. This is an approximate description of the non-reciprocity feature of the Y matrix of the conventional FET which is made use of in both the present invention and prior art TWFET structures.

The important difference in the present invention, as compared to that of the prior art, is in the design of the properties of the Z matrix. This design difference is found in the inductive coupling matrix which provides part of the Z matrix, with the series resistance on the gate and drain electrodes providing the remaining component:

$$Z = R + j\omega L$$

In the case of the 3 conductor system of the source, gate, and drain electrodes, R is a 2×2 diagonal matrix containing the gate and drain electrode series resistances, and L is the 2×2 inductive coupling matrix for the TWFET. In the present invention, the inductive coupling matrix is designed to have a significant non-reciprocal property.

In the prior art, the inductive coupling matrices have been left as an unspecified component of the TWFET design, or have been analyzed as having reciprocal properties. This reciprocal inductive coupling has been obtained through calculations of the passive electrodes of the TWFET, or has also been obtained with calculations that include capacitances of circuit models for the active FET structure.

The prior art FIG. 1 is used to explain how this reciprocal inductive coupling is obtained with these calculations. In prior art FIG. 1, the FET 120 formed in the cross-section of a TWFET in the plane transverse to the direction of signal propagation comprises a semiconductor material 104, a source electrode 100, a drain electrode 102 and a gate electrode 106. The gate electrode 106 can be either metallic—in which case it forms a Schottky contact to the semiconductor material 104, or it can be formed as a semiconductor of opposite type to the semiconductor material 104. When the semiconductor material 104 is an n-type material and the gate electrode 106 is formed as a p-type semiconductor, the gate electrode 106 is reverse-biased— forming a rectifying contact to the semiconductor material 104 and changing the FET 120 to a junction FET (JFET). In either configuration, either metallic or formed as a semiconductor, the gate electrode 106 is reverse-biased so that little or no DC current flows into the semiconductor material 104 and so that a depletion region 108 is formed under the gate electrode 106.

In prior art FIG. 1, a source electrode region 112 and a drain electrode region 114 can be metals making ohmic contact with the semiconductor material 104 or formed with semiconductor doping. For example, when semiconductor material 104 is n-type, the source electrode region 112 and the drain electrode region 114 are highly doped $n^+$ regions- forming quasi-metallic ohmic regions. These $n^+$-ohmic regions provide an extension to the metallic conductors 116 that contact the source electrode region 112 and the drain electrode region 114. A depletion region edge 110 is in contact with the source electrode region 112 of the source electrode 100 and the drain electrode region 114 of the drain electrode 102.

The calculation of the inductive coupling matrix for this prior art structure proceeds from the calculation of the K matrix, as described earlier for the case of the ideal transmission lines. In this calculation, two AC-bias cases are considered: (a) An AC bias, $v_0$, applied to the gate electrode 106 with the source electrode 100 and the drain electrode 102 maintained at an AC bias of 0 volts; and (b) An AC bias, $v_0$, applied to the drain electrode 102 with the source electrode 100 and the gate electrode 106 maintained at an AC bias of 0 volts. For the common source configuration, an AC bias, $v_0$, refers to an AC excitation of complex value maintained between one electrode relative to the source electrode 100, while an AC bias of 0 volts means that the electrode is kept at the same AC potential as the source electrode 100.

In case (a), the charge induced on the gate electrode 106 and the drain electrode 102 is respectively:

$$q_{g,a} = K_{g-s}v_0 + K_{g-d}O$$

$$q_{d,a} = K_{d-g}v_0 + K_{d-s}O$$

In case (b), the charge induced on the gate electrode 106 and the drain electrode 102 is respectively:

$$q_{g,b} = K_{g-s}O + K_{g-d}v_0$$

$$q_{d,b} = K_{d-g}O + K_{d-s}v_0$$

In these equations, $q_{g,a}$ refers to the AC charge on the gate electrode 106 with AC bias case(a), $q_{d,a}$ refers to the AC charge on the drain electrode 102 with AC bias case(a), $q_{g,b}$ refers to the AC charge on the gate electrode 106 with AC bias case(b), and $q_{d,b}$ refers to the AC charge on the drain electrode 102 with AC bias case(b). $K_{g-s}$, $K_{g-d}$, $K_{d-s}$, and $K_{d-g}$ are the elements of the charge matrix, K. The elements of the first column of the K matrix are $K_{g-s}$ and $K_{d-g}$. These correspond respectively to the ratio of the charge induced on the gate electrode 106 and the drain electrode 102 to the voltage applied to the gate electrode 106 with AC-bias case(a). The elements of the second column of the K matrix are $K_{g-d}$ and $K_{d-s}$. These correspond respectively to the ratio of the charge induced on the gate electrode 106 and the drain electrode 102 to the voltage applied to the drain electrode 102 with AC-bias case(b). The off-diagonal elements of the K matrix are $K_{d-g}$ and $K_{g-d}$.

As prior art FIG. 1 suggests, the interaction of the gate electrode 106 and the drain electrode 102 in these two cases is well-approximated by a simple capacitive coupling between the electrodes. In particular, the charge induced on the drain electrode 102 with the AC bias applied to the gate electrode 106 [case (a)] is approximately equal to the charge induced on the gate electrode 106 with the AC bias applied to the drain electrode 102 [case (b)]. This shows that the off-diagonal elements of the K matrix, $K_{g-d}$ and $K_{d-g}$, are approximately equal to each other. As a result, the K, L, and Z matrices are approximately reciprocal.

The preceding analysis of the K matrix calculation shows that the simple capacitive coupling of the gate electrode 106 and the drain electrode 102 of the prior art TWFET structure leads to reciprocal charge transfer and reciprocal K, L, and Z matrices. In a similar manner, when the K matrix is calculated using capacitances taken from a circuit model for the active FET, while omitting series resistance components of this circuit model, the charge transfer is also reciprocal, as are the K, L and Z matrices resulting from this analysis.

Figure 2:
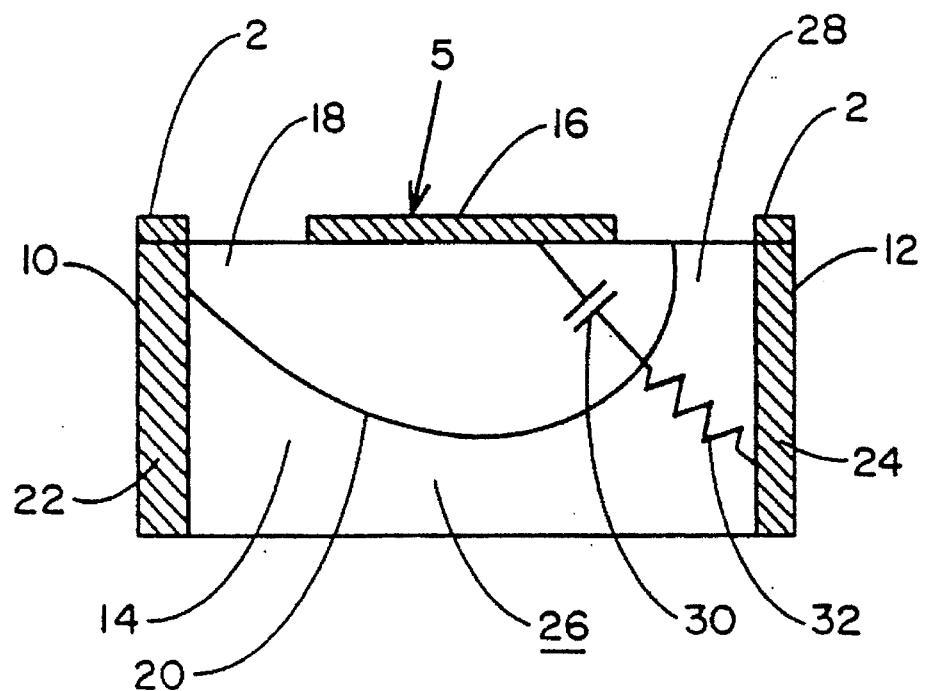
FIG. 2 is an schematic cross-section of an FET that embodies the present invention.

In FIG. 2, the FET 5 formed in the cross-section of a TWFET in the plane transverse to the direction of signal propagation comprises a semiconductor material 14, a source electrode 10, a drain electrode 12 and a gate electrode 16. The gate electrode 16 can be either metallic—in which case it forms a Schottky contact to the semiconductor material 14, or it can be formed as a semiconductor of opposite type to the semiconductor material 14. In either configuration, either metallic or formed as a semiconductor, the gate electrode 16 is reverse-biased herein defined as meaning a bias so that little or no DC current flows into the semiconductor material 14, and so that a depletion region 18 is formed under the gate electrode 16.

In the same manner as the gate electrode 16, a source electrode region 22 and a drain electrode region 24 can be metals making ohmic contact with the semiconductor material 14 or formed with semiconductor doping. For example, when semiconductor material 14 is n-type, the source electrode region 22 and the drain electrode region 24 are highly doped $n^+$ regions—forming quasi-metallic ohmic regions. These $n^+$-ohmic regions provide an extension to the metallic conductors 2 that contact the source electrode region 22 and the drain electrode region 24. In FIG. 2, a depletion region edge 20 is in contact with the source electrode region 22 of the source electrode 10, but it need not make contact with the source electrode region 22. However, as shown in FIG. 2, the depletion region edge 20 cannot make contact with the drain electrode region 24.

An AC potential difference applied between the gate electrode 16 and the drain electrode 12 is distributed across the depletion region 18 and a neutral region 26 in the plane of FIG. 2. This part of the FET 5 can be considered to act as an R-C series circuit. The gate electrode 16 and the depletion region edge 20 form a capacitor 30, while the neutral region 26 provides a small series resistance 32 between the depletion region edge 20 and the drain electrode 12. The conductivity of the semiconductor material 14, and the distance of separation of the depletion region edge 20 and the drain electrode 12, can be selected so that most of the AC voltage which appears between the gate electrode 16 and the drain electrode 12 will appear across the depletion region 18, represented by the capacitor 30, and a comparatively small voltage will appear across the neutral region 26, represented by the resistor 32. In this case, almost all of the AC charge which appears on the gate electrode 16 is accompanied by changes in the depth of the depletion region 18. The comparatively small amount of AC voltage which is distributed across the neutral region 26 causes a correspondingly small AC charge to appear on the surface of the drain electrode 12.

In calculating the K matrix, the preceding argument shows that the charge induced on the drain electrode 12 with the AC bias of case(a) will be significantly less than the charge induced on the gate electrode 16 with the AC bias of case(b). As a result, the off-diagonal elements of the K matrix, $K_{g-d}$ and $K_{d-g}$, have significantly different values. Consequently, in the present invention, the K, L, and Z matrices are significantly non-reciprocal. In the description of the present invention, this effect shall be referred to as non-reciprocal inductive coupling.

The present invention obtains non-reciprocal inductive coupling by means of the separation of the depletion region edge 20 and the drain electrode 12. The separation is created by maintaining a region of semiconductor material 28 which provides a large enough distance between the depletion region edge 20 and the drain electrode 12, such that the depletion region edge 20 can screen the electric field from the drain electrode 12, as described above. The region of semiconductor material 28 between the depletion region edge 20 and the drain electrode 12 should also have sufficiently low conductivity—to establish a distinction between the region of semiconductor material 28 and the drain electrode region 24 of the drain electrode 12. As this separation between the depletion region edge 20 and the drain electrode 12 is decreased, or as the conductivity of the region of semiconductor material 28 is increased, the limit of reciprocal inductive coupling is obtained.

The preceding description of the present invention has used a TEM mode analysis to describe non-reciprocal inductive coupling by means of non-reciprocal charge transfer. As noted earlier, the TEM mode analysis provides an approximate description for transverse electric and magnetic fields in the structure of a TWFET. The surface charge on ideal transmission line electrodes is proportional to the tangential magnetic fields at the surface of these conductors. Consequently, the non-reciprocal charge transfer of the preceding TEM mode analysis of FIG. 2 corresponds to non-reciprocity in the transverse magnetic fields at the surface of the gate electrode 16 or drain electrode 12. The non-reciprocal inductive coupling of the present invention can thus be understood in terms of non-reciprocity in the charge transfer and associated non-reciprocity in the K matrix, or as an equivalence in non-reciprocity of the transverse magnetic fields which also correspond to non-reciprocity in the L and Z matrices due to the non-reciprocity of the longitudinal currents.

An important consequence of the design of TWFETs with non-reciprocal inductive coupling is the increase in the signal power gain in the transistor. This is shown in the following pair of differential equations governing the TWFET structure:

$$\frac{d}{dz} i = -Yv$$

$$\frac{d}{dz} v = -Zi$$

In these equations, Z is defined as the sum of the diagonal series resistance matrix, R and the product of $j\omega$ with L, the inductive coupling matrix. As noted earlier, R allows for series resistance on the transmission line electrodes. The parallel roles of Y and Z in these equations indicate that non-reciprocity in the inductance matrix can be just as important as non-reciprocity in the admittance matrix in providing power gain for signal amplification in the TWFET.

An important special consequence of the use of non-reciprocal inductive coupling in TWFETs is that it can increase the range of frequency of signal gain in the TWFET above that which is possible when only the effect of the non-reciprocal admittance matrix is available, such as in previous TWFET designs. In conventional transistors, i.e. those not designed as a part of an active coupled transmission line structure, there is a maximum frequency of operation above which the transistor cannot be used to provide gain to signals. In this discussion, this frequency limit is referred to as $f_{MAX}$ for the transistor. In the case of the conventional FET which forms the cross-section of the TWFET, $f_{MAX}$ represents the upper frequency limit for obtaining signal gain from the Y matrix in the TWFET. When non-reciprocal inductive coupling is present, TWFETs can provide signal power gain at frequencies above $f_{MAX}$ of the conventional FET which lies in the plane transverse to the direction of signal propagation in the TWFET. The power gain at frequencies above $f_{MAX}$ can occur when the Z coupling matrix exhibits the mathematical property that $Z_{Oh}$, the hermitian part of Z, defined as $Z_{Oh} = \frac{1}{2}(Z+Z^*)$, (where $Z^*$ denotes the complex conjugate transpose of Z), is not non-negative definite, which is to say that $Z_{Oh}$ satisfies $x^*Z_{Oh}x<0$ for some nonzero complex valued vector, x, with complex conjugate transpose $x^*$. It should be noted that this is a minimal requirement for power gain in the TWFET. As will be obvious to those of ordinary skill in the art, the success of the design depends on the relative sizes of matrix elements in the Z and Y coupling matrices, in addition to this minimal requirement that the hermitian part of either Y or Z is not non-negative definite as defined above. A detailed analysis of the conditions which allow an increase in average power flow along a pair of coupled transmission lines is presented in Appendix B.

While non-reciprocal inductive coupling has been discussed in the TWFET structure, it can be obtained in similar distributed circuit elements based on the combination of an active semiconductor transistor with coupled transmission lines. The essential requirement is that the cross-section of the distributed circuit element sustain AC surface charges on the electrodes or have transverse magnetic fields near the electrode surfaces which exhibit non-reciprocity as described above.

In the present invention, the TWFET designs are based on the use of a dual-FET structure, as disclosed U.S. Pat. No. 4,587,541. The dual-FET structure allows the design of a single conventional FET with the understanding that the symmetry of the propagating signal in this structure has the effect of doubling the contact area of the electrodes. This doubled area implies that transforming the results of a single FET to those of a symmetric dual-FET requires doubling the calculated values for the admittance and charge matrix elements of a single FET and reducing the electrode series resistance values by a factor of 2.

The symmetry of the dual-FET allows the designs of the present invention to be developed with a 2-dimensional simulation of a single FET structure. This simulation is based on the finite element solution of the standard semiconductor equations using a TEM analysis of the TWFET. The semiconductor equations used for the present invention are those of an n-type semiconductor, neglecting generation and recombination effects:

$$-\vec{\nabla} \cdot \epsilon \vec{\nabla}\phi - |q|(N_d - n) = 0$$

$$|q|\frac{\delta}{\delta t} n - \vec{\nabla} \cdot \vec{J}_n = 0$$

$$\vec{J}_n = -|q|\mu_n n \vec{\nabla}\phi + |q|D_n \vec{\nabla}n$$

In these equations, $|q|$ represents the magnitude of the electronic charge, $\epsilon$ represents the dielectric constant, n represents the electron concentration, $N_d$ represents the donor concentration, and $\phi$ represents the electrostatic potential, as would be consistent with a TEM analysis of the TWFET. In addition, $J_n$ represents the electron current, with an electron mobility of $\mu_n$, and an electron diffusion coefficient of $D_n$.

The simulation calculates the small-signal AC semiconductor device behavior in accordance with a method which is almost identical to the sinusoidal steady state analysis method in S. E. Laux, "Techniques for Small-Signal Analysis of Semiconductor Devices," *IEEE Transactions on Electron Devices* Vol. ED-32(10), pp. 2028–2037 (October, 1985). Following the method described earlier for the AC charge matrix calculations, two AC bias cases are used to calculate the total AC surface charge on the gate electrode and drain electrode, and to calculate the total AC current flowing into these electrodes. In each AC bias case, the AC voltage is applied to one electrode while the remaining two electrodes are maintained at an AC voltage of 0. These calculations yield admittance and charge matrices by the method which was described in detail earlier for the charge matrix calculation.

In this sinusoidal steady state analysis, the complex phasor notation is used so that the time derivative in the semiconductor equations is replaced by a factor of ($j\omega$), and complex valued admittance and charge matrices are obtained. The results for admittance and charge matrices are converted to the inductance and admittance coupling matrices of the distributed dual-FET using the formulas given earlier for obtaining the inductance matrix from the charge matrix and the use of the factor of two scaling noted above. The coupling matrices are combined with selected values of series resistance for the dual-FET electrodes. In this way, the use of the 2-dimensional semiconductor device simulation of a fully specified FET in combination with series resistance values yields the complete coupling matrix information for the dual-FET structure.

Figure 3:
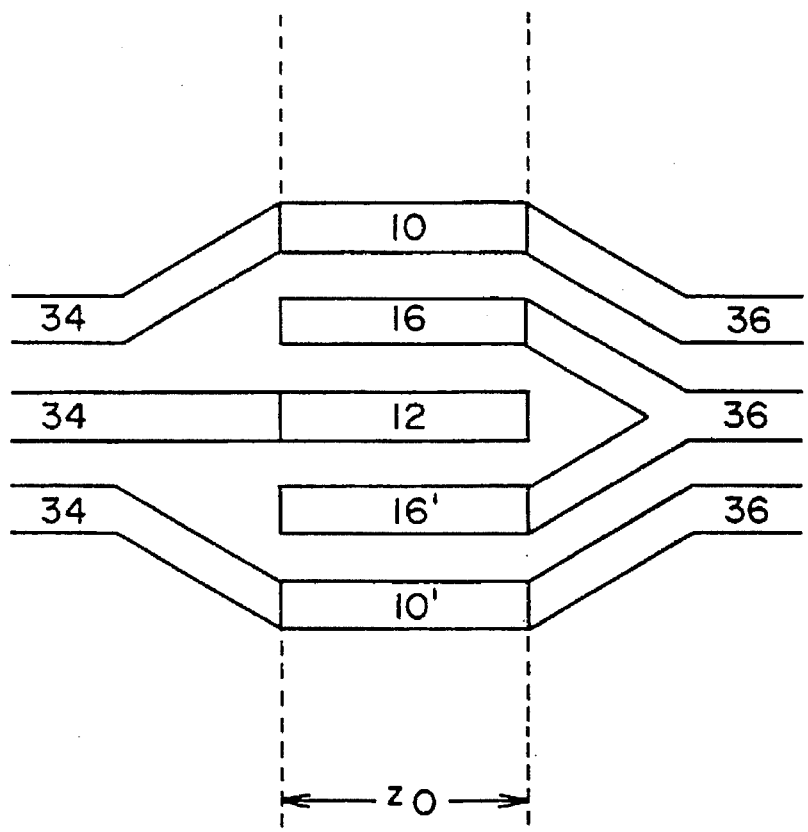
FIG. 3 is a top-view of a prior art TWFET in a coplanar transmission line.

In FIG. 3, the TWFET is designed with open circuit terminations at the ends of the gate electrodes 16, 16' and the drain electrode 12, which are opposite to the attachments to first coplanar transmission lines 34 or second coplanar transmission lines 36. A 2-port impedance and admittance matrix can be calculated for the TWFET of FIG. 3 as a function of the coupling length, $z_0$, using an extension of the method of V. K. Tripathi, "Asymmetric Coupled Transmission Lines in an Inhomogeneous Medium," *IEEE Trans. Microwave Theory Tech.* Vol. MTT-23(9), pp. 734–739 (September, 1975) to treat the case of general (non-reciprocal) Y and Z TWFET coupling matrices. In the present invention, the 2-port admittance matrix was calculated for the coupling lengths, $z_0$, ranging from $5 \times 10^{-4}$ cm to $5 \times 10^{-2}$ cm. This admittance matrix data allows the calculation of maximum unilateral gain (U, Mason's U-function), maximum available gain (MAG), maximum stable gain (MSG), and the stability parameter (k) for the TWFET, using the standard formulas for these quantities as a function of the admittance or impedance matrix elements.

In the present invention, the electrode series resistance is calculated from the skin depth of the conductors. The resistance-per-unit length, which can be defined as the ratio of resistivity to cross-sectional area, uses the cross-sectional area formed by the product of skin depth and electrode width (or cimcumference). With this definition, a metallic resistivity of $10^{-6}$ ohm-cm combined with an electrode width of $10^{-4}$ cm and a skin depth of $10^{-5}$ cm provides a series resistance of $10^3$ ohm/cm or 1 k-ohm/cm. When the dual-FET structure is used, this series resistance value would reduce to 500 ohm/cm.

It should be noted that the capacitive effects due to the abrupt termination of the end of the gate electrode and drain electrode, and the inter-electrode capacitive coupling from the transverse electric fields above the surface of the semiconductor have been omitted from the present analysis. A person of ordinary skill in the art would understand that the corrections for these effects would be small.

Figure 4:
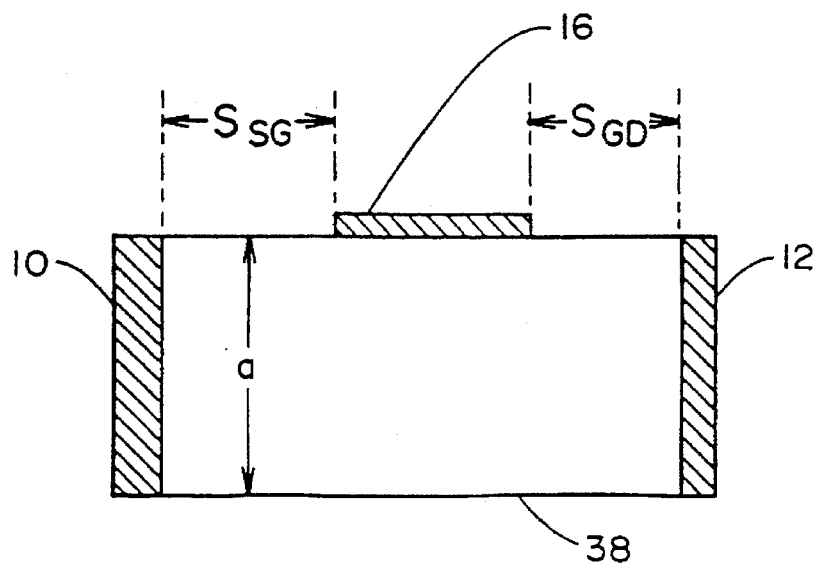
FIG. 4 is a schematic cross-section of an FET that embodies the present invention and depicts various parameters of the FET.

In FIG. 4, $S_{SG}$ represents the source-to-gate inter-electrode separation distance, $S_{GD}$ represents the gate-to-drain inter-electrode separation distance, and $\alpha$ represents the depth of a channel 38.

The n-type material used for the FET semiconductor has a conductivity of approximately 1.6 Siemens/cm for most of the semiconductor region. For example, an n-type semiconductor with a donor concentration of $10^{16}$ cm$^{-3}$ and a constant electron mobility of $10^3$ cm$^2$/V-sec could be used. This conductivity could be obtained with n-type GaAs composed of a net donor density to obtain this equilibrium electron concentration, but with an electron mobility which is reduced by means of some partial compensation of the n-type material with p-type acceptors or by some damage to the material. Those of ordinary skill in the art will recognize that when n-type silicon is used little or no modification to the donor density or electron mobility is needed. Since actual electron mobility in semiconductor devices is a function of many physical parameters, including the electric field strength, the specified conductivity of 1.6 mhos/cm can be obtained by locally adjusting the net donor concentration, as needed.

Figure 6:
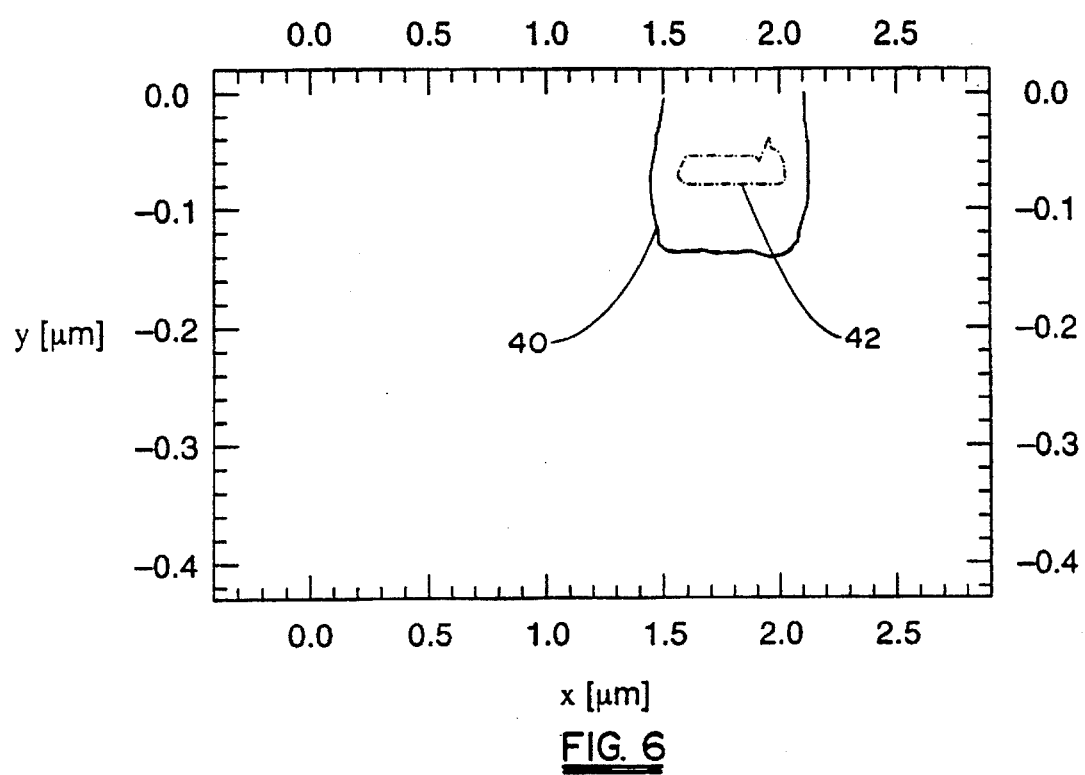
FIGS. 6–8 are contour plots of donor density for an FET that embodies the present invention.
Figure 7:
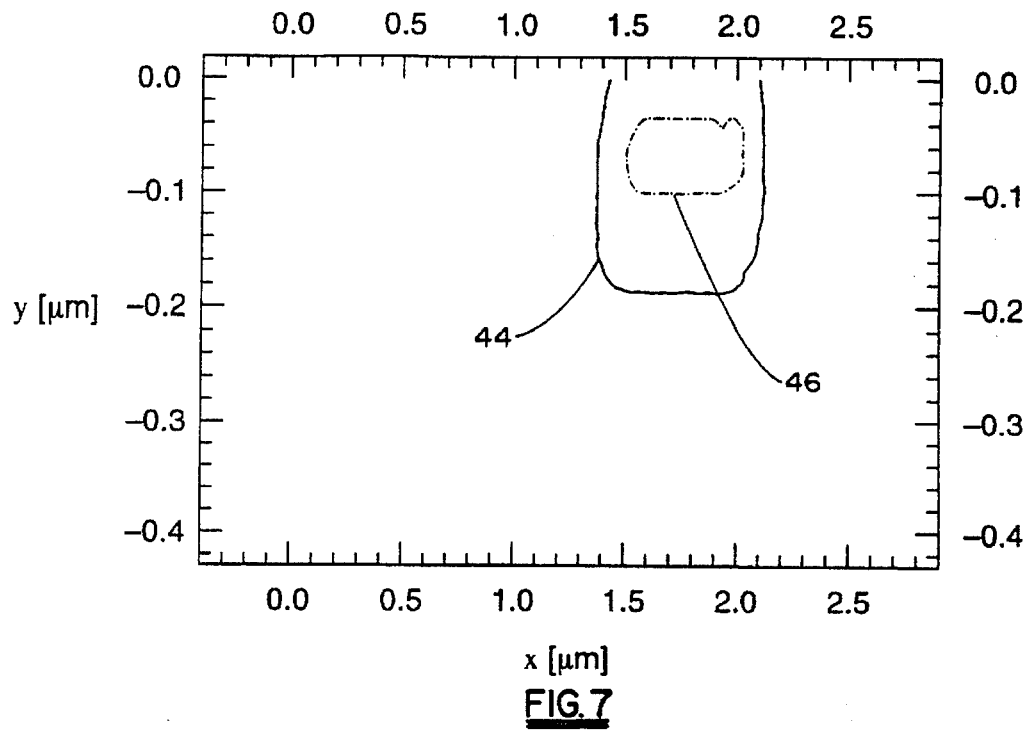
Figure 8:
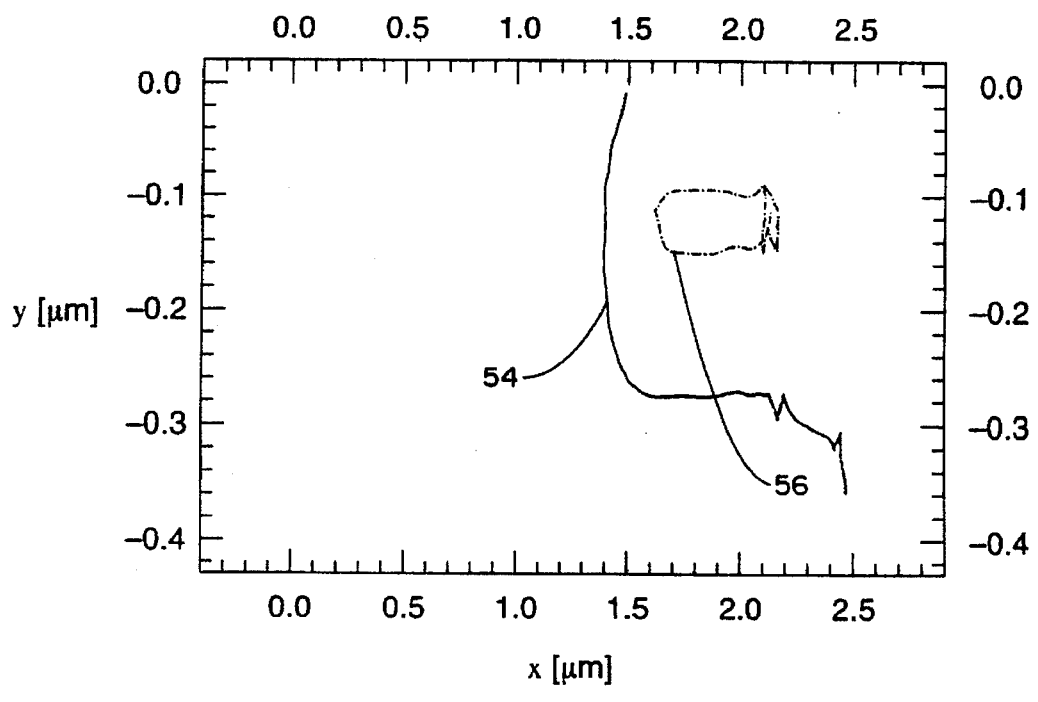

In addition to the TWFET examples with uniform conductivity and uniform net donor density of $10^{16}$ cm$^{-3}$, three examples with local regions of increased doping density (and correspondingly increased conductivity) were used for the present invention. These TWFET structures with non-uniform doping density used distributions of net donor concentrations as shown in FIGS. 6 through 8. FIGS. 6 through 8 show the contours of net donor concentrations in the FET in the plane transverse to the direction of signal propagation in the TWFET. In FIG. 6, a solid-line contour 40 has a value of $1.5 \times 10^{16}$ cm$^{-3}$ and a dashed-line contour 42 has a value of $3.5 \times 10^{16}$ cm$^{-3}$. The contour lines 40 and 42 indicate the local region of increased donor density with the rest of the semiconductor of the FET having a background donor concentration of $10^{16}$ cm$^{-3}$. The maximum value of the net donor concentration in the local region of increased donor density is approximately $3.9 \times 10^{16}$ cm$^{-3}$, located within the dashed-line contour 42.

In FIG. 7, a similar donor density contour plot for a different donor density distribution is shown. As in the case of FIG. 6, FIG. 7 indicates a local region of increased net donor density with the rest of the semiconductor of the FET having a background donor concentration of $10^{16}$ cm$^{-3}$. In FIG. 7, a solid-line contour 44 has a value of $1.5 \times 10^{16}$ cm$^{-3}$ and a dashed-line contour 46 has a value of $4.0 \times 10^{16}$ cm$^{-3}$. The maximum value of the net donor concentration in the local region of increased donor density is approximately $5.2 \times 10^{16}$ cm$^{-3}$, located within the dashed-line contour 46.

In FIG. 8, another similar donor density contour plot for a third donor density distribution is shown. As in the cases of FIG. 6 and FIG. 7, FIG. 8 indicates a local region of increased net donor density with the rest of the semiconductor having a background donor concentration of $10^{16}$ cm$^{-3}$. In FIG. 8, a solid-line contour 54 has a value of $1.5 \times 10^{16}$ cm$^{-3}$ and a dashed-line contour 56 has a value of $4.0 \times 10^{16}$ cm$^{-3}$. The maximum net donor concentration in the region of increased donor density is approximately $4.2 \times 10^{16}$ cm$^{-3}$, located within the dashed-line contour 56.

These local regions of increased net donor density, shown in FIGS. 6–8, can be created using typical device fabrication techniques. For example, the local regions can be formed with ion implantation through a mask window on the surface of a semiconductor of uniform donor density of $10^{16}$ cm$^{-3}$.

In the present invention, the Schottky barrier height used for the TWFET structures was 0.7505 eV. This barrier height value corresponds to the value of built-in potential obtained with the abrupt depletion model of the junction of the Schottky contact with the n-type semiconductor. As a result, it specifies a built-in potential for the Schottky contact to the semiconductor, not a true barrier height value.

Figure 5:
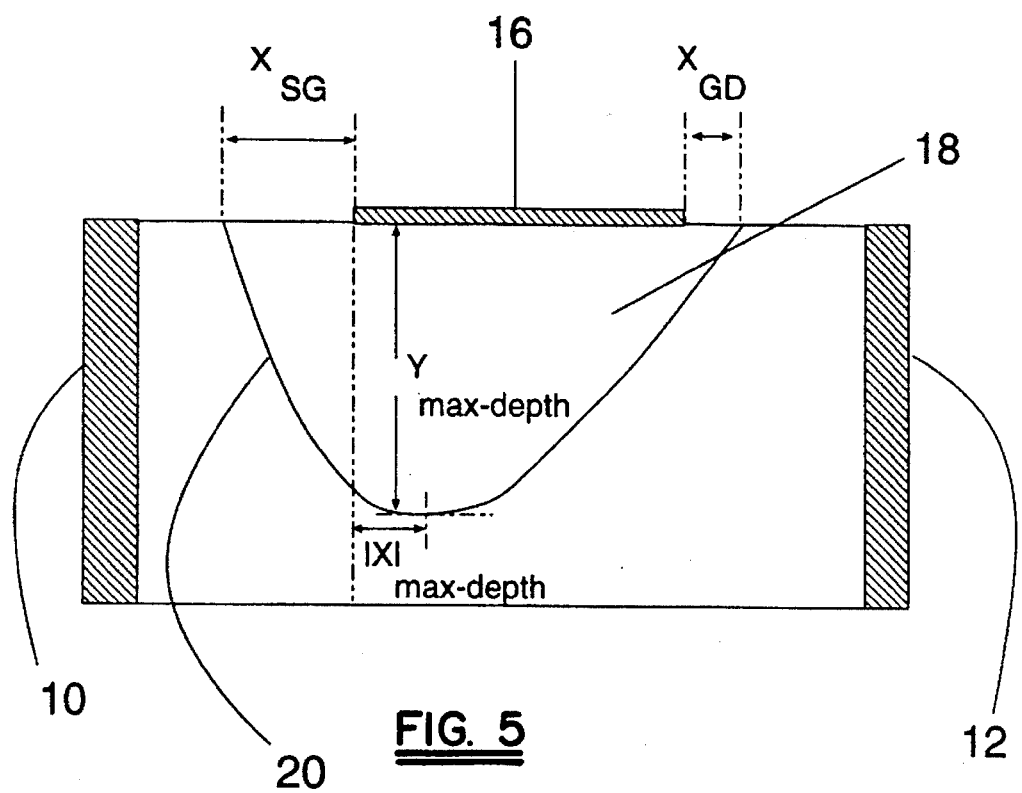
FIG. 5 is an schematic cross-section of an FET that embodies the present invention and depicts various parameters of the FET's depletion region.

In FIG. 5, the general features of the depletion region 18, as used in the TWFETs of the present invention, is shown. In the present invention, the shape of the depletion region 18 is a mirror-image of the shape of a depletion region found in the prior art FETs. The shape of the depletion region 18 is obtained when the depletion region edge 20 is further away from the gate electrode 16 at the end near the source electrode 10 than the depletion region edge 20 is from the gate electrode 16 at the end near the drain electrode 12. The deepest point of the depletion region 18 is located almost directly below the end of the gate electrode 16 near the source electrode 10. The parameter $X_{SG}$ represents the horizontal distance from the depletion region edge 20 to the gate electrode 16 between the source electrode 10 and the gate electrode 16, $X_{GD}$ represents the horizontal distance from the gate electrode 16 to the depletion region edge 20 between the gate electrode 16 and the drain electrode 12, $|X|_{max\text{-}depth}$ represents the absolute value of the difference in horizontal distance from the deepest point of the depletion region 18 as compared to the location of the end of the gate electrode 16 nearest the source electrode 10, and $Y_{max\text{-}depth}$ represents the vertical distance at the deepest point in the depletion region 18.

In the abrupt depletion model of the FET, the depletion region edge 20 can be considered as the boundary between the neutral region 26 in which, for n-type semiconductors, the electron concentration is approximately equal to the doping density, and the depletion region 18, in which the electron concentration is approximately zero. In the present invention, the depletion region edge 20 is defined as the point at which the electron concentration decreases to half of the donor concentration of the majority of the semiconductor in the FET. In the present invention, this is a concentration value of $5 \times 10^{15}$ cm$^{-3}$.

The shape of the depletion region 18 has been obtained in the present invention by use of negative DC-bias on the drain electrode 12 relative to the source electrode 10. The gate electrode 16 and the drain electrode 12 are supplied with DC biasing by the use of bias tees (not shown) attached to the coplanar transmission lines 34 and 36. It is possible that the DC-bias value of the drain electrode 12 can create a total potential difference for the contact junction between the gate electrode 16 and the drain electrode 12 which is almost zero or is quite close to a forward bias condition for the gate electrode 16 relative to the drain electrode 12. In order to avoid being this close to a forward bias condition for the gate electrode 16, the doping density between the gate electrode 16 and the depletion region edge 20 near the drain electrode 12 should be increased. This allows the same shape of the depletion region 18 to be obtained with a larger reverse bias between the gate electrode 16 and the drain electrode 12. The same technique can be applied to obtain the same shape of the depletion region 18 with a positive DC-bias on the drain electrode 12 relative to the source electrode 10.

A series of TWFETs were designed, as discussed above, that provided gain above the $f_{max}$ of the FET contained in the cross-section of the TWFET. In the first series, referred to as the "forward" configuration, the signal was applied using the symmetric mode of operation for coplanar transmission lines shown in FIG. 3. Thus, the signal input was applied identically to the pair of electrodes of the source electrode 10 and the gate electrode 16, and to the pair of electrodes of the source electrode 10' and the gate electrode 16. The signal output was taken from the pair of electrodes of the source electrode 10 and the drain electrode 12, and the pair of electrodes of the source electrode 10' and the drain electrode 12. Table I shows the parameters and gain values for this series of "forward" configuration TWFETs.

Figure 9:
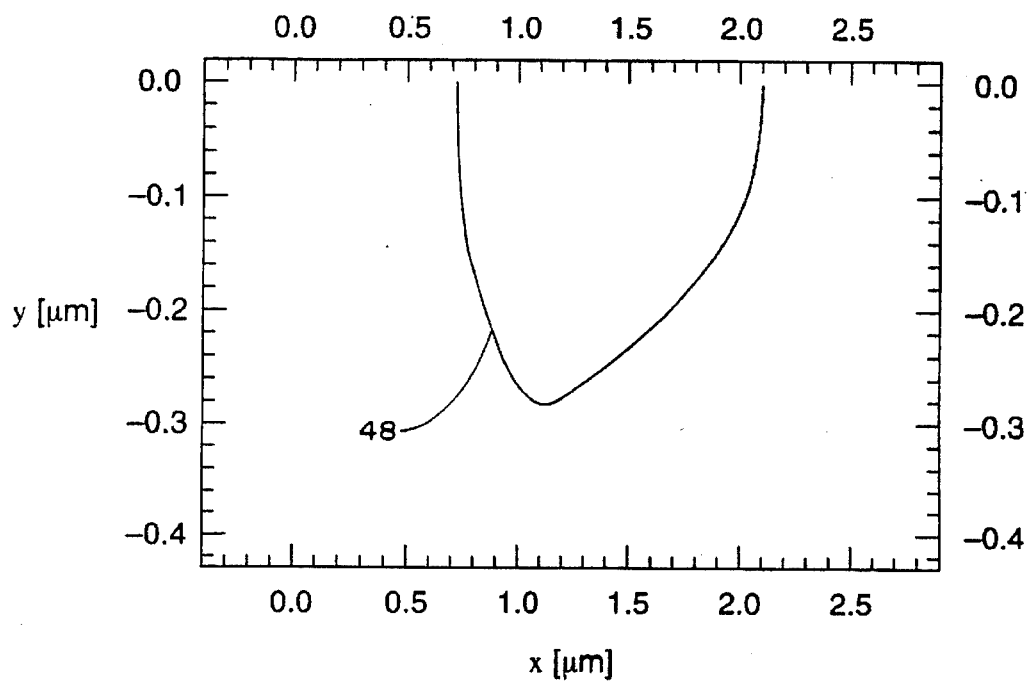
FIGS. 9–12 are contour plots of DC electron concentration for an FET that embodies the present invention.
Figure 10:
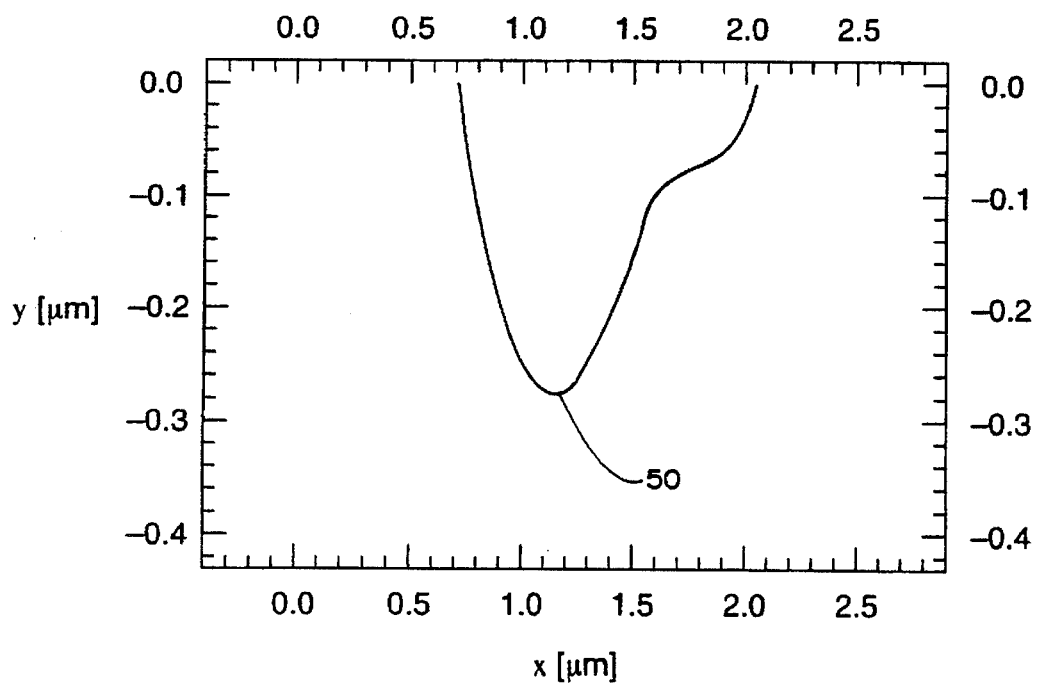
Figure 12:
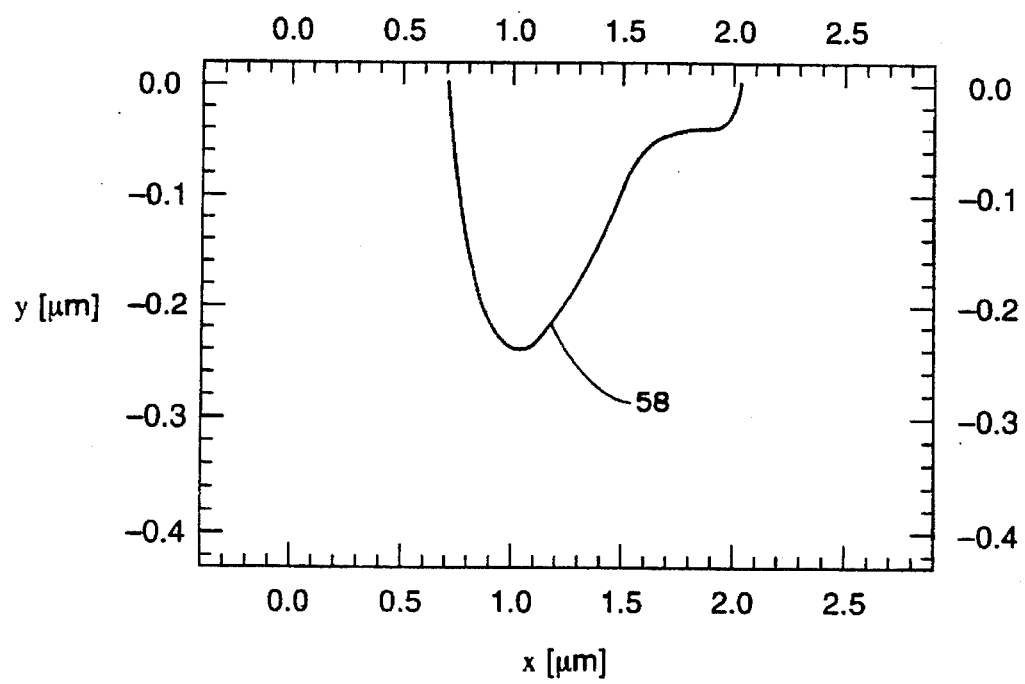

In Cases 1–4, the shape of the depletion region 18 is of the shape shown in the DC electron concentration contour plot of FIG. 9 In FIG. 9, a solid-line electron concentration contour 48 has a value of $5 \times 10^{15}$ cm$^{-3}$, the value assigned to the depletion region edge as earlier noted. In Case 5, the shape of the depletion region 18 is of the shape shown in the DC electron concentration contour plot of FIG. 10. In FIG. 10, a solid-line electron concentration contour 50 has a value of $5 \times 10^{15}$ cm$^{-3}$, the value assigned to the depletion region edge as earlier noted. In Case 6, the shape of the depletion region 18 is of the shape shown in the DC electron concentration contour plot of FIG. 12. In FIG. 12, a solid-line electron concentration contour 58 has a value of $5 \times 10^{15}$ cm$^{-3}$, the value assigned to the depletion region edge as earlier noted.

TABLE I(a)

| CASE | $V_{gate}$ volts | $V_{drain}$ volts | $S_{SG}$ microns | $S_{GD}$ microns | Gate Length microns | Donor Distribution Type |
|---|---|---|---|---|---|---|
| 1 | −.4988 | −1.103 | 0.5 | 1.0 | 1.0 | Uniform |
| 2 | −.4988 | −1.203 | 1.0 | 0.5 | 1.0 | Uniform |
| 3 | −.4988 | −1.203 | 1.0 | 0.5 | 0.25 | Uniform |
| 4 | −.4988 | −1.203 | 0.5 | 0.5 | 0.25 | Uniform |
| 5 | −.4988 | −1.203 | 1.0 | 0.5 | 1.0 | FIG. 6 |
| 6 | −.4988 | −1.203 | 1.0 | 0.5 | 1.0 | FIG. 8 |

The DC-bias values are relative to the source electrode 10. The source electrode 10 is DC-biased at 0 V. In Cases 1–4, the donor distribution has a uniform concentration of $10^{16}$ cm$^{-3}$. In Case 5, the donor distribution has a local region of increased concentration—as shown in FIG. 6. In Case 6, the donor distribution has a local region of increased concentration—as shown in FIG. 8.

The values for $X_{sg}$, $X_{gd}$, $|X|_{max-depth}$, and $|Y|_{max-depth}$ are rounded to the nearest 0.1 micron.

TABLE I(b)

| CASE | $X_{SG}$ microns | $X_{GD}$ microns | $|X|_{max-depth}$ microns | $Y_{max-depth}$ microns | Depletion Region Type |
|---|---|---|---|---|---|
| 1 | 0.3 | 0.1 | 0.1 | 0.3 | FIG. 9 |
| 2 | 0.3 | 0.1 | 0.1 | 0.3 | FIG. 9 |
| 3 | 0.3 | 0.1 | <0.1 | 0.2 | FIG. 9 |
| 4 | 0.3 | 0.1 | <0.1 | 0.2 | FIG. 9 |
| 5 | 0.3 | 0.1 | 0.1 | 0.3 | FIG. 10 |
| 6 | 0.3 | <0.1 | <0.1 | 0.2 | FIG. 12 |

TABLE I(c)

| CASE | | $f_{MAX}$ GHz | a microns | $R_g$ ohm/cm | $R_d$ ohm/cm | U ($z_{0,U}$) ($10^{-2}$ cm) | MAG ($z_{0,MAG}$) ($10^{-2}$ cm) | MSG ($z_{0,MSG}$) ($10^{-2}$ cm) |
|---|---|---|---|---|---|---|---|---|
| 1 | | 10 | 0.43 | 500 | 500 | 1.3 (3.1) | 1.46 (3.1) | NA |
| 2 | (a) | 10 | 0.43 | 625 | 625 | 4.6 (3.2) | 2.0 (3.6) | 3.45 (3.5) |
| | (b) | | | 750 | 750 | 1.2 (3.1) | 1.26 (3.1) | NA |
| 3 | (a) | 10 | 0.43 | 625 | 625 | NA | 1.85 (3.6) | 3.67 (3.4) |
| | (b) | | | 690 | 625 | 5.4 (3.1) | 1.6 (3.5) | 3.57 (3.4) |
| | (c) | | | 750 | 750 | 2.4 (3.0) | 1.86 (3.3) | 2.85 (3.2) |
| 4 | (a) | 30 | 0.43 | 350 | 275 | 3.7 (3.1) | 2.34 (3.4) | 3.56 (3.3) |
| | (b) | | | 400 | 300 | 1.6 | 2.22 | 2.4 |

TABLE I(c)-continued

| CASE | $f_{MAX}$ GHz | a microns | $R_g$ ohm/cm | $R_d$ ohm/cm | U $(z_{0,U})$ $(10^{-2}$ cm$)$ | MAG $(z_{0,MAG})$ $(10^{-2}$ cm$)$ | MSG $(z_{0,MSG})$ $(10^{-2}$ cm$)$ |
|---|---|---|---|---|---|---|---|
| 5 | <1.0 | 0.43 | 275 | 275 | (3.0) NA | (3.1) 1.8 (3.6) | (3.0) 2.54 (4.15) |
| 6 | <1.0 | 0.43 | 275 | 275 | NA | 3.1 (4.0) | 4.6 (3.9) |

In Cases 1–4 and 6, the gain data are for a 100 GHz signal frequency. In Case 5, the gain data is for a 70 GHz signal frequency. In Cases 1–4, the gain values were observed over a range of coupling lengths of $2\times10^{-3}$ cm to $5.1\times10^{-2}$ cm. In Cases 5–6, the gain values were observed over a range of coupling lengths of $5\times10^{-4}$ cm to $5\times10^{-2}$ cm. The columns of U, MAC, and MSG contain the maximum values for these gain parameters which were observed for these ranges of coupling lengths. As those with ordinary skill in the art are aware, MAG is a valid gain parameter when the stability parameter is greater than unity, and MSG is a valid gain parameter when the stability parameter, k, is less than unity, but positive. In Cases 1 and 2(b), the use of "NA" for MSG values indicates that no coupling lengths were observed to have k less than unity, therefore MSG was not applicable to these cases. In Cases 3(a), 5 and 6, the use of "NA" for U values indicates examples for which no valid maximum value of U could be assigned due to the appearance of regions of the coupling length for which U was negative. Coupling length values which lie at the boundaries of these negative-U regions have an infinite value for U. Consequently, in these cases, no maximum value for U can be assigned. In Table I(c), the coupling lengths and gain data should be interpreted as approximate values.

In FIGS. 13–36, the variation with frequency for the AC admittance matrix elements for the FETs in this series of "forward" configuration TWFETs is shown. FIGS. 13–16 show the AC admittance matrix elements for Case 1, FIGS. 17–20 show the AC charge matrices for Case 2, FIGS. 21–24 show the AC admittance matrix elements for Case 3, FIGS. 25–28 show the AC admittance matrix elements for Case 4, FIGS. 29–32 show the AC admittance matrix elements for Case 5, and FIGS. 33–36 show the AC admittance matrix elements for Case 6. The charge matrix element values have been normalized to the value of the dielectric constant of free space, to yield a dimensionless quantity. In FIGS. 37–52, the variation with frequency for the AC charge matrix elements for this series of "forward" configuration TWFETs is shown. FIGS. 37–40 show the AC charge matrix elements for Case 1, FIGS. 41–44 show the AC charge matrix elements for Case 2, FIGS. 45–48 show the AC charge matrix elements for Case 3, FIGS. 49–52 show the AC admittance matrices for Case 4, FIGS. 53–56 show the AC charge matrix elements for Case 5, and FIGS. 57–60 show the AC charge matrix elements for Case 6. In FIGS. 13–60, the notation used for the subscripts dg, ds, gd, and gs of the charge and admittance matrix elements is explained in the detailed description of the charge matrix calculation. The curve markers indicate the frequency values 1 GHz, 40 GHz, 70 GHz and 120 GHz in sequence for each matrix dement curve.

In the second series, referred to as the "reverse" configuration, the signal was applied using the symmetric mode of operation for coplanar transmission lines shown in FIG. 3. Thus, the signal input was applied identically to the pair of electrodes of the source electrode 10 and the drain electrode 12, and to the pair of electrodes of the source electrode 10' and the drain electrode 12. The signal output was taken from the pair of electrodes of the source electrode 10 and the gate electrode 16, and the pair of electrodes of the source electrode 10' and the gate electrode 16. With this "reverse" configuration, the elements of the coupling matrices and voltage and current vectors of the transmission line equations must be re-ordered to correspond. For example, with this re-ordering of the matrix, the first column of the Z matrix contains $z_{ds}$ and $z_{gd}$ and the second column of the Z matrix contains $z_{dg}$ and $z_{gs}$, making the diagonal elements of the Z matrix $z_{ds}$ and $z_{gs}$. A similar re-ordering is also required for the Y matrix. Table II shows the parameters and gain values for this series of "reverse" configuration TWFETs.

TABLE II(a)

| CASE | $V_{gate}$ volts | $V_{drain}$ volts | $S_{SG}$ microns | $S_{GD}$ microns | Gate Length microns | Donor Distribution Type |
|---|---|---|---|---|---|---|
| 1 | −.4988 | −1.203 | 1.0 | 0.5 | 1.0 | Uniform |
| 2 | −.4988 | −1.203 | 1.0 | 0.5 | 1.0 | FIG. 6 |
| 3 | −.5988 | −1.203 | 1.0 | 0.5 | 1.0 | FIG. 7 |

The DC-bias values are relative to the source electrode 10. The source electrode 10 is DC-biased at 0 V. In Case 1, the donor distribution has a uniform concentration of $10^{16}$ cm$^{-3}$. In Case 2, the donor distribution has a local region of increased concentration—as shown in FIG. 6. In Case 3, the donor distribution has a local region of increased concentration—as shown in FIG. 7.

TABLE II(b)

Figure 11:
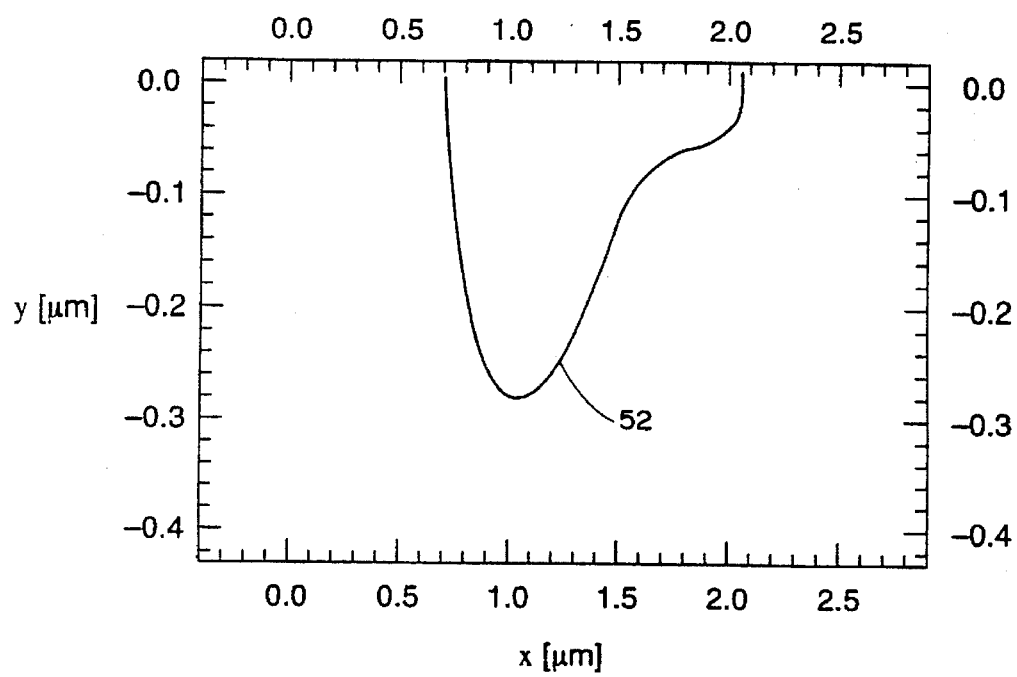

| CASE | $X_{SG}$ microns | $X_{GD}$ microns | $|X|_{max-depth}$ microns | $Y_{max-depth}$ microns | Depletion Region Type |
|---|---|---|---|---|---|
| 1 | 0.3 | 0.1 | 0.1 | 0.3 | FIG. 9 |
| 2 | 0.3 | 0.1 | 0.1 | 0.3 | FIG. 10 |
| 3 | 0.3 | 0.1 | 0.1 | 0.3 | FIG. 11 |

In Case 1, the shape of the depletion region 18 is of the shape shown in the DC electron concentration contour plot of FIG. 9 In FIG. 9, the solid-line electron concentration contour 48 has a value of $5\times10^{15}$ cm$^{-3}$, the value assigned to the depletion region edge as earlier noted. In Case 2, the shape of the depletion region 18 is of the shape shown in the DC electron concentration contour plot of FIG. 10. In FIG. 10, the solid-line electron concentration contour 50 has a value of $5\times10^{15}$ cm$^{-3}$, the value assigned to the depletion region edge as earlier noted. In Case 3, the shape of the depletion region 18 is of the shape shown in the DC electron concentration contour plot of FIG. 11. In FIG. 11, a solid-line electron concentration contour 52 has a value of $5\times10^{15}$ cm$^{-3}$, the value assigned to the depletion region edge as earlier noted.

The values for $X_{sg}$, $X_{gd}$, $|X|_{max\text{-}depth}$, and $|Y|_{max\text{-}depth}$ are rounded to the nearest 0.1 micron.

TABLE II(c)

| CASE | $f_{MAX}$ GHz | a microns | $R_g$ ohm/ cm | $R_d$ ohm/ cm | U $(z_{0,U})$ $(10^{-2}$ cm) | MAG $(z_{0,MAG})$ $(10^{-2}$ cm) | MSG $(z_{0,MSG})$ $(10^{-2}$ cm) |
|---|---|---|---|---|---|---|---|
| 1 | 10 | 0.43 | 600 | 600 | 9.67 (3.2) | <1.0 | <1.0 |
| 2 | <1.0 | 0.43 | 600 | 600 | 7.43 (3.25) | <1.0 | <1.0 |
| 3 | <1.0 | 0.43 | 600 | 600 | 4.24 (3.25) | <1.0 | <1.0 |

In Table II(c), the U, MAG, and MSG columns indicate the maximum values of these gain parameters that were observed over a range of coupling length values of $5\times10^{-4}$ cm to $5\times10^{-2}$ cm, for a signal frequency of 100 GHz. All MAG and MSG values were less than unity for this entire range of coupling lengths. The coupling lengths for the maximum U-function values and the magnitude of the U-function value should be interpreted as approximate values for these parameters.

In FIGS. 61-72, the variation with frequency for the AC admittance matrix elements for the FETs in this series of "reverse" configuration TWFETs is shown. FIGS. 61-64 show the AC admittance matrix elements for Case 1, FIGS. 65-68 show the AC admittance matrix elements for Case 2, and FIGS. 69-72 show the AC admittance matrix elements for Case 3. The admittance matrix elements matrix element values have been normalized to the value of the dielectric constant of free space, to yield a dimensionless quantity. In FIGS. 73-84, the variation with frequency for the AC charge matrix elements for this series of "reverse" configuration TWFETs is shown. FIGS. 73-76 show the AC admittance matrices for Case 1, FIGS. 77-80 show the AC admittance matrices for Case 2, and FIGS. 81-84 show the AC admittance matrices for Case 3. In FIGS. 61-84, the notation used for the subscripts dg, ds, gd, and gs of the charge and admittance matrix elements is explained in the detailed description of the charge matrix calculation. The curve markers indicate the frequency values 1 GHz, 40 GHz, 70 GHz and 120 GHz in sequence for each matrix element curve.

In Table I, Case 5 and 6 and Table II, Cases 2 and 3, the TWFETs have localized regions of increase donor density. This non-uniform donor distribution provides an important advantage for these cases relative to the other cases—the region of increased donor density will reduce the movement of the depletion region edge 20 when large values of inter-electrode AC voltages are present in signals propagating through the TWFET structure. Thus, these cases can provide linear signal amplification for a signal with a larger AC voltage component than those cases without localized regions of increased donor density. These advantages of increased donor density can be extended to structures with a uniform conductivity, by increasing the donor density while simultaneously reducing the electron mobility so that the conductivity value of 1.6 Siemens/cra is maintained. The increased donor density restricts the movement of the depletion region edge, while the adjustment of the conductivity value allows the high frequency characteristics of the TWFET to remain unchanged.

Figure 13:
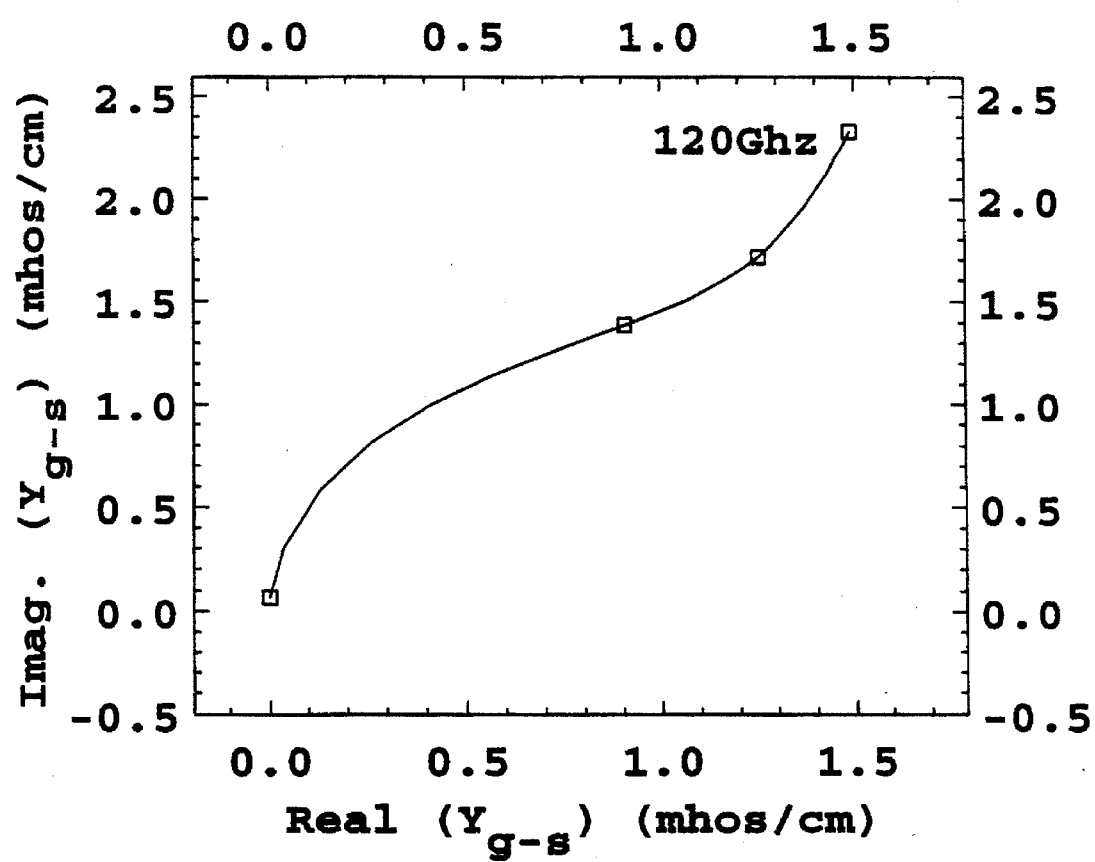
FIGS. 13–36 show the variation in the AC admittance matrix for specific FETs of the present invention in the "forward" configuration.
Figure 14:
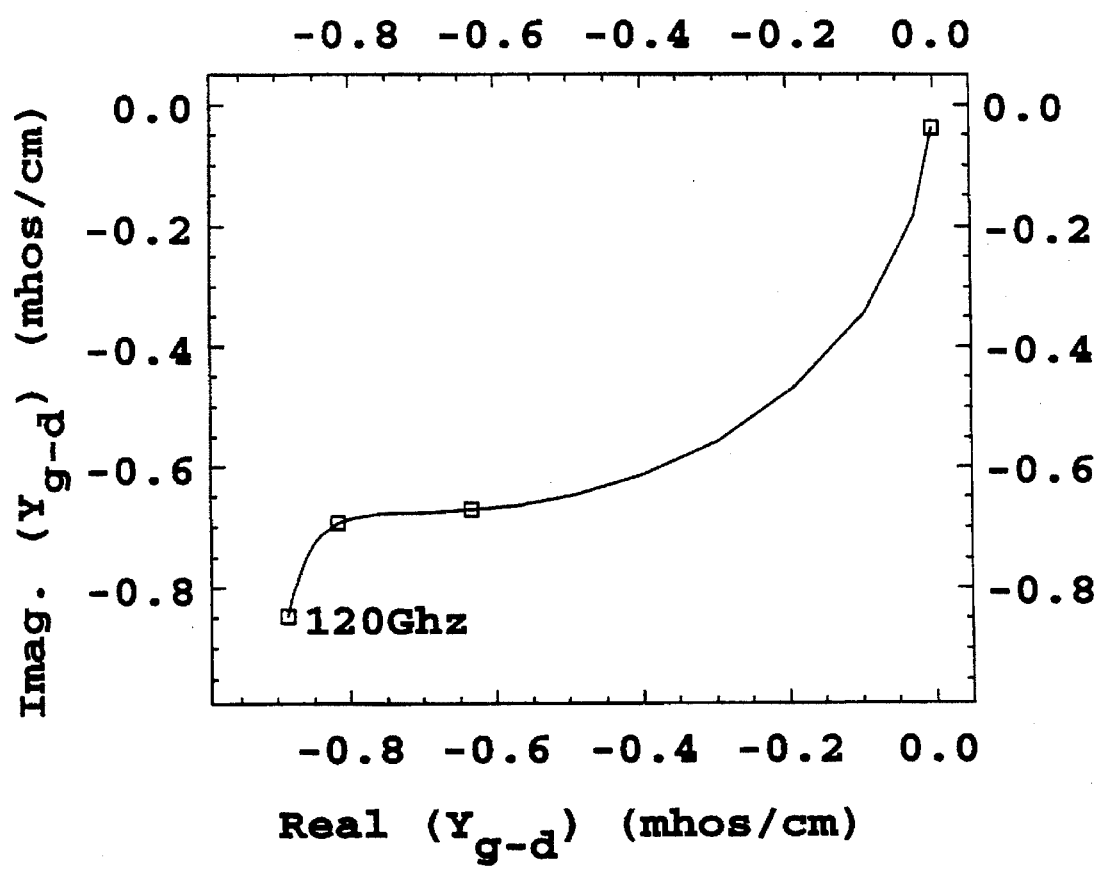
Figure 15:
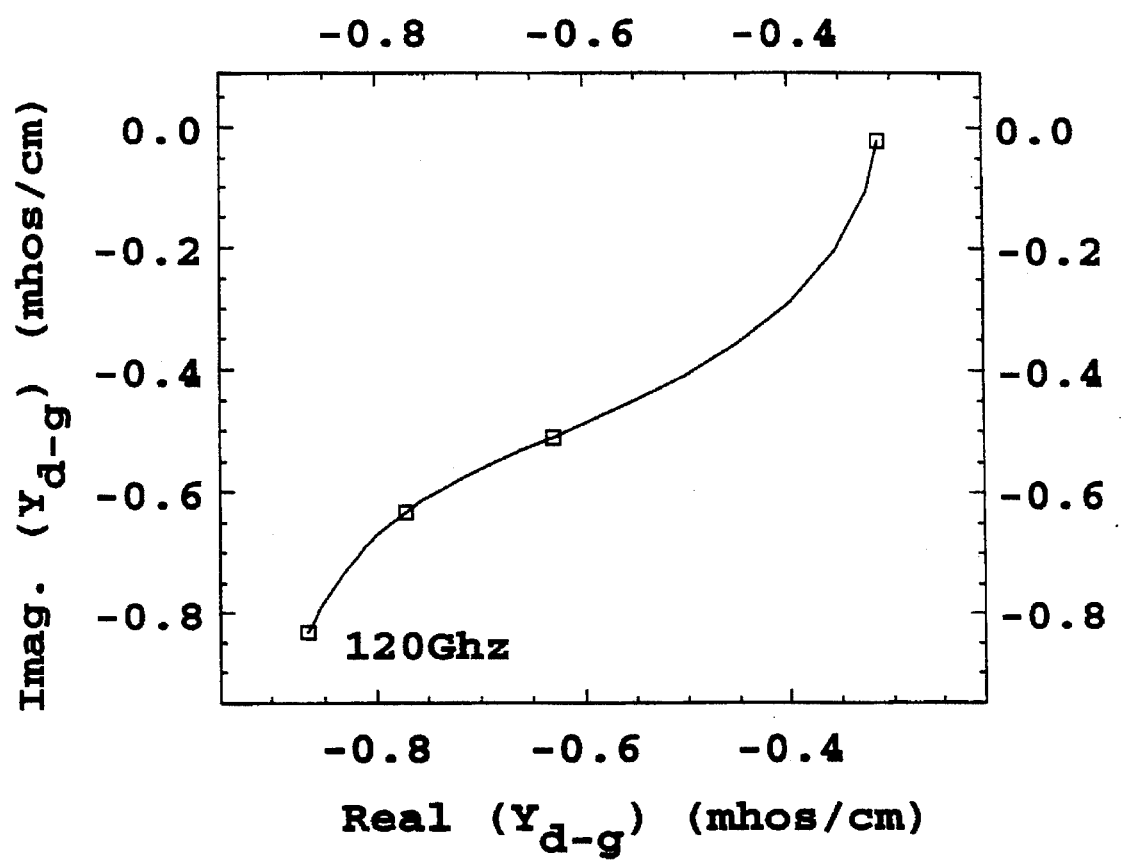
Figure 16:
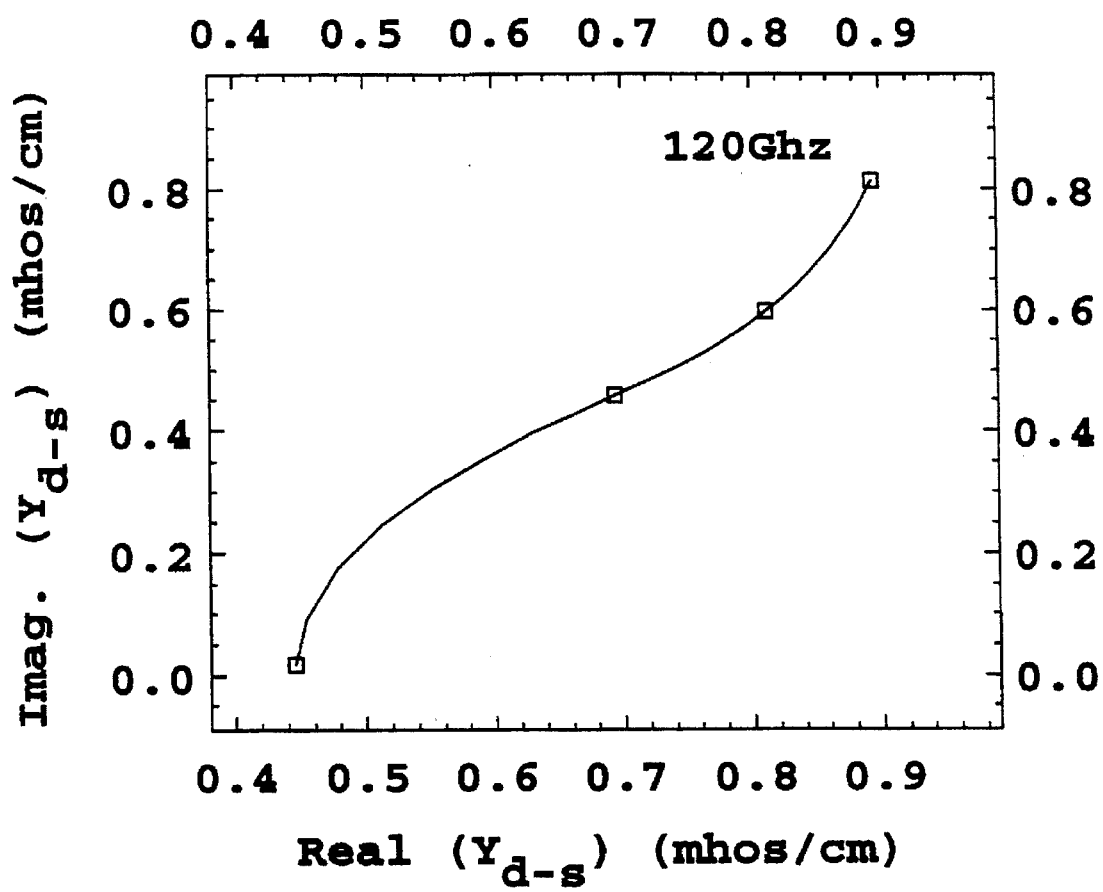
Figure 17:
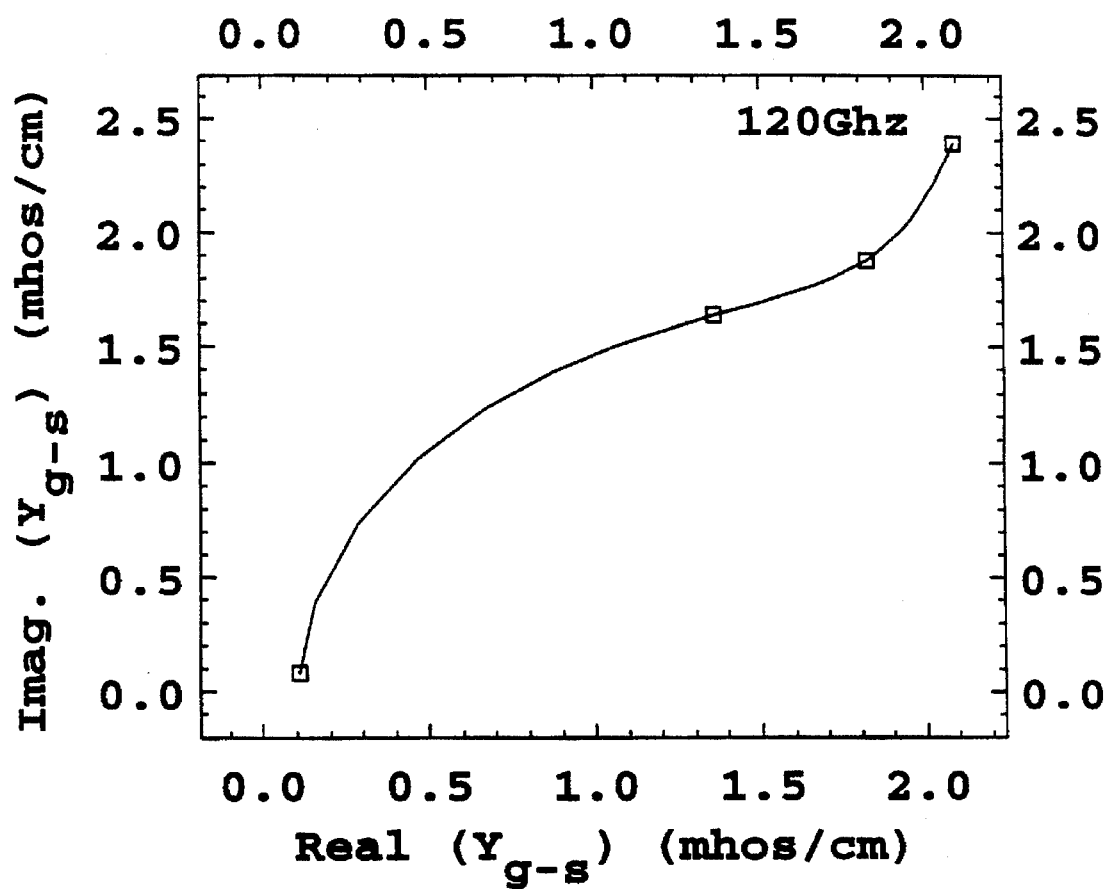
Figure 18:
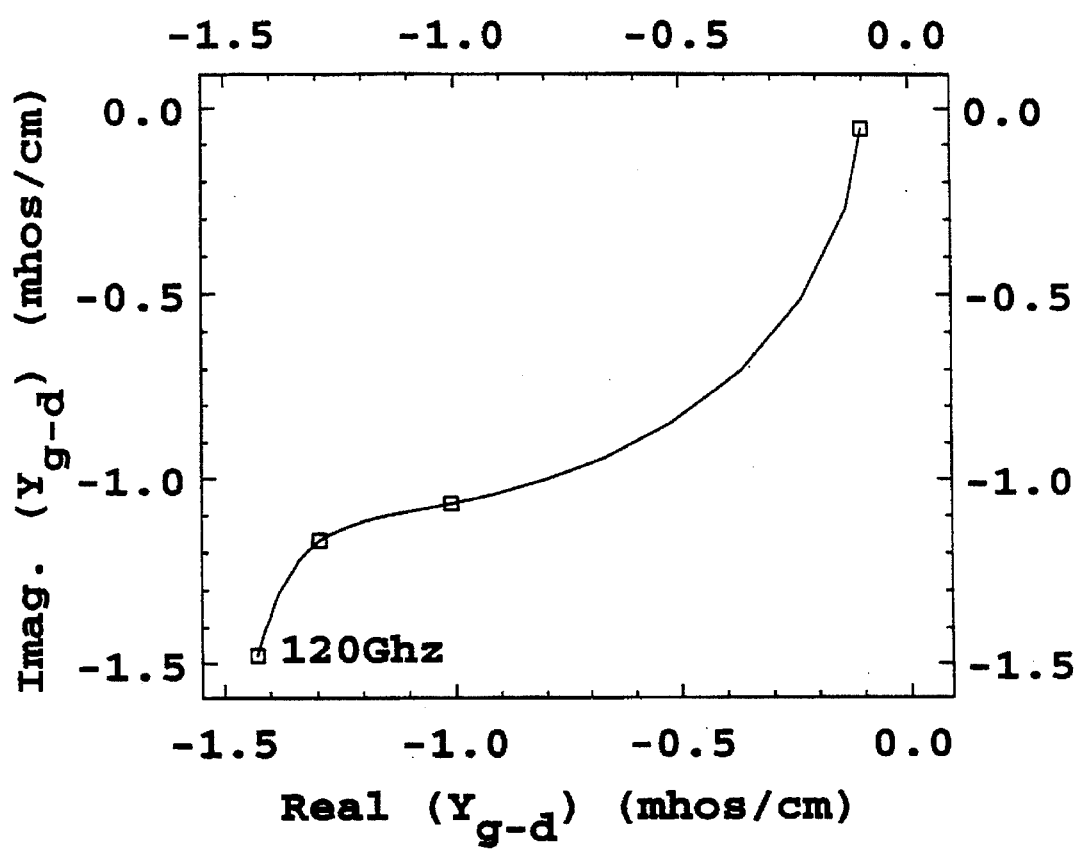
Figure 19:
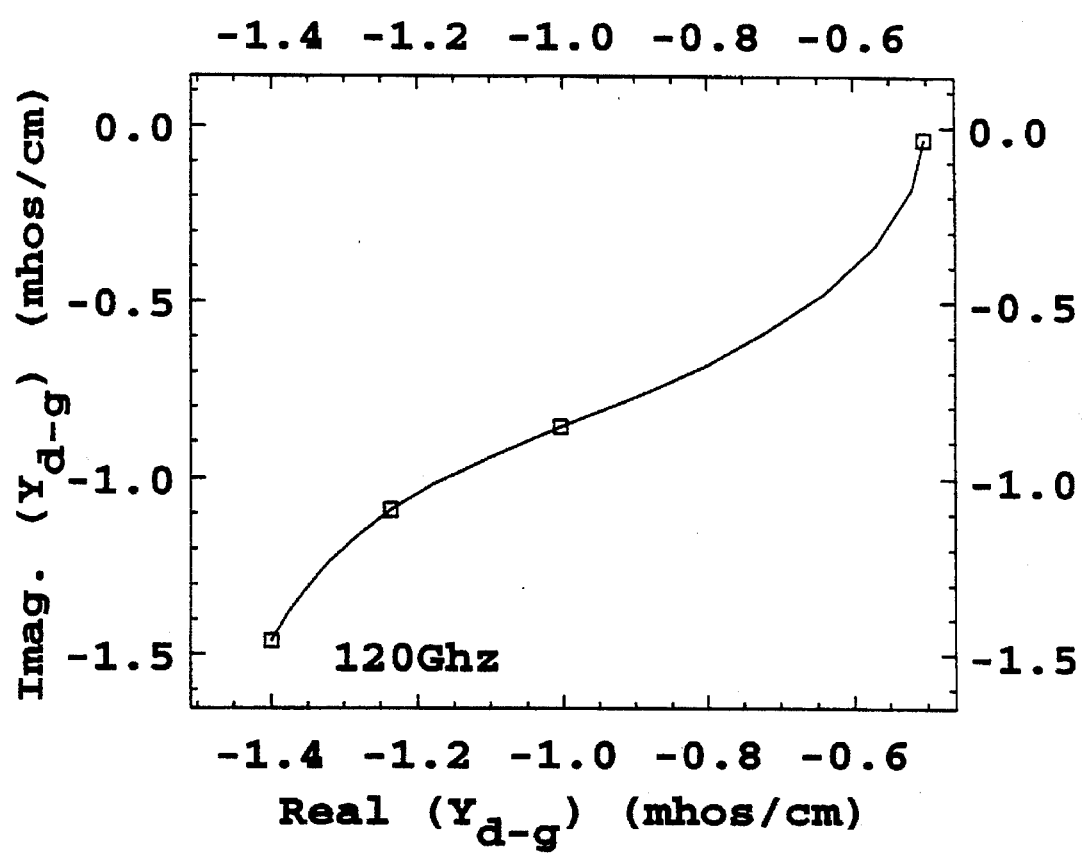
Figure 20:
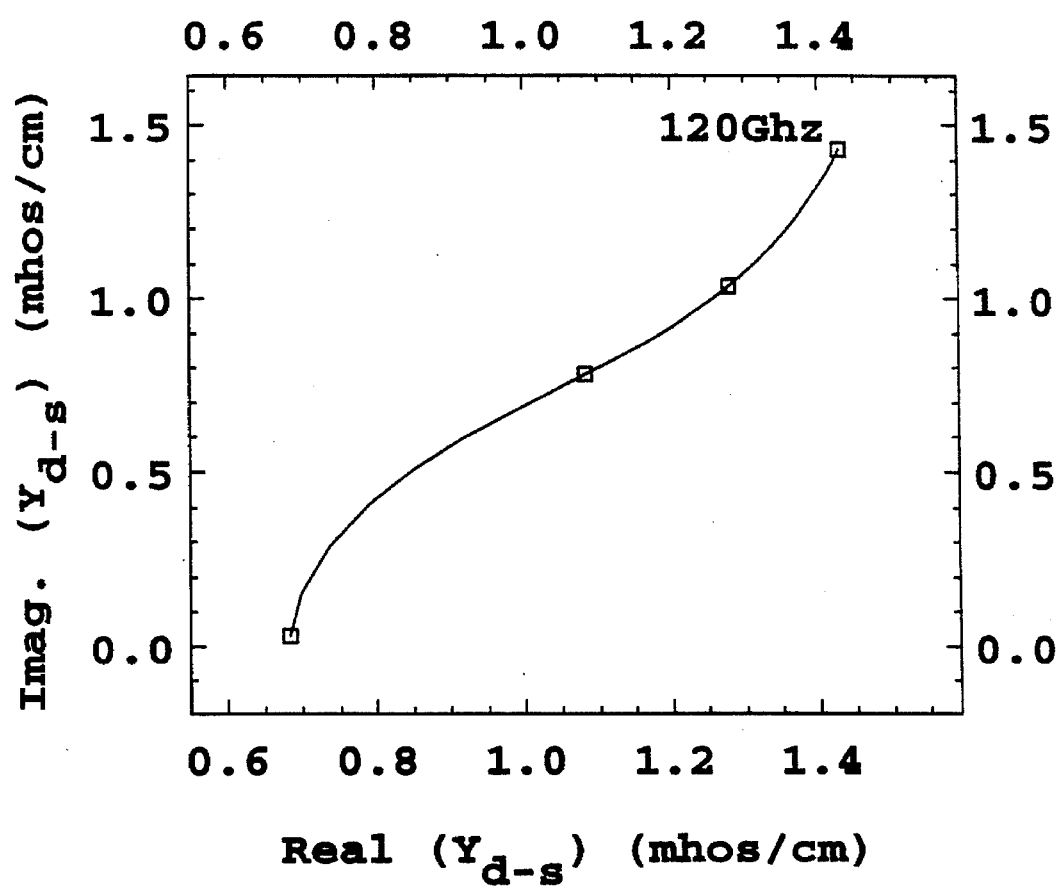
Figure 21:
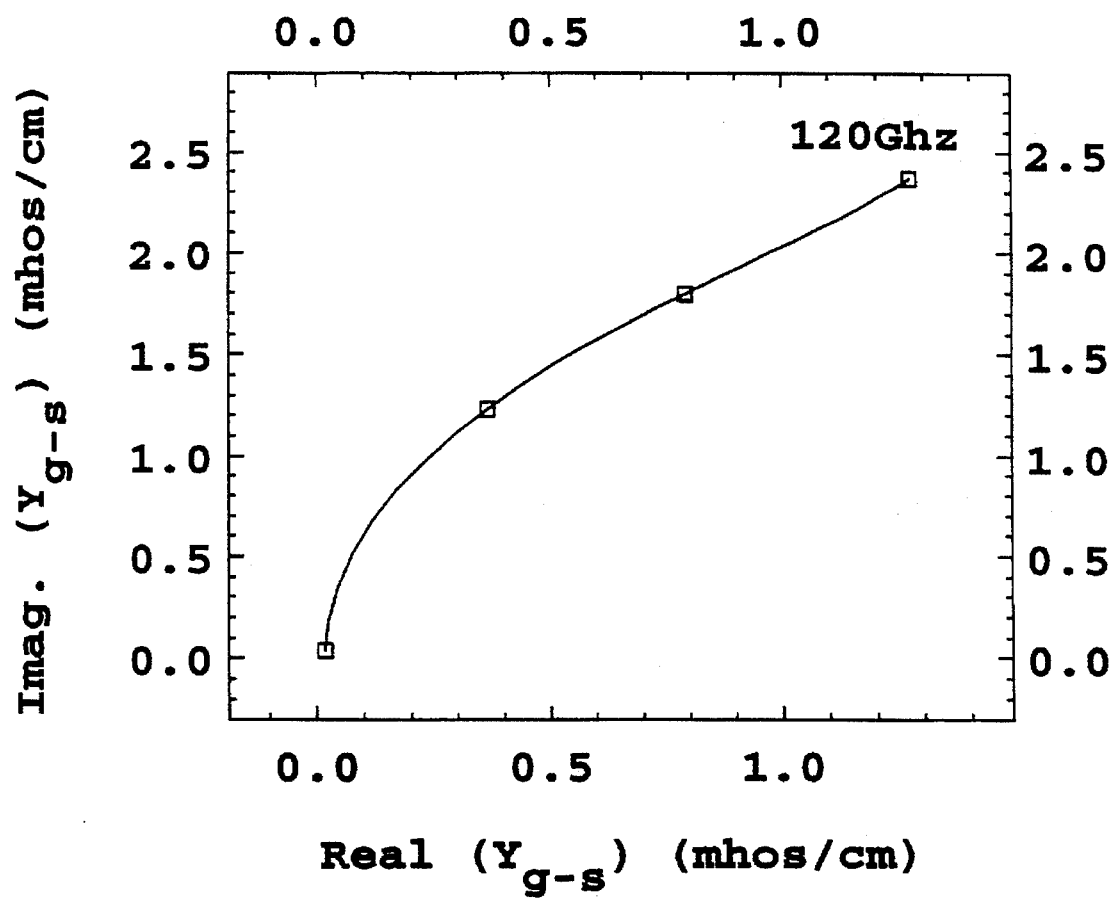
Figure 22:
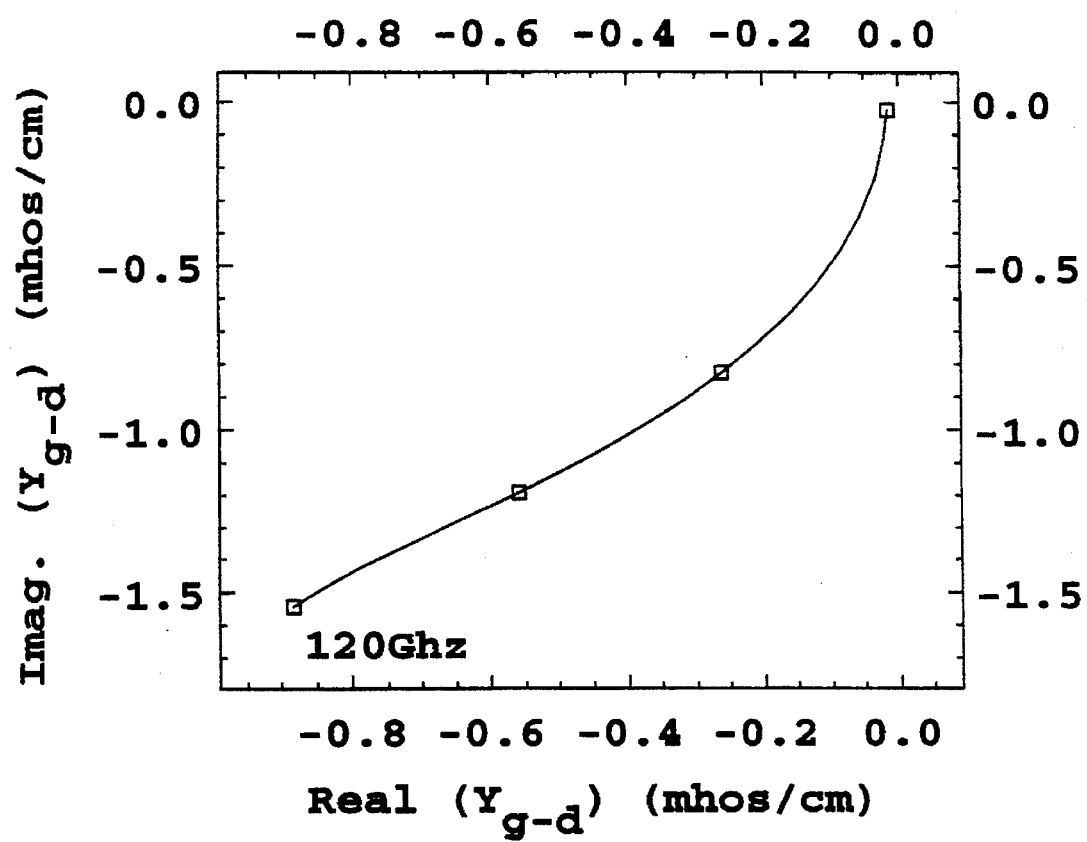
Figure 23:
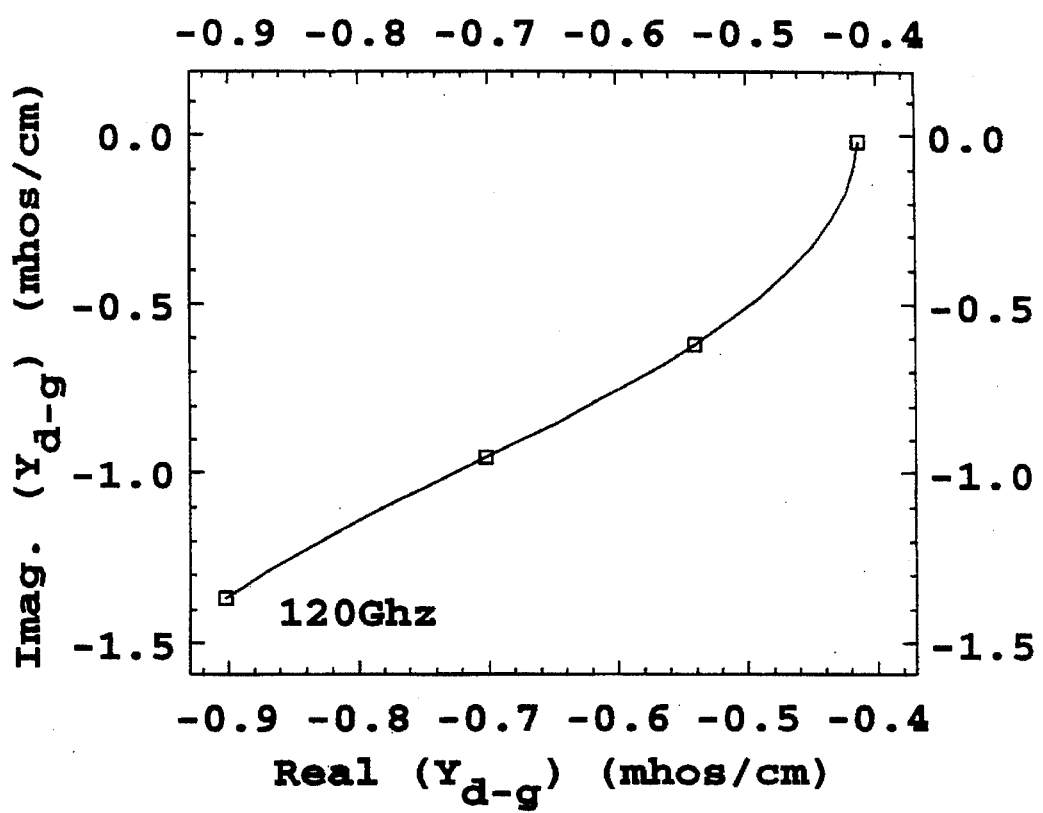
Figure 24:
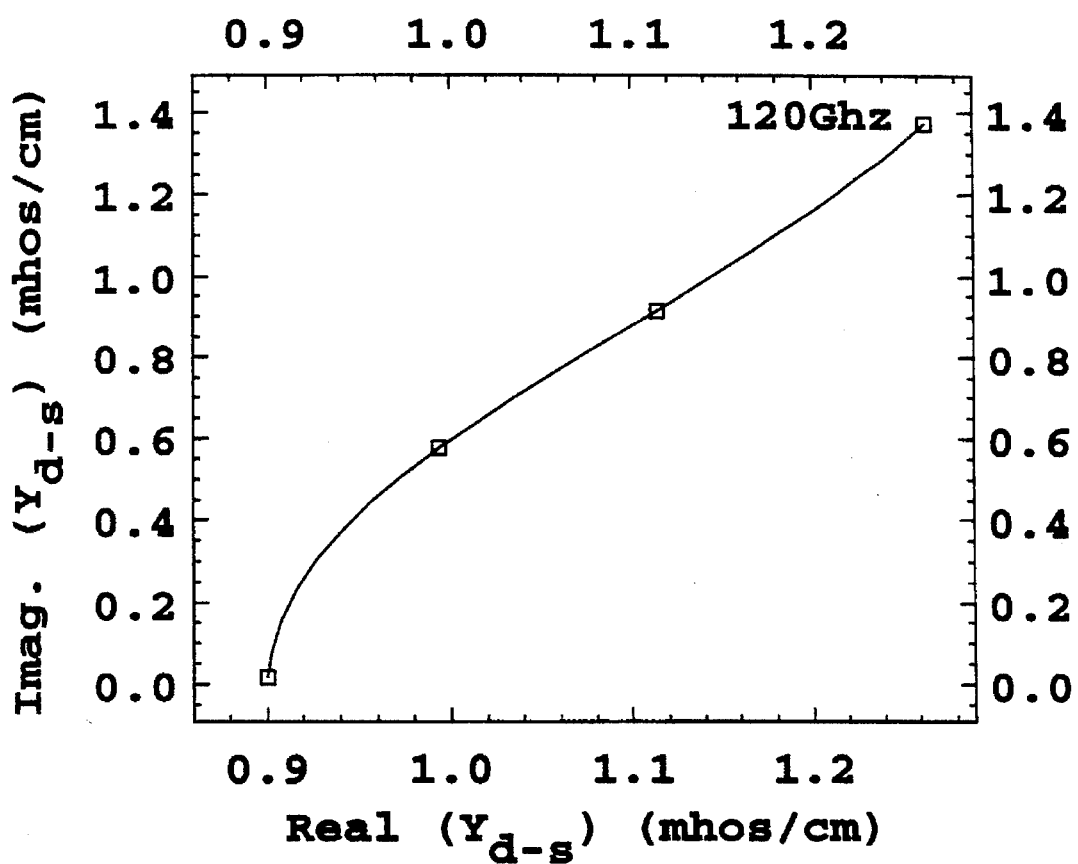
Figure 25:
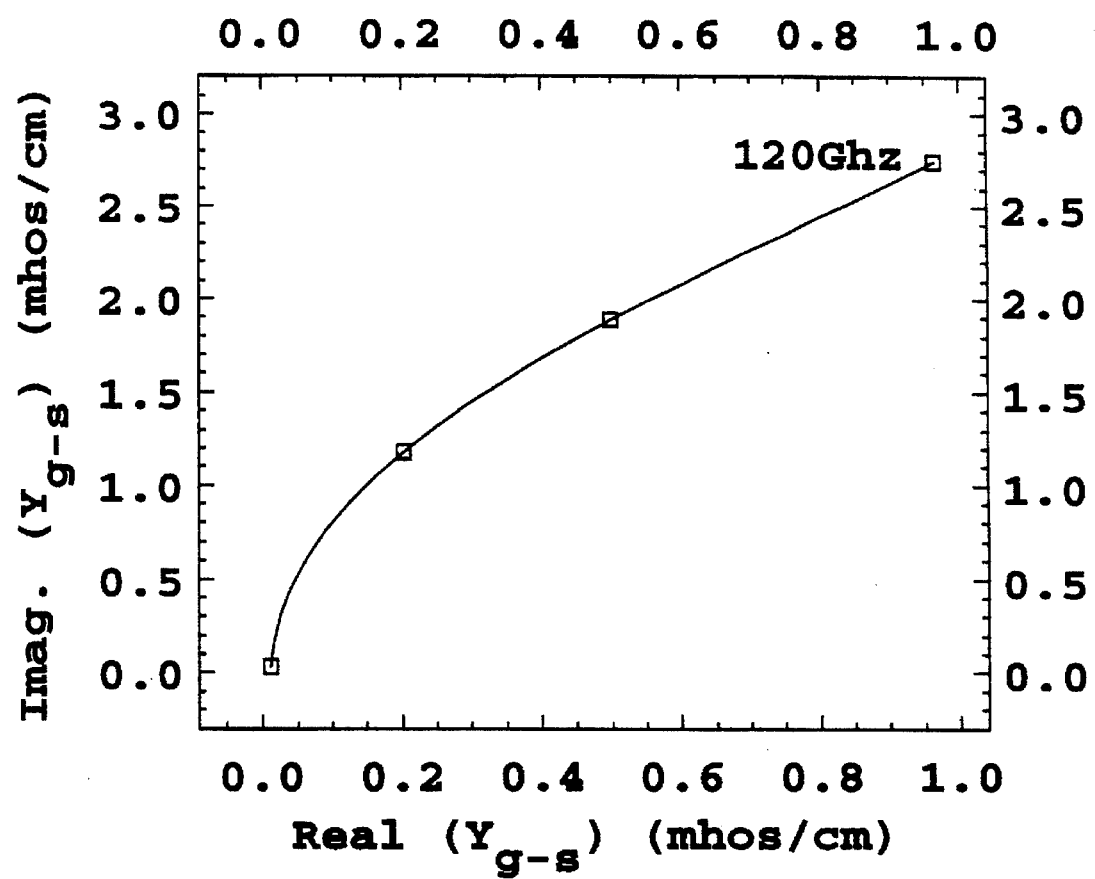
Figure 26:
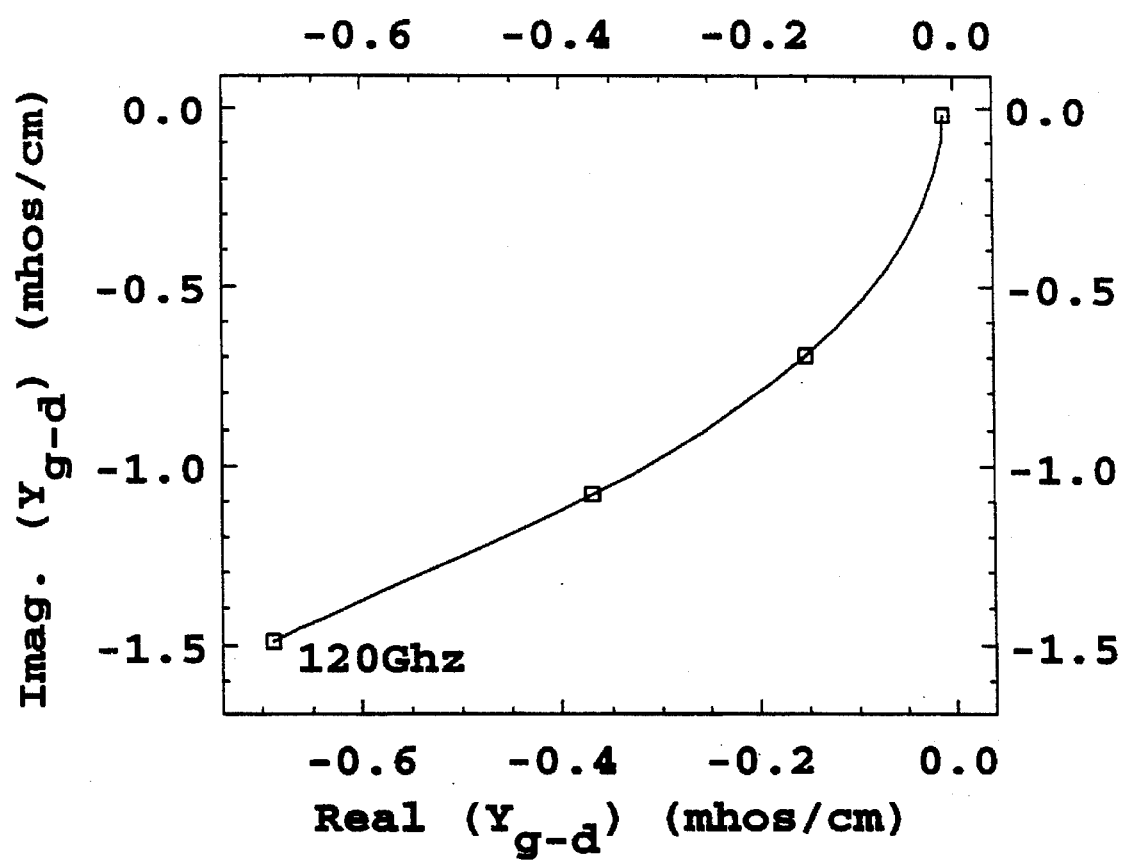
Figure 27:
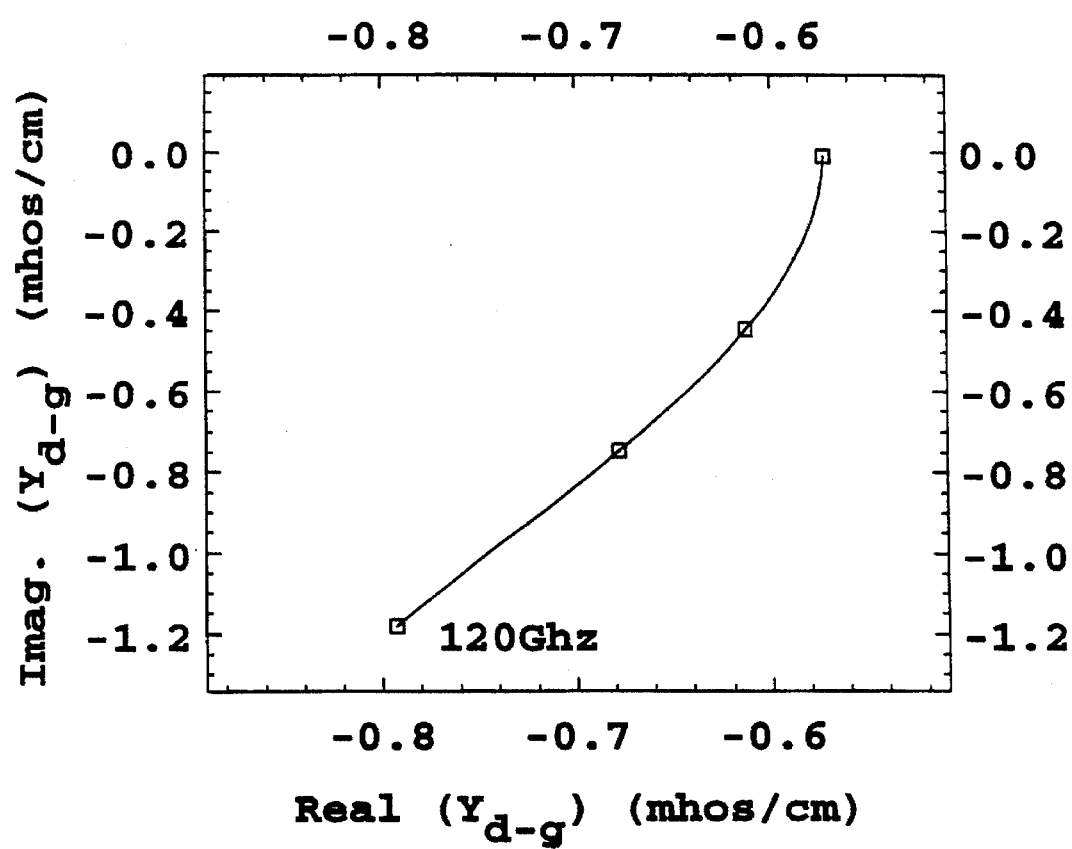
Figure 28:
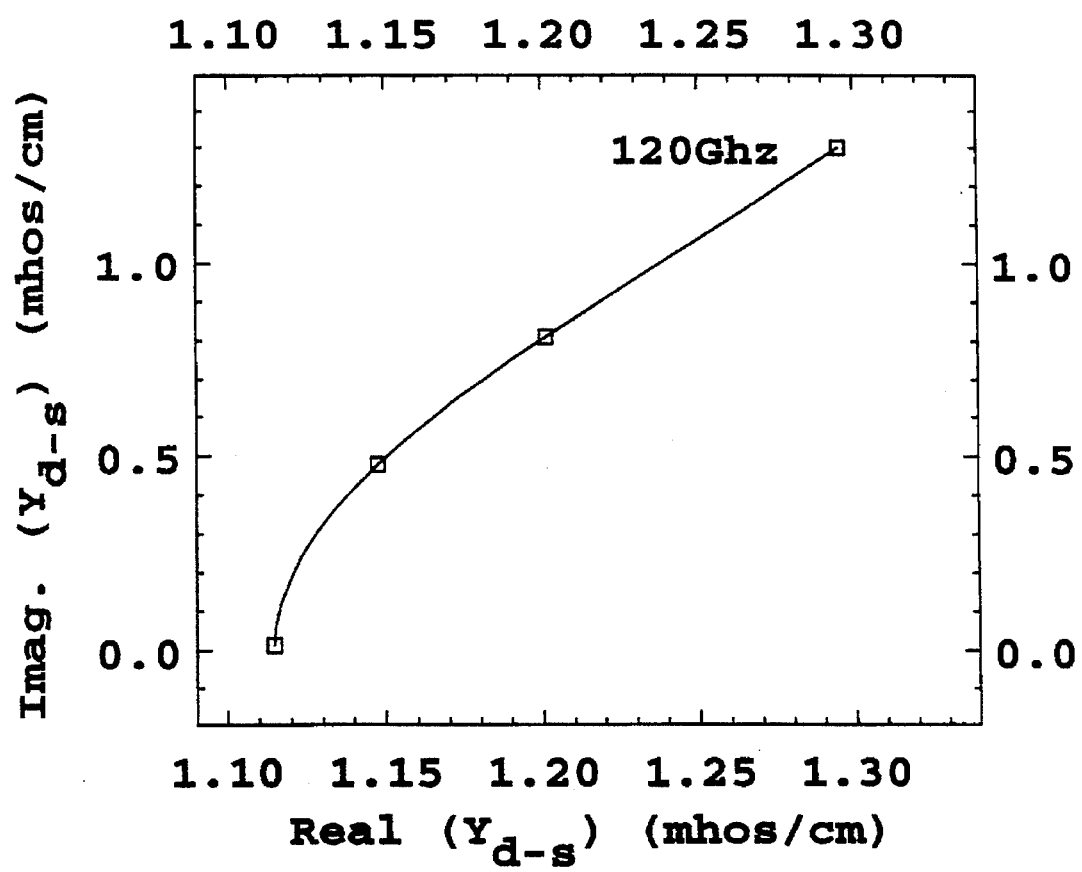
Figure 29:
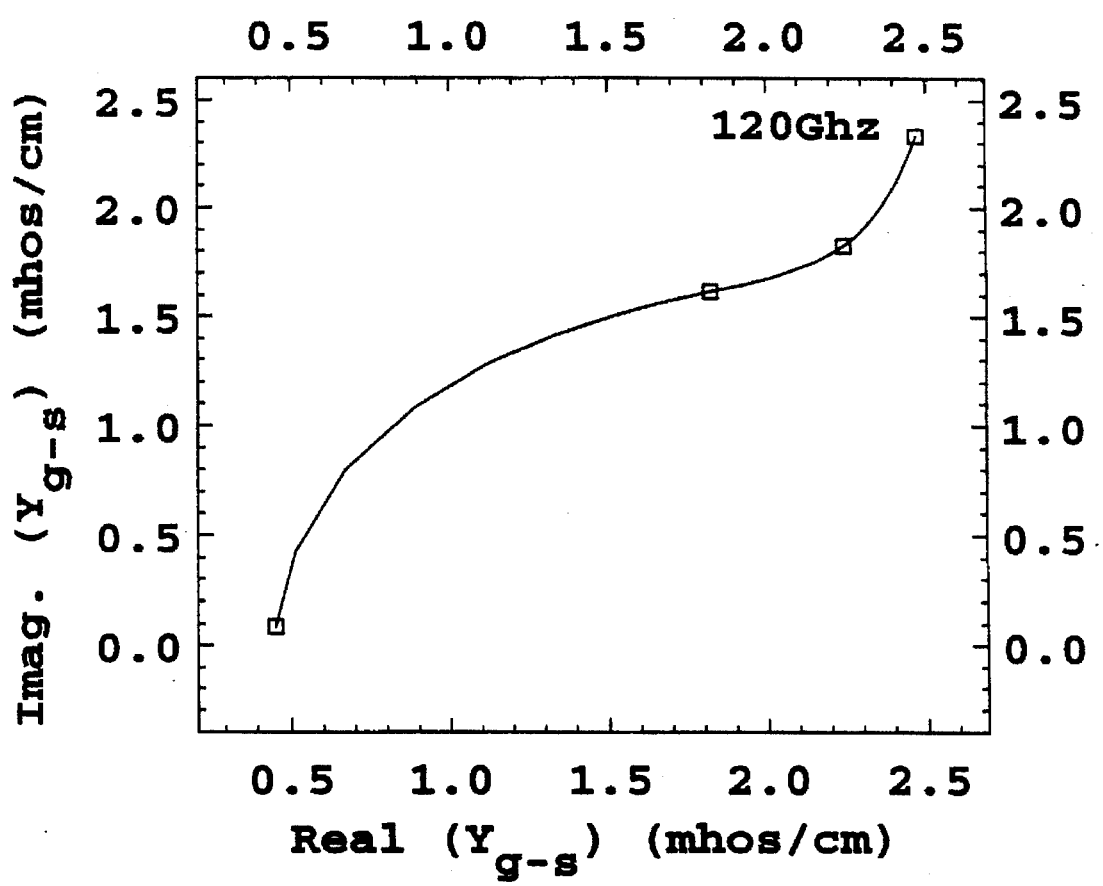
Figure 30:
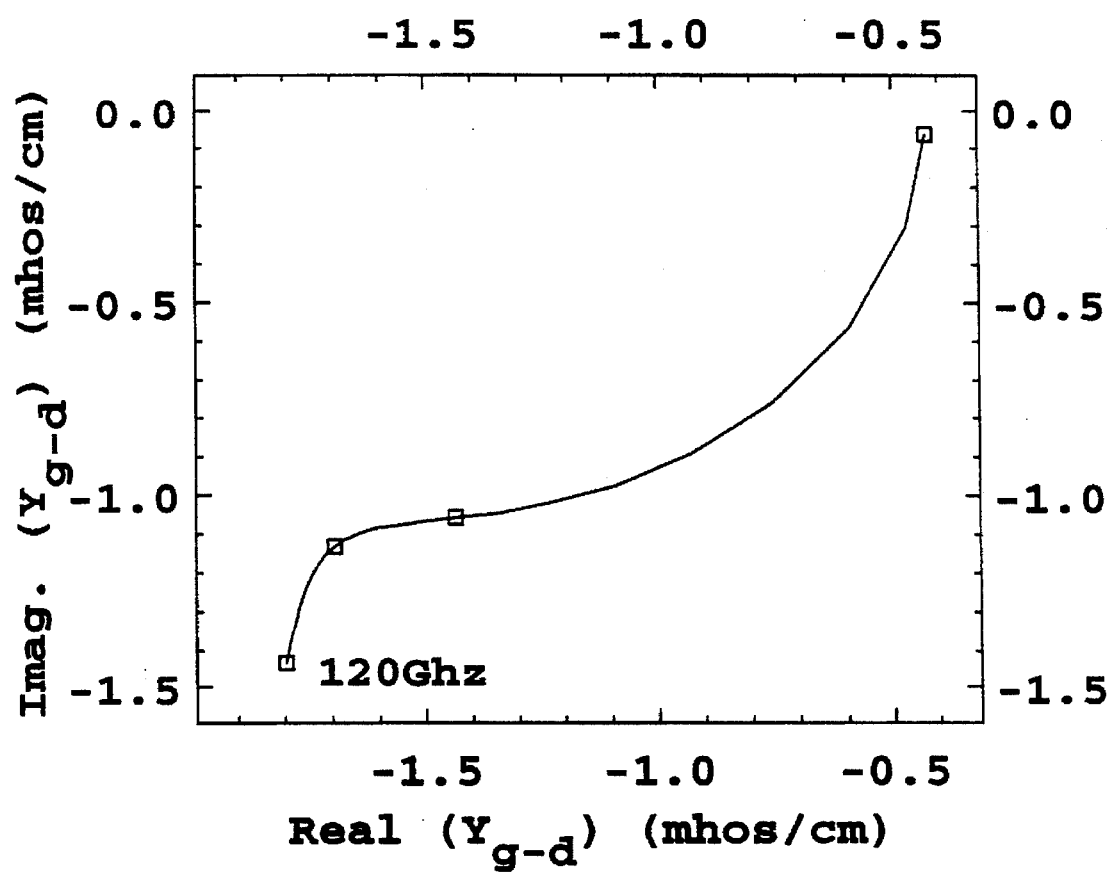
Figure 31:
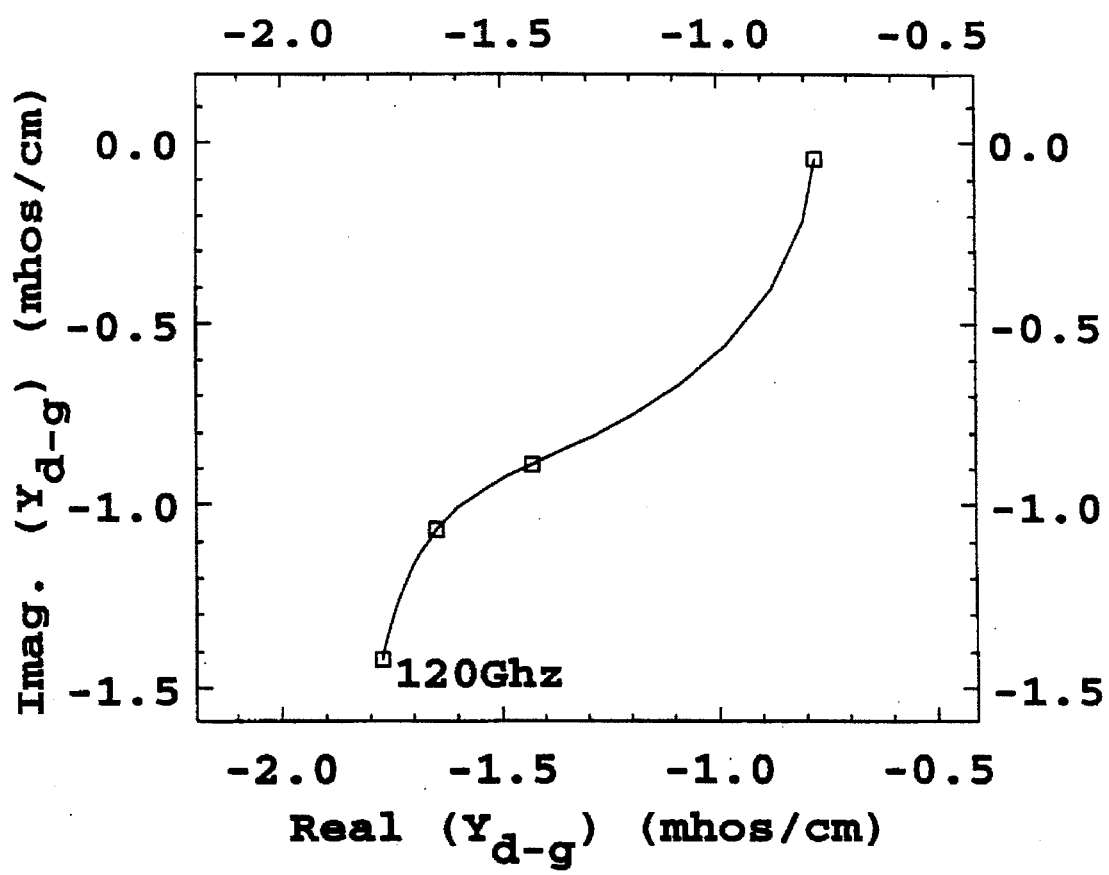
Figure 32:
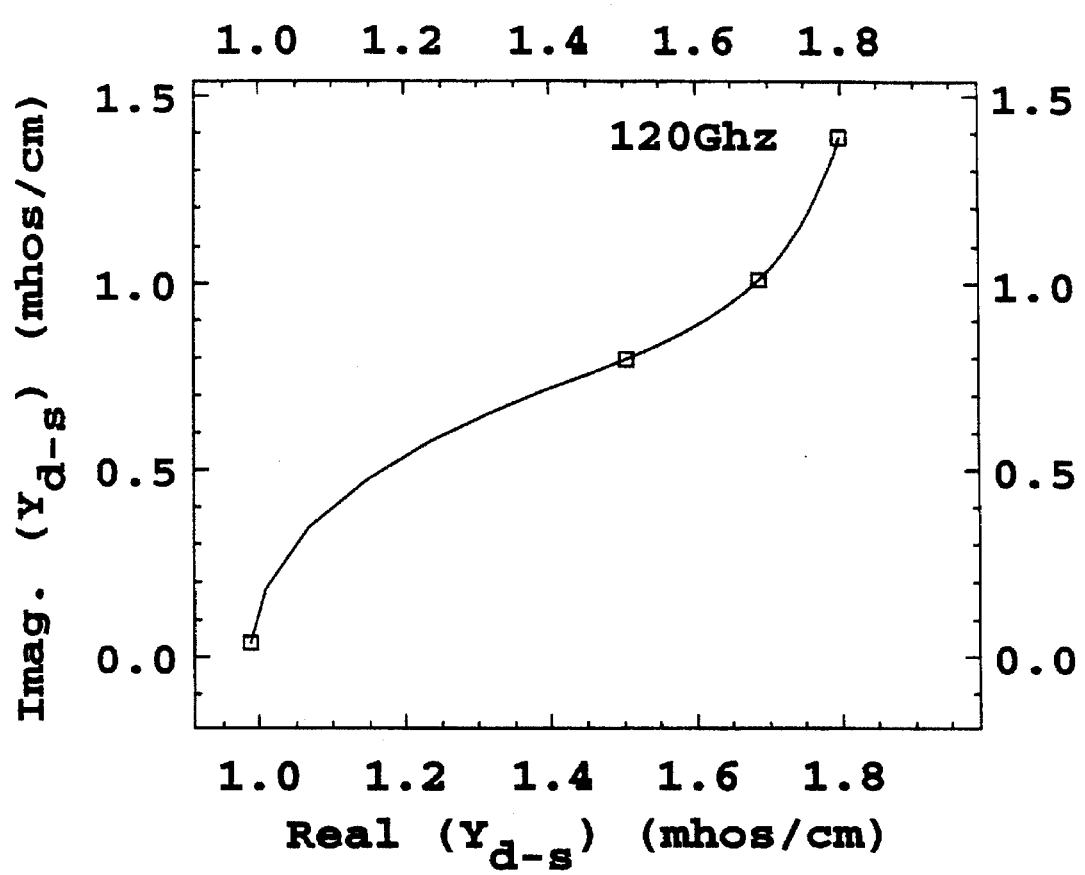
Figure 33:
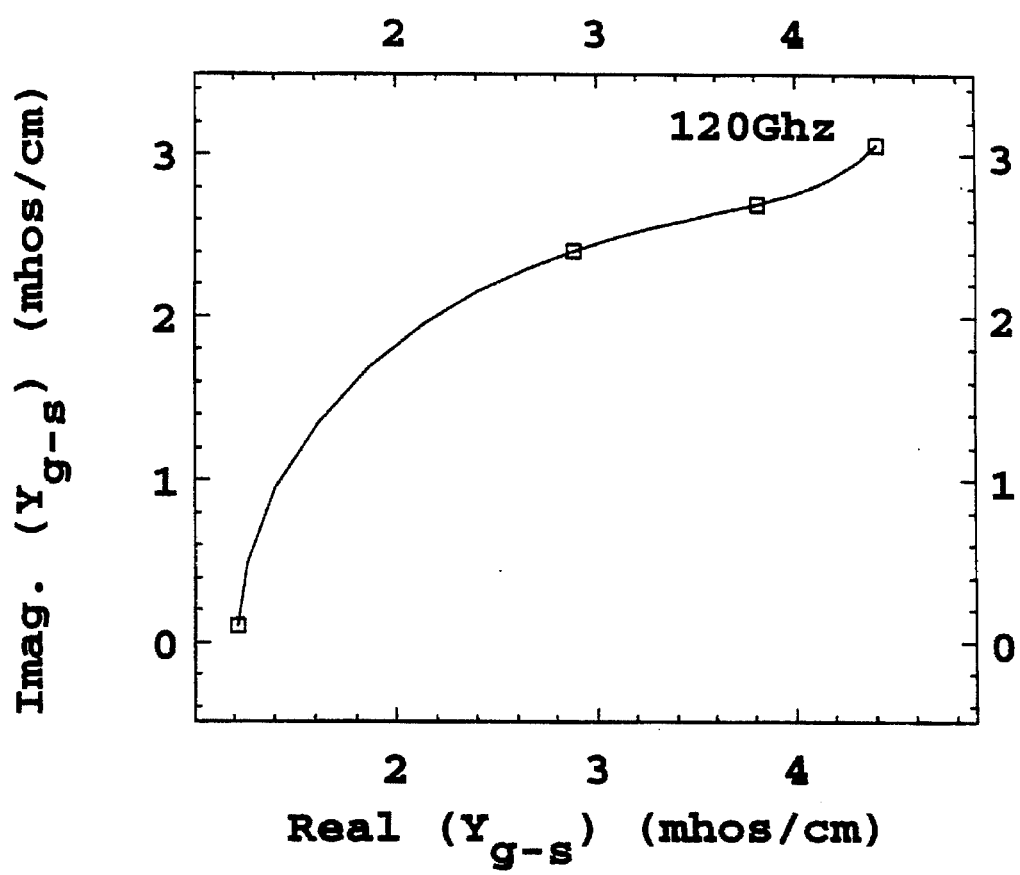
Figure 34:
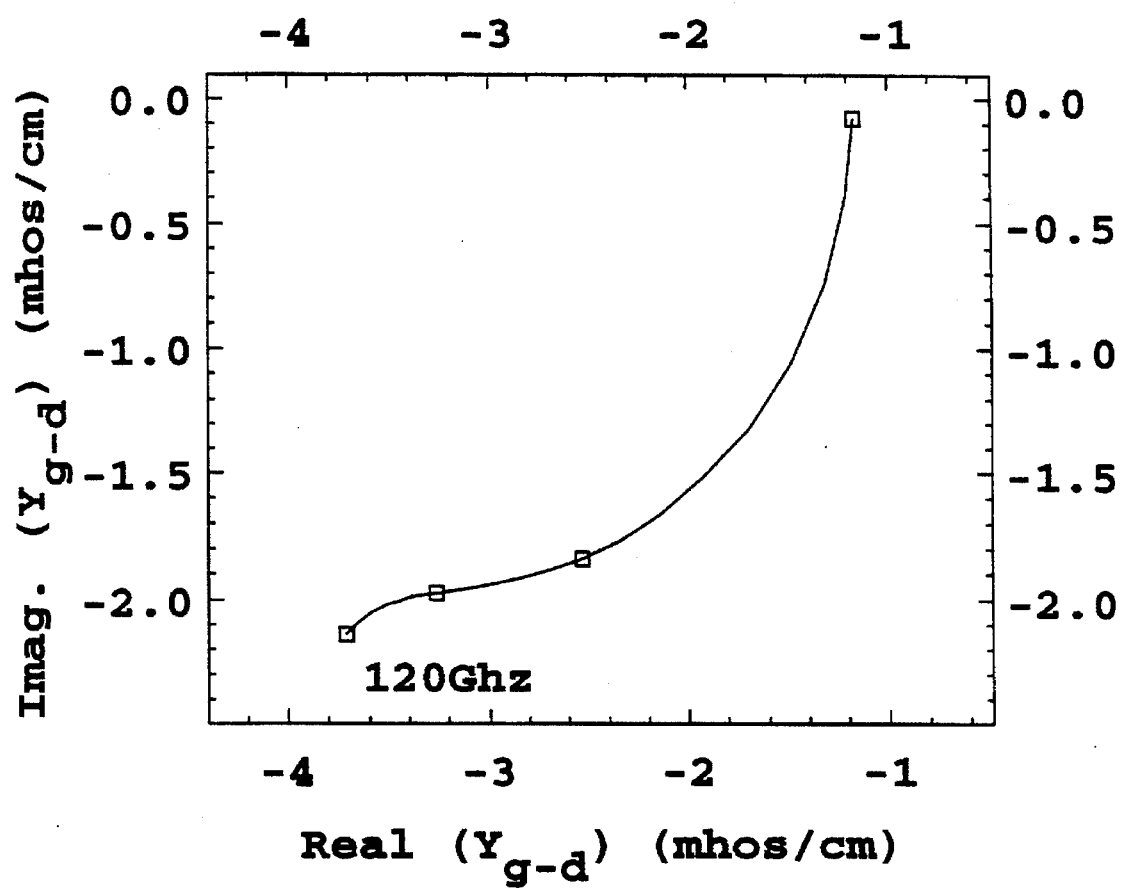
Figure 35:
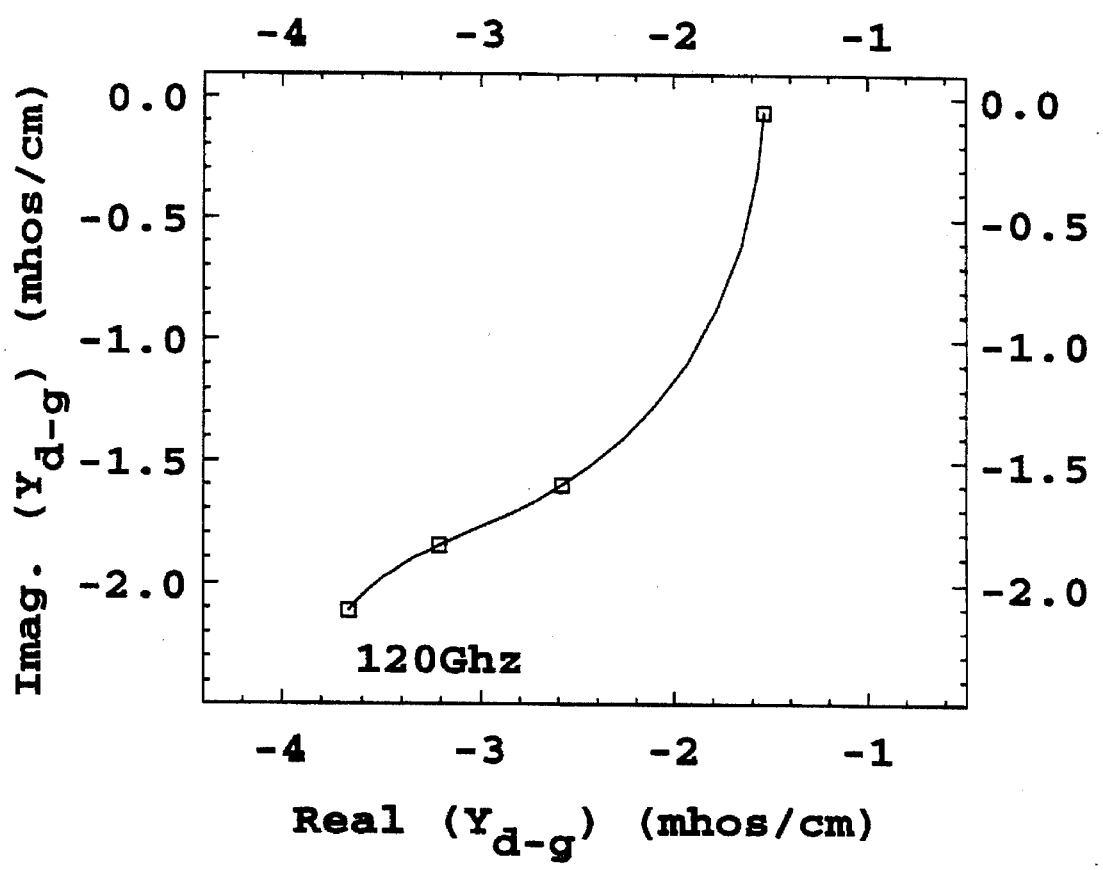
Figure 36:
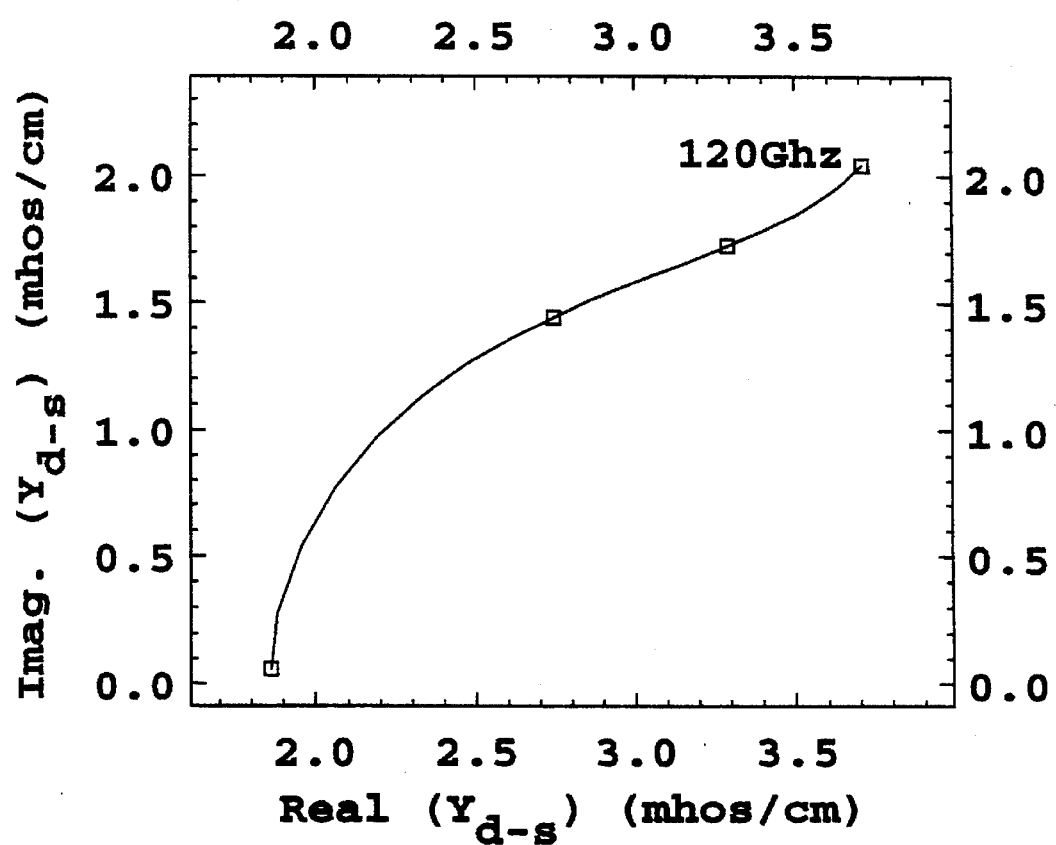
Figure 37:
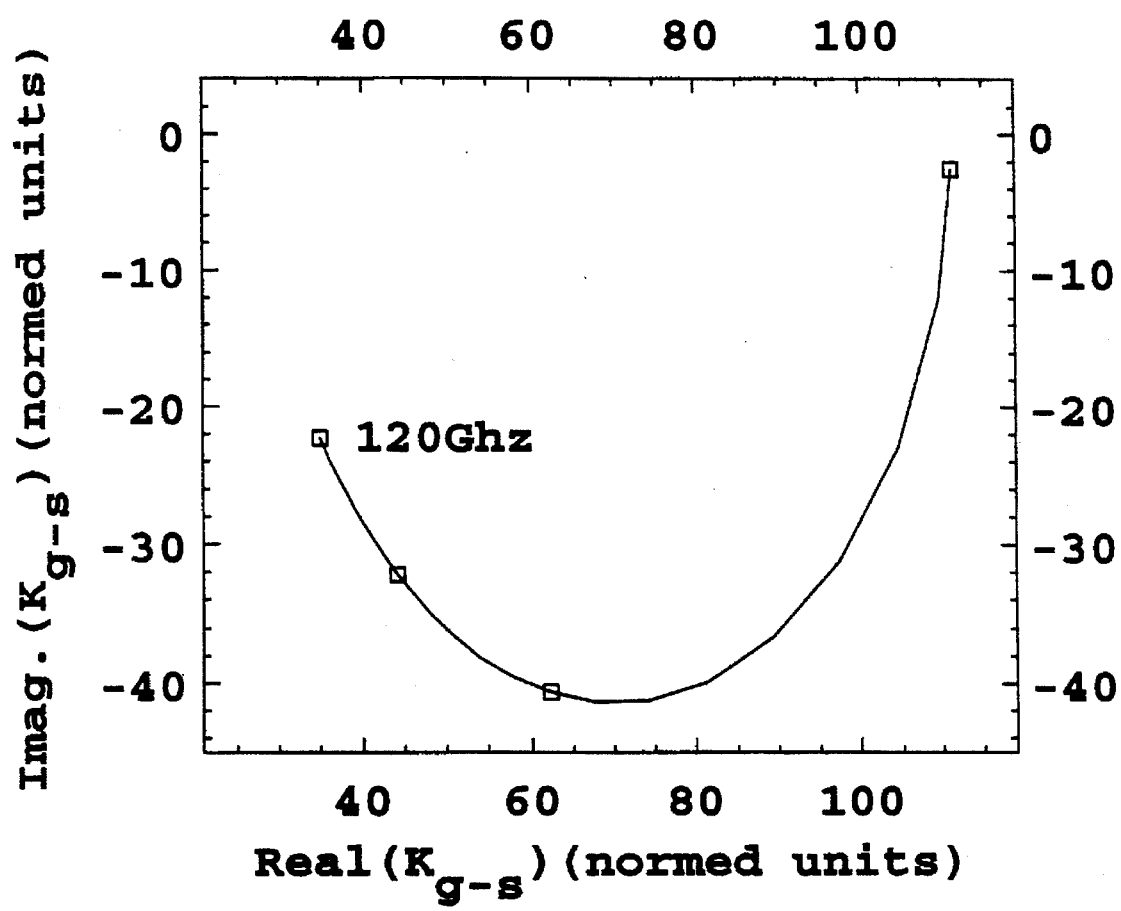
FIGS. 37–60 show the variation in the AC charge matrix for specific FETs of the present invention in the "forward" configuration.
Figure 38:
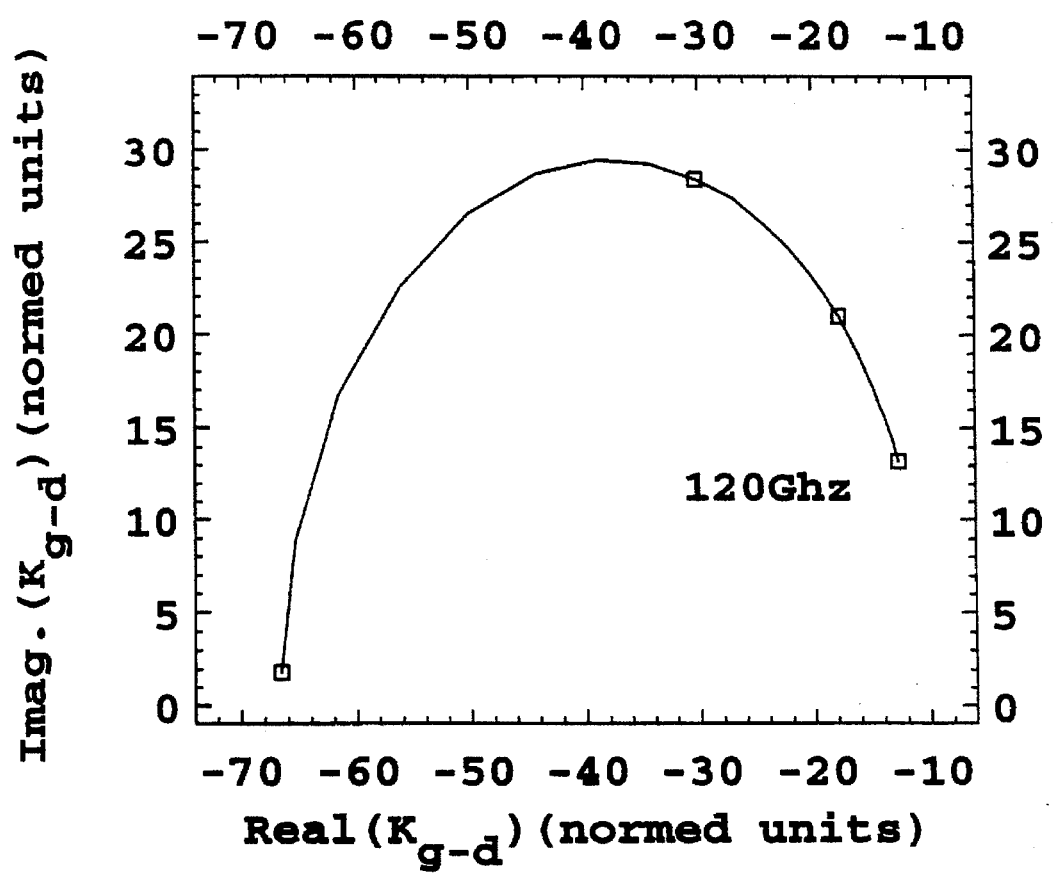
Figure 39:
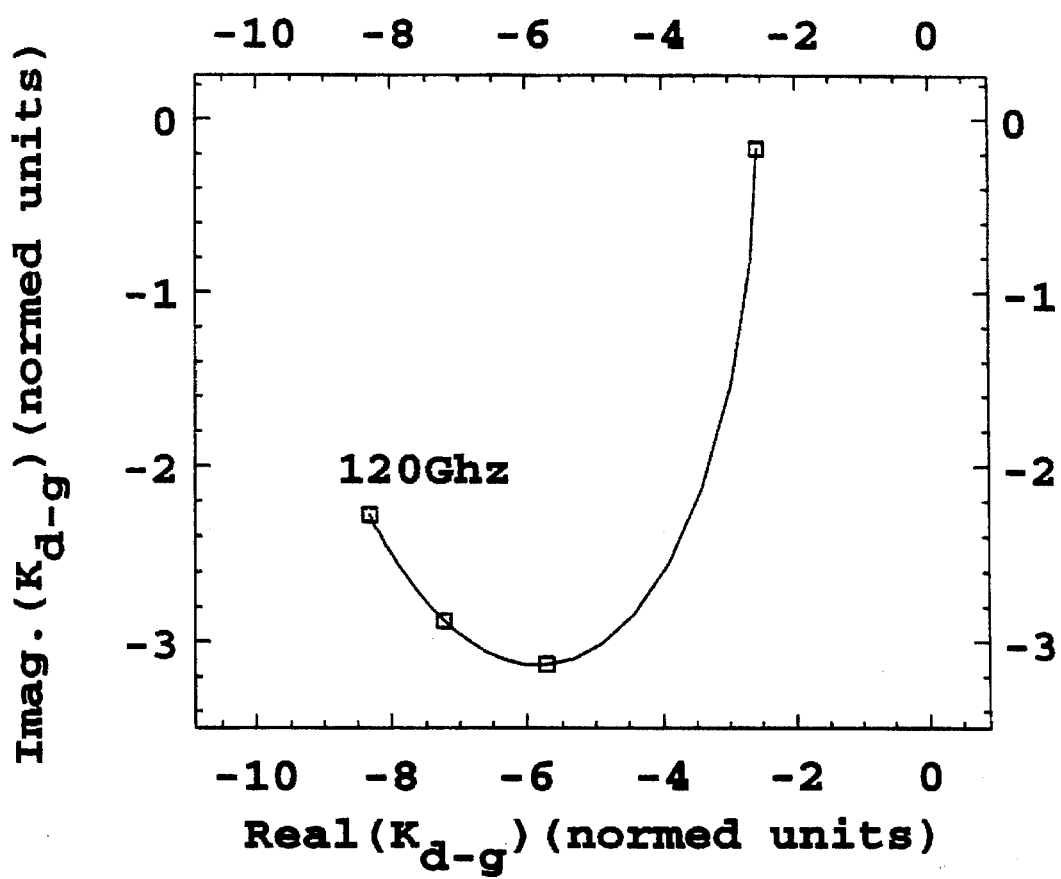
Figure 40:
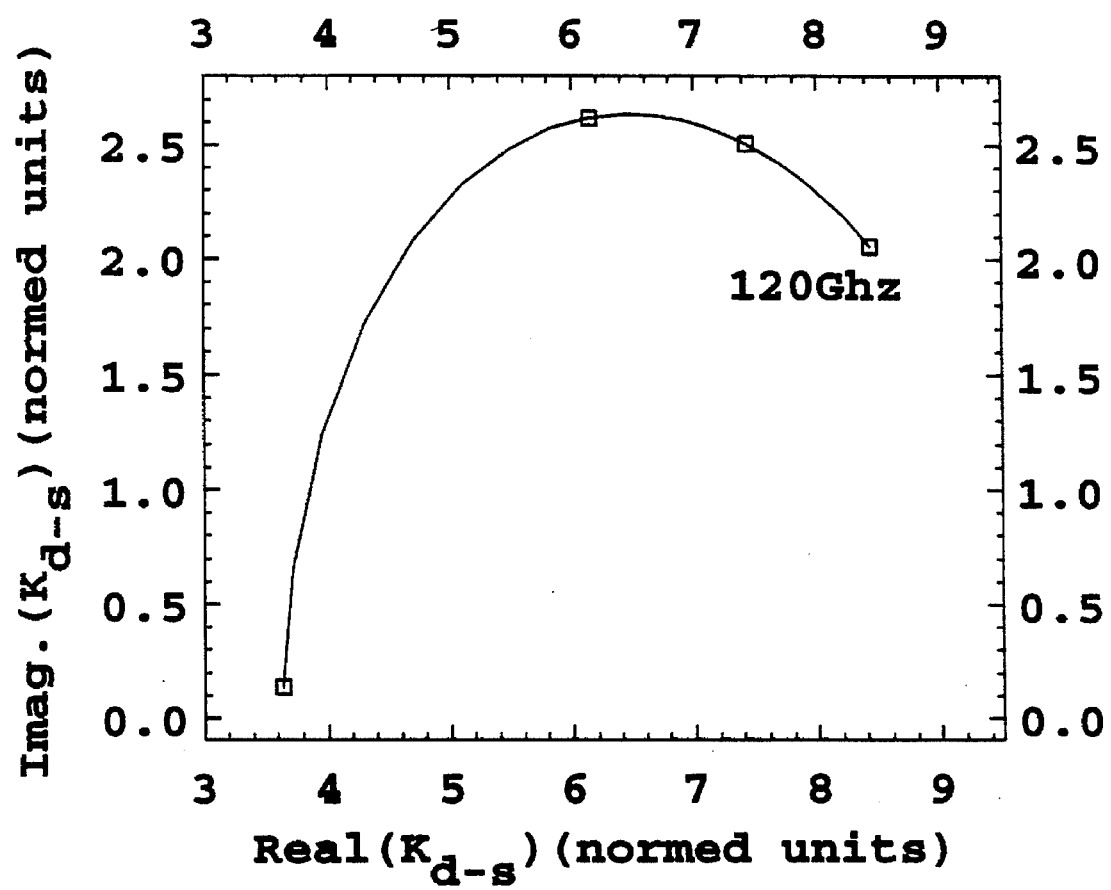
Figure 41:
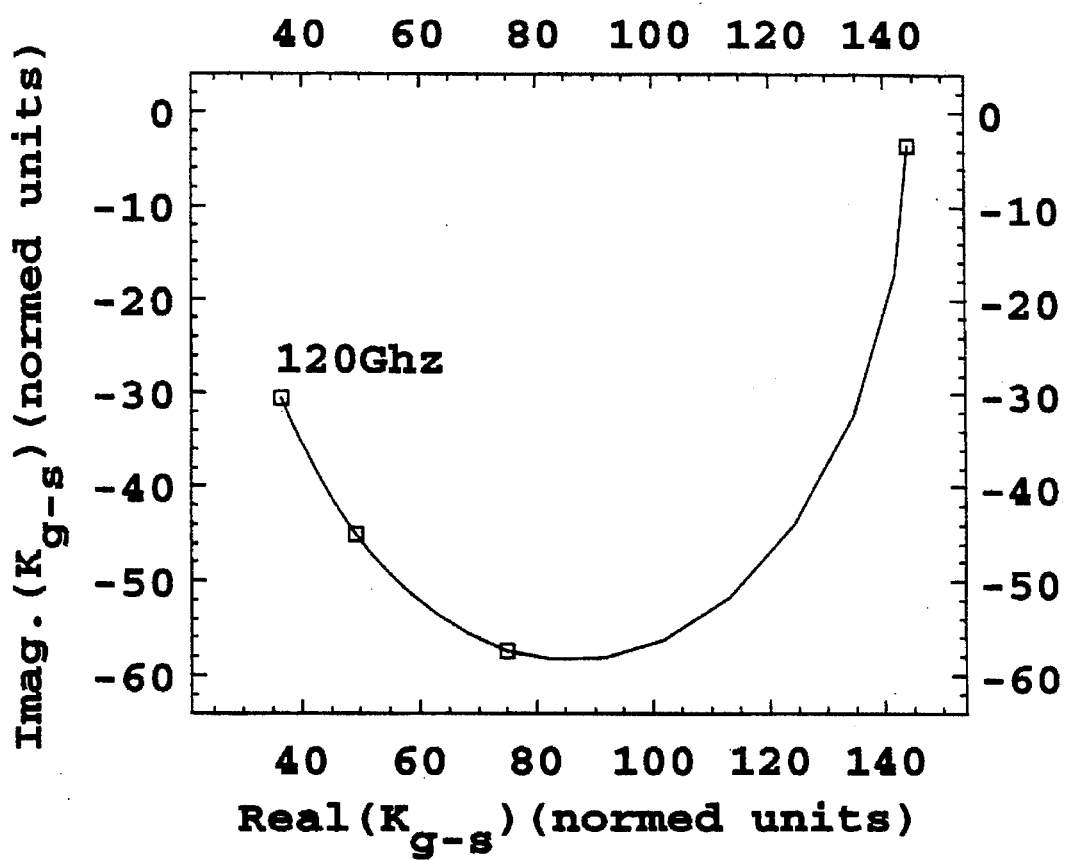
Figure 42:
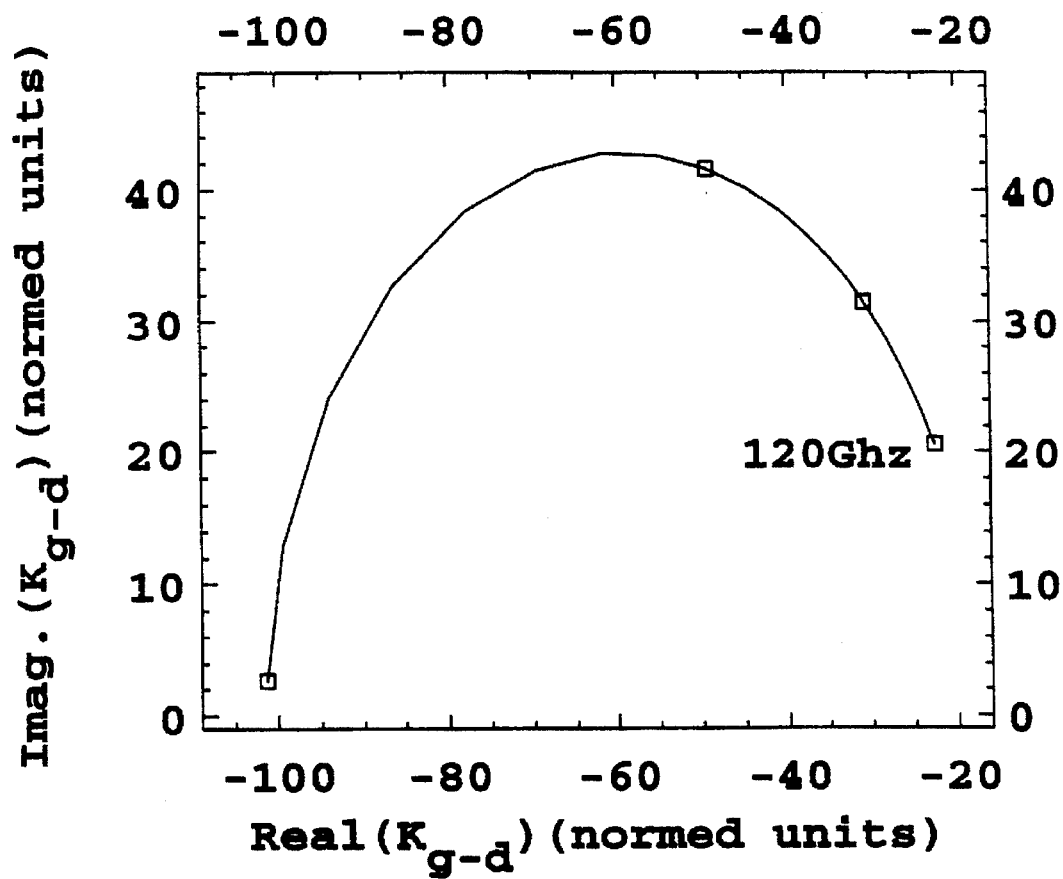
Figure 43:
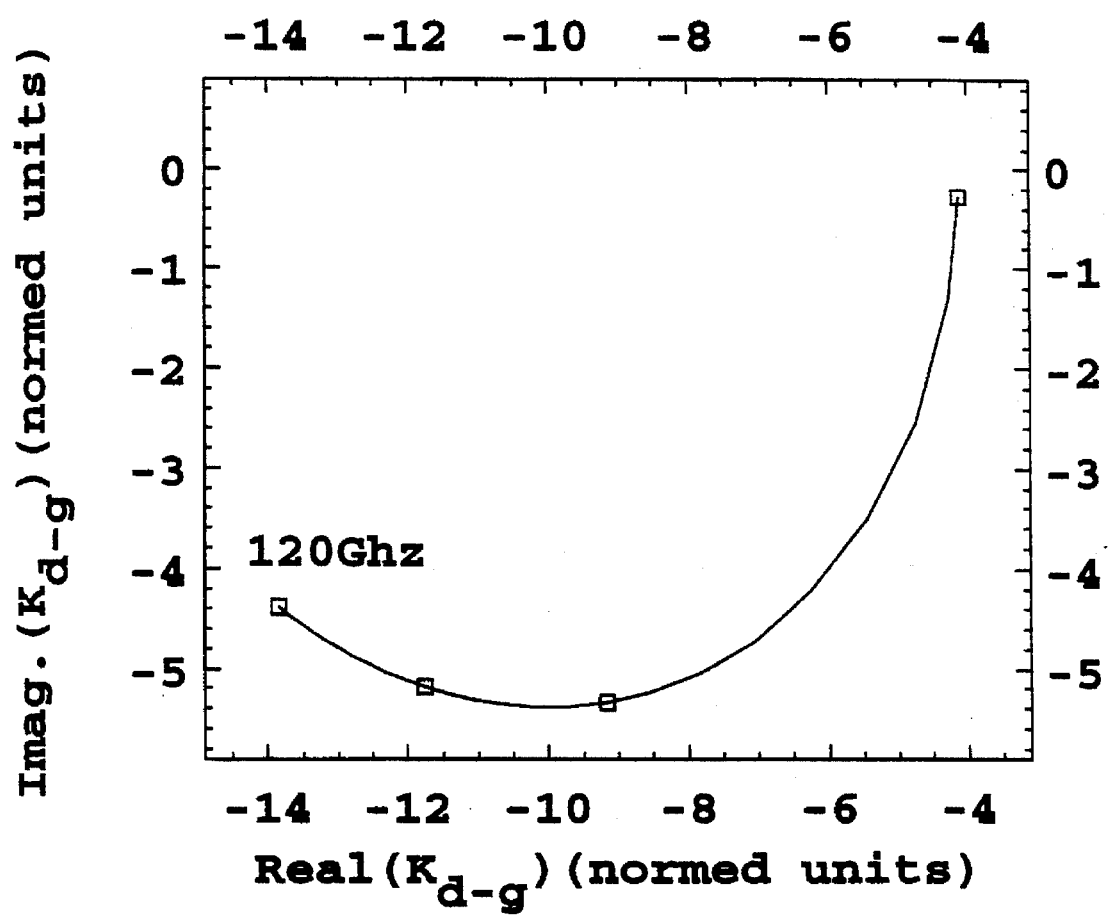
Figure 44:
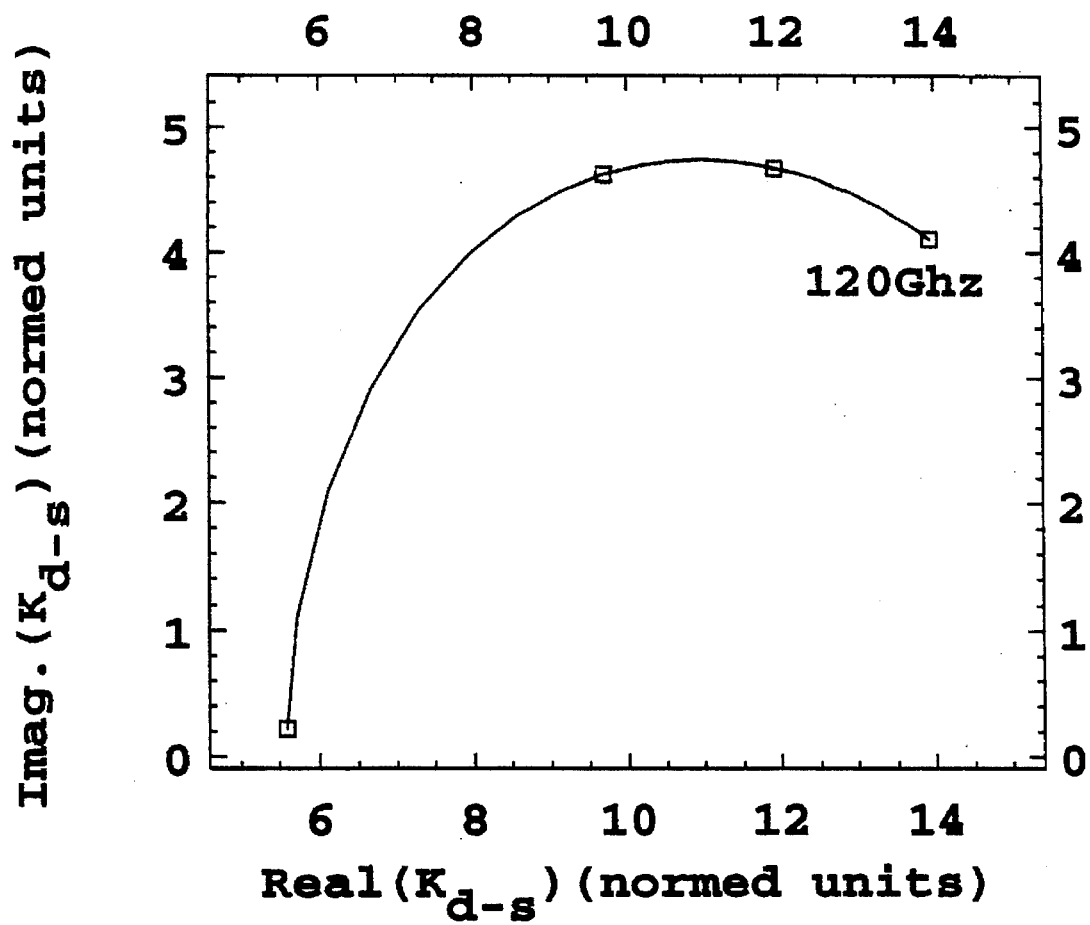
Figure 45:
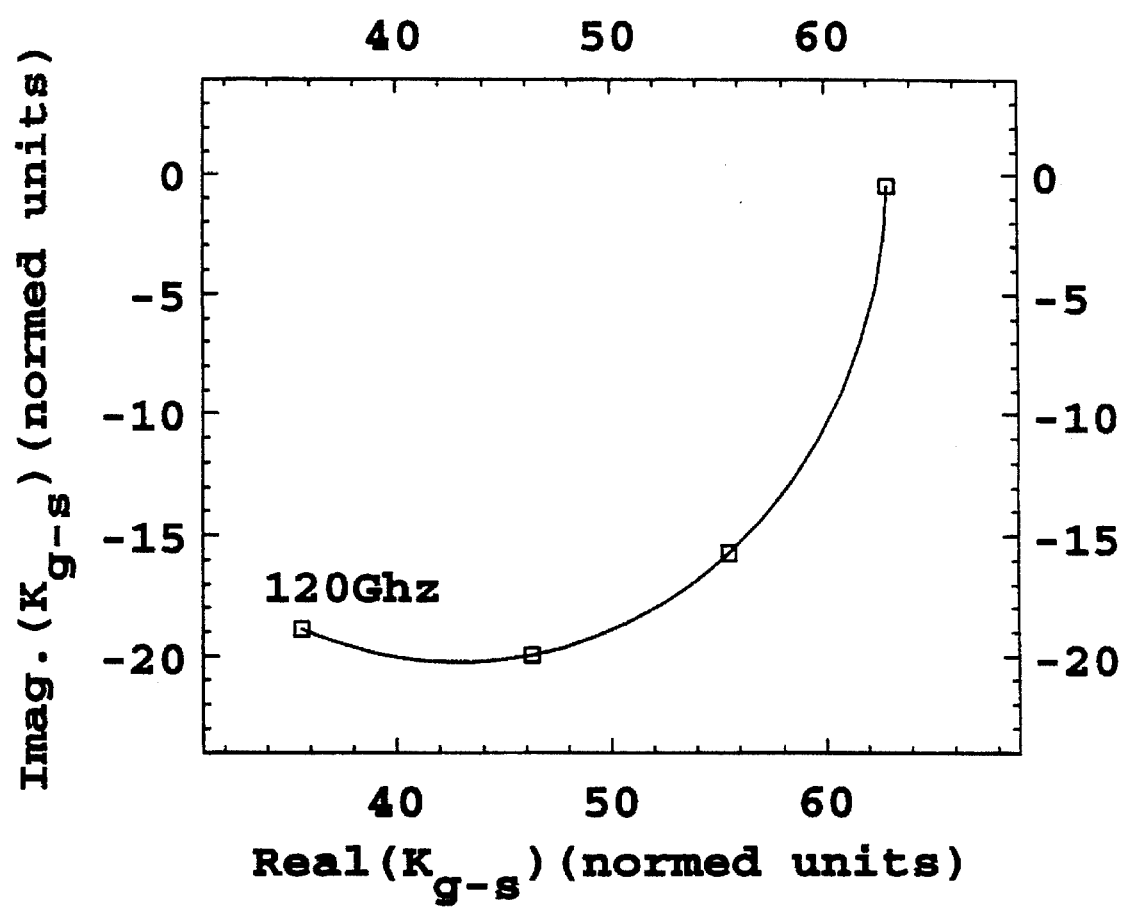
Figure 46:
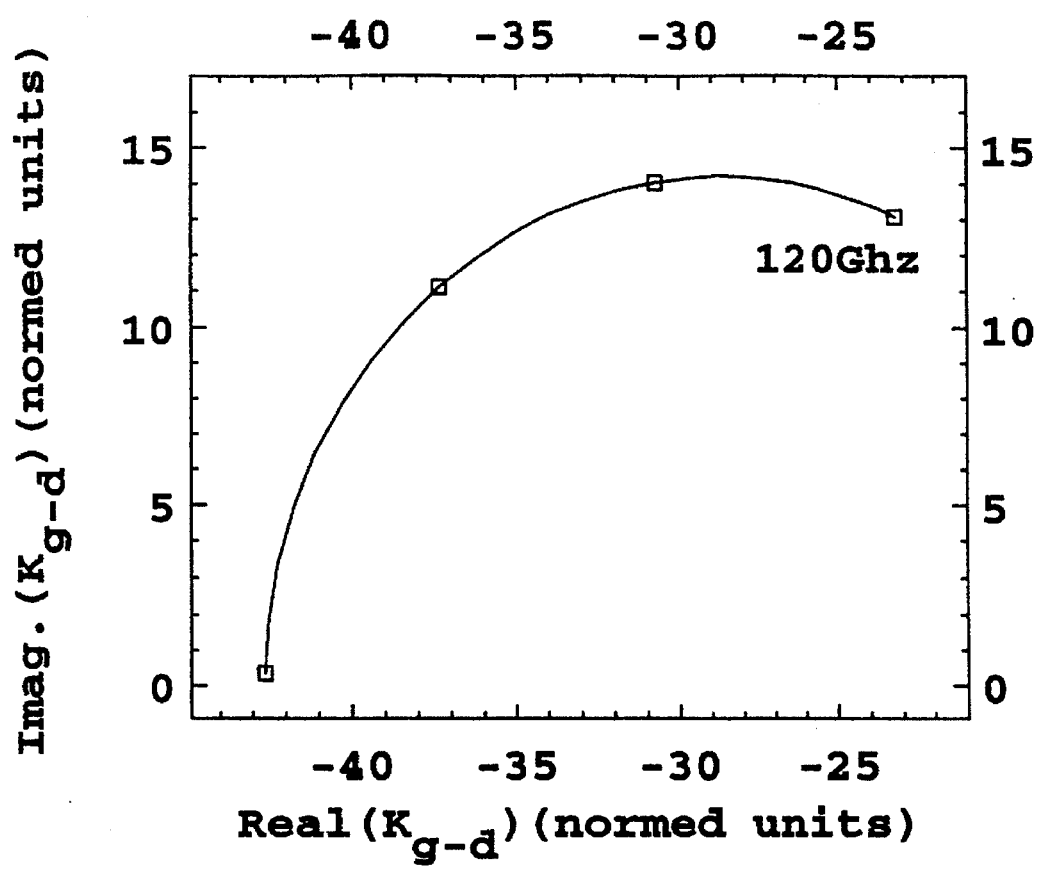
Figure 47:
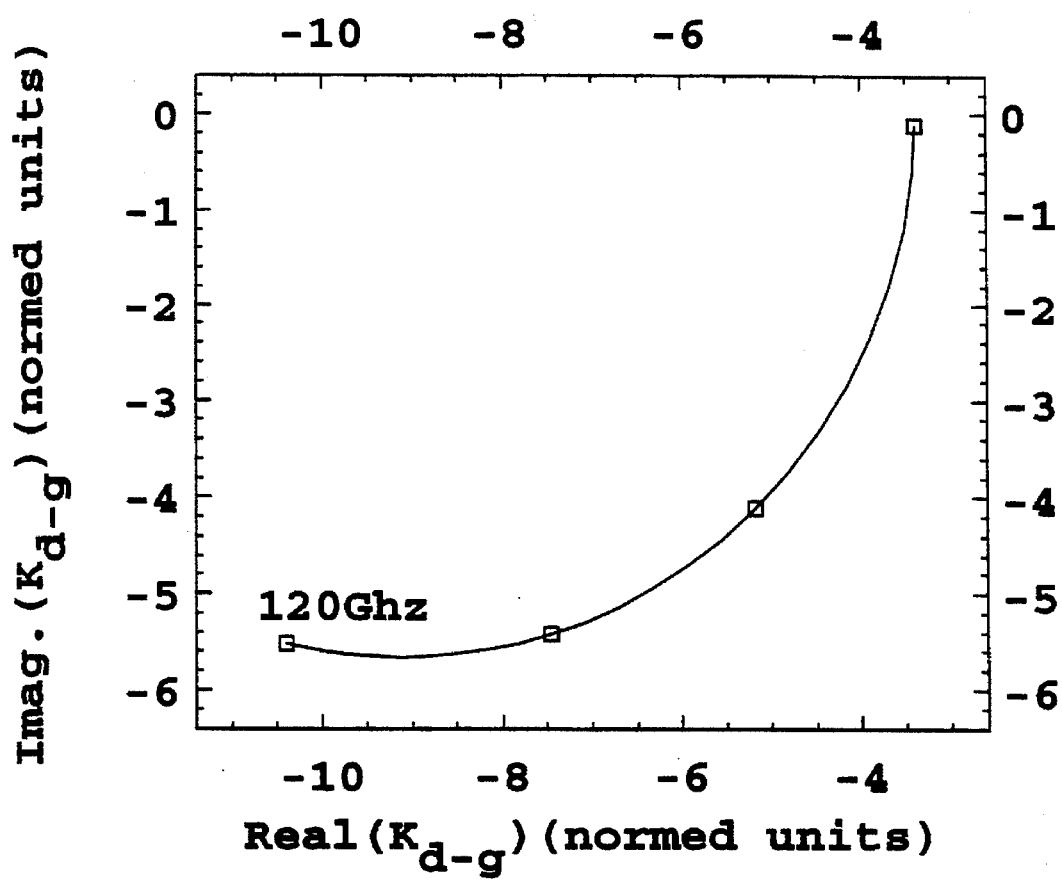
Figure 48:
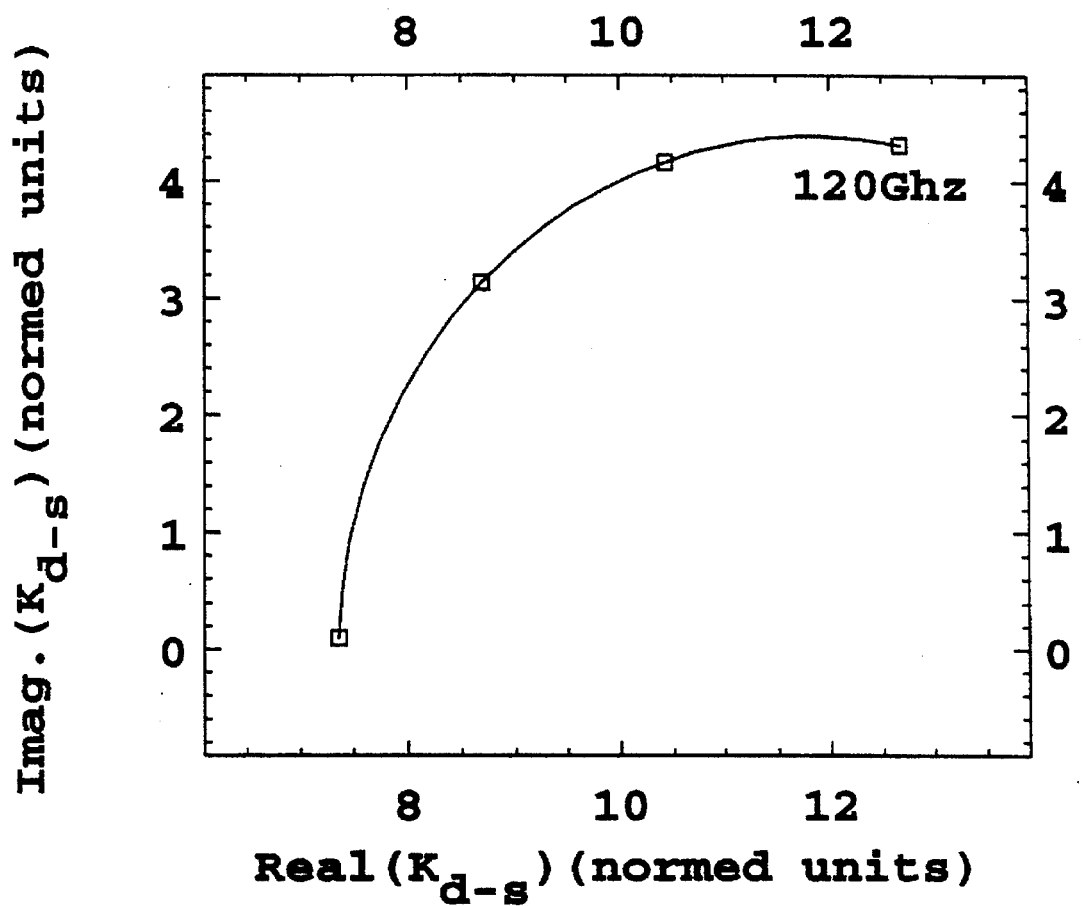
Figure 49:
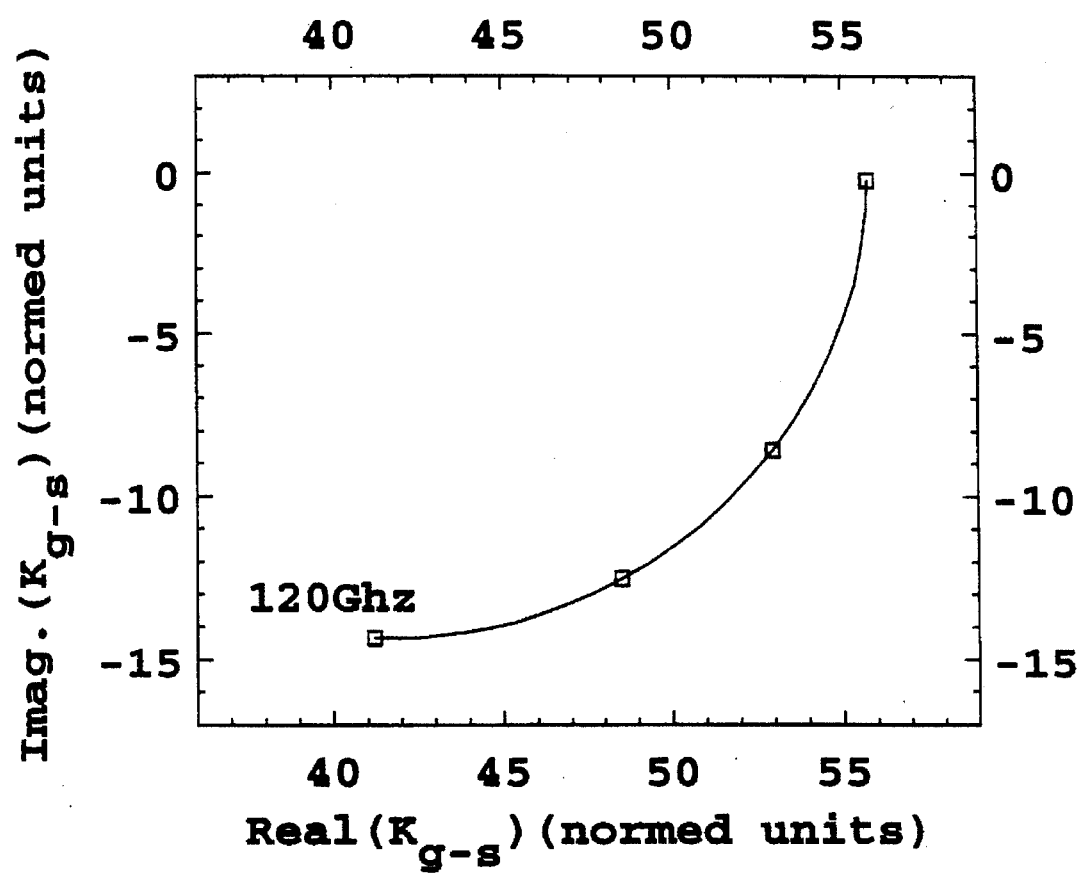
Figure 50:
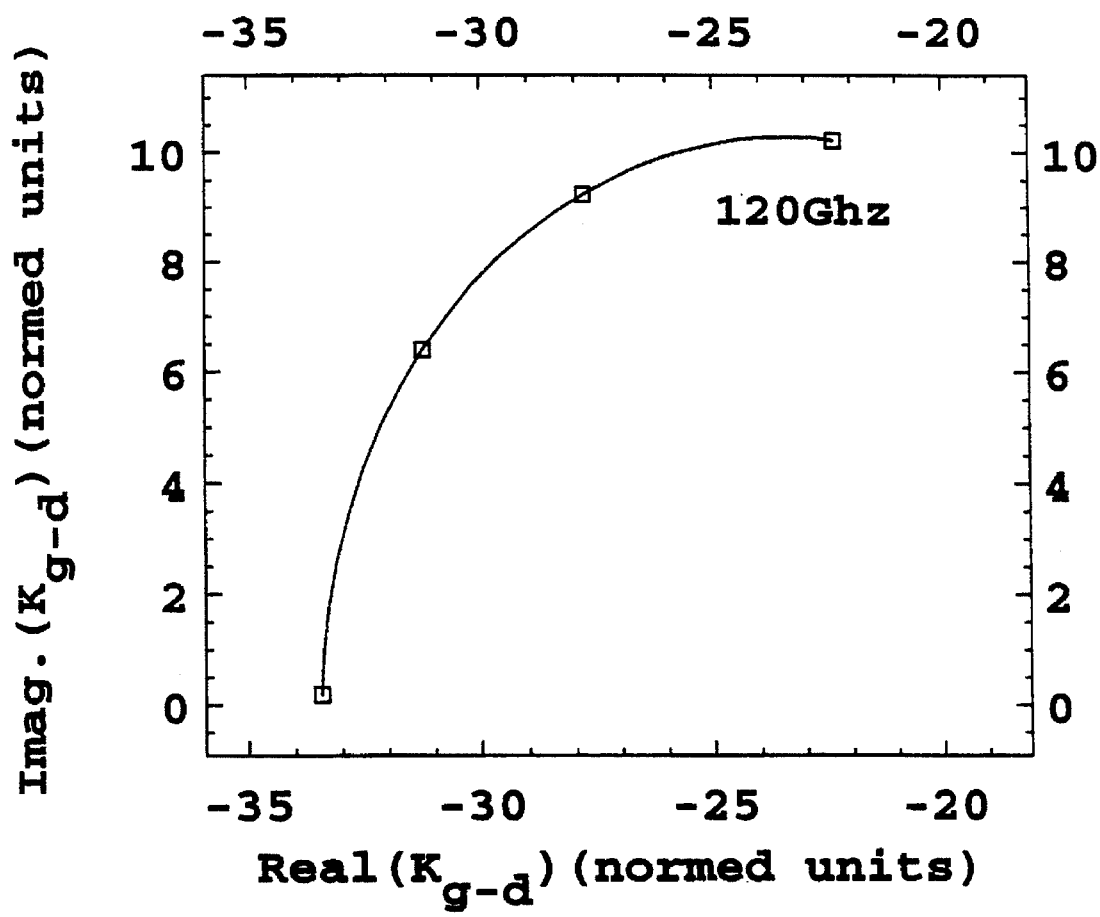
Figure 51:
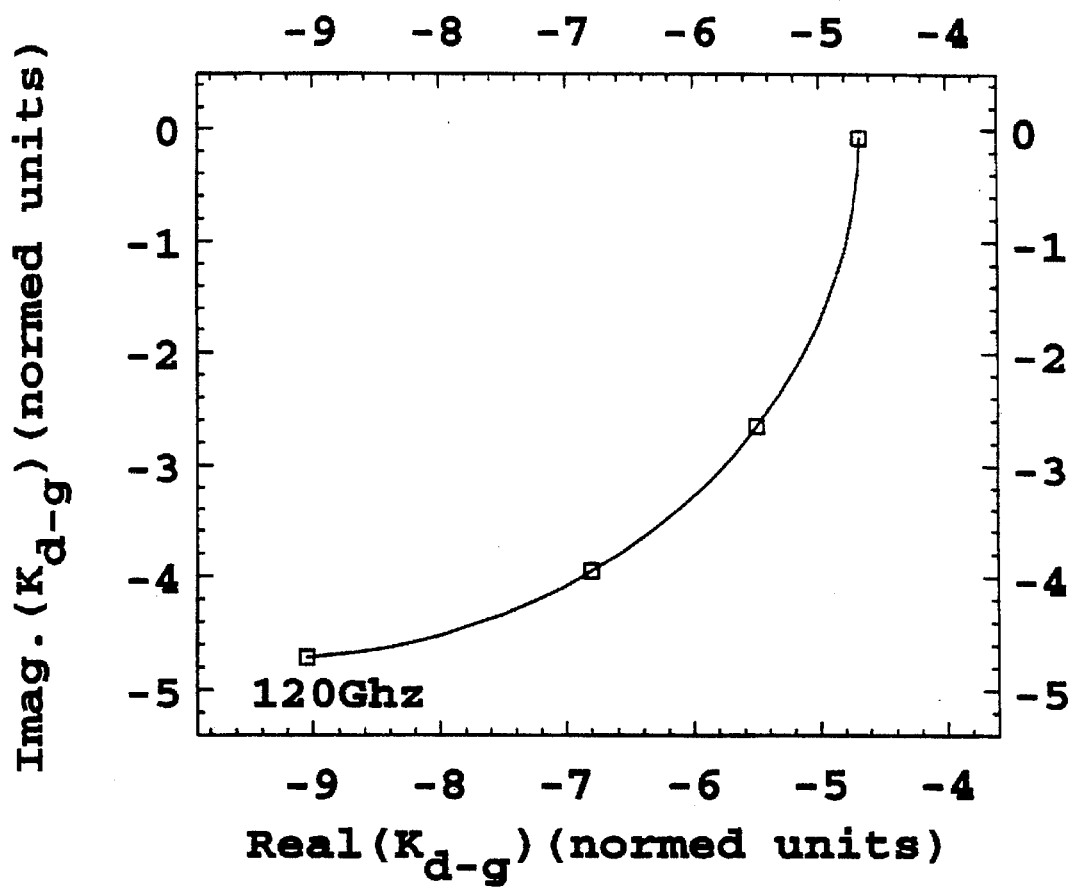
Figure 52:
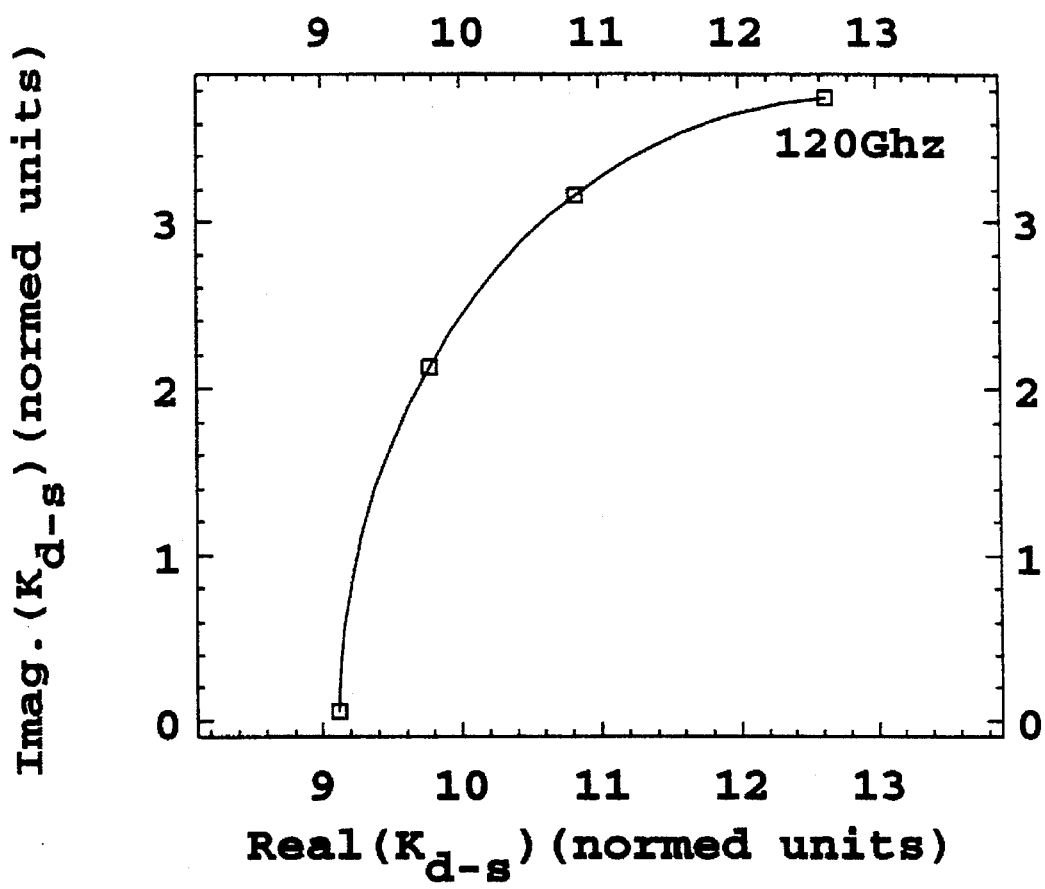
Figure 53:
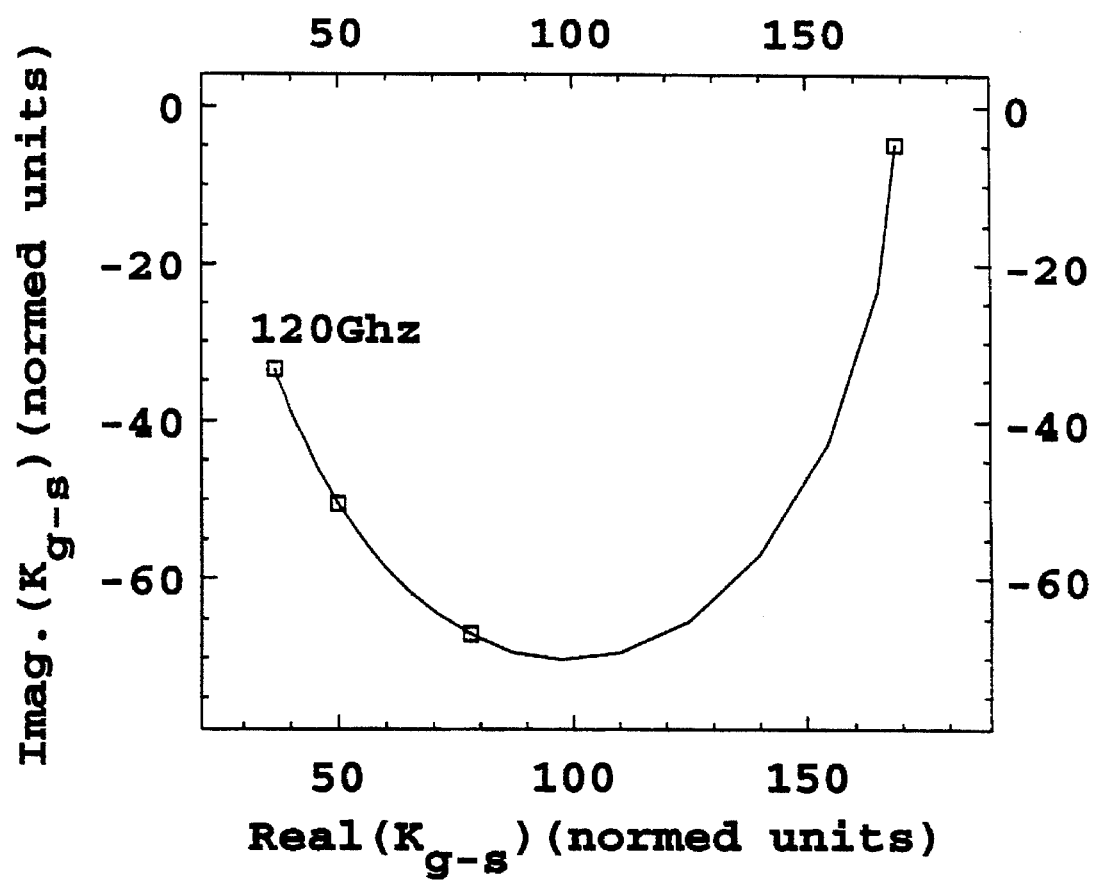
Figure 54:
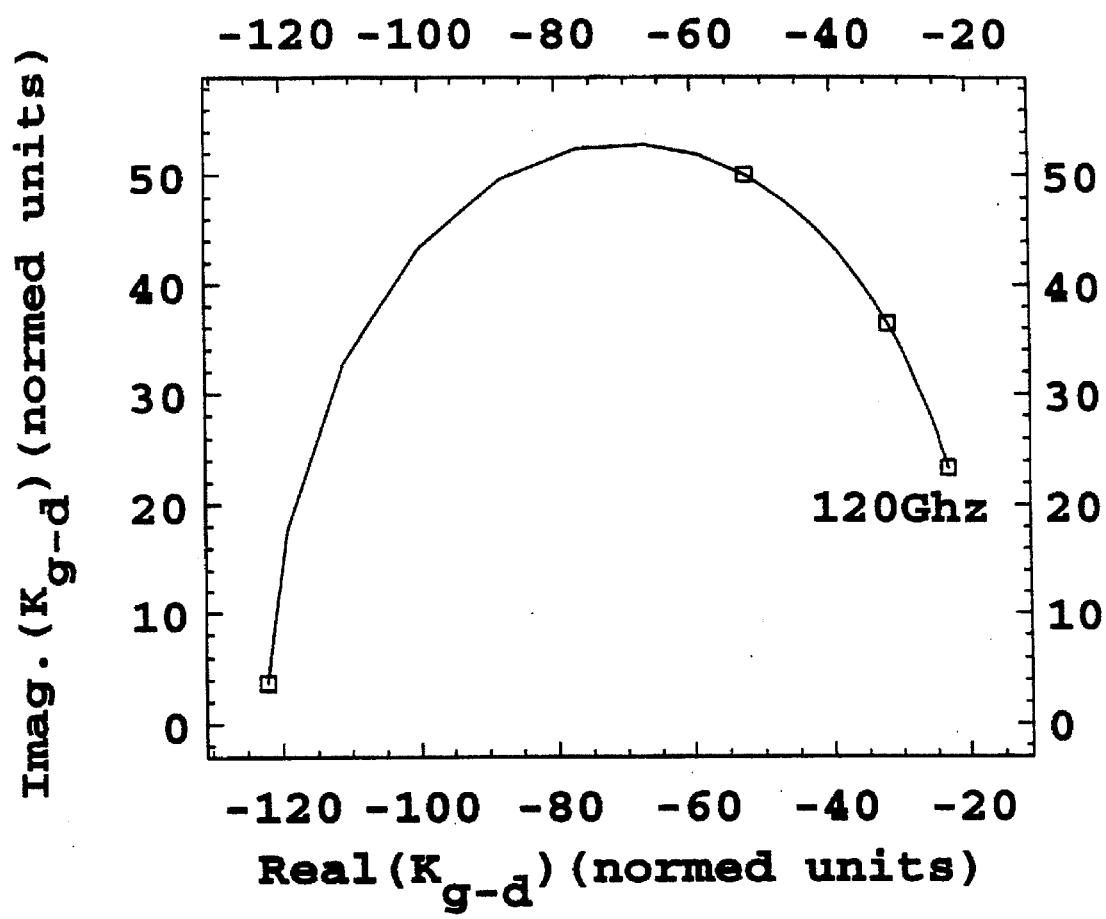
Figure 55:
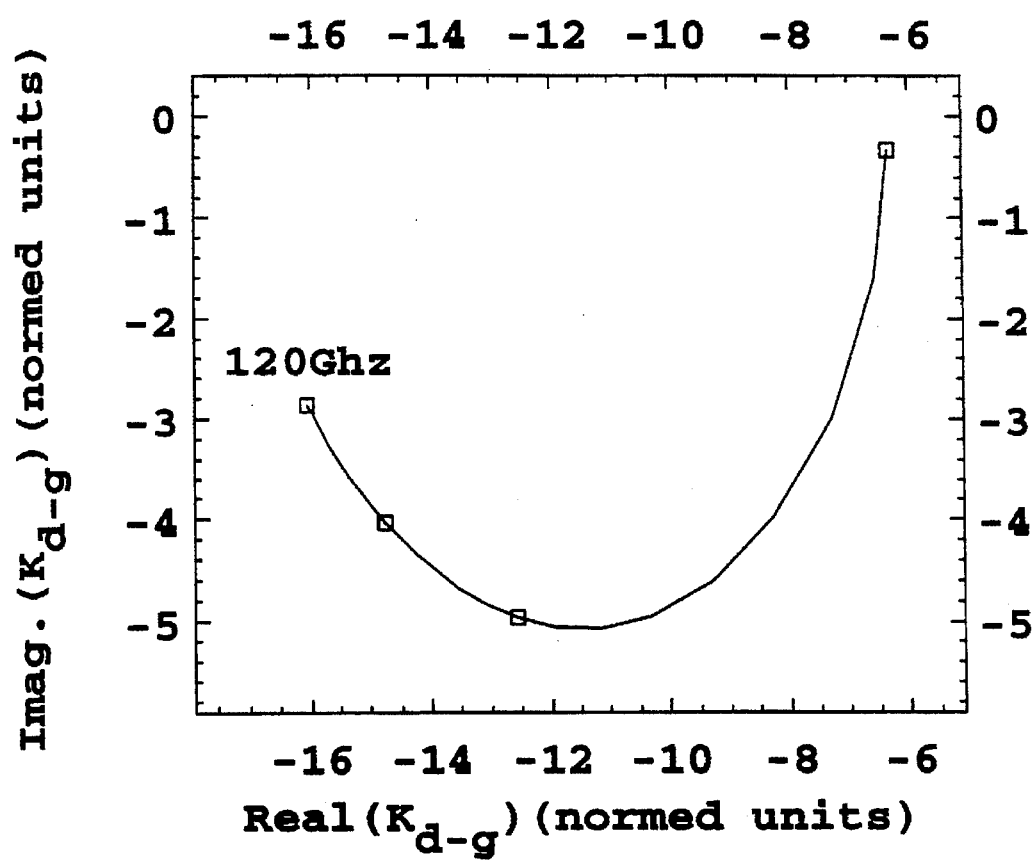
Figure 56:
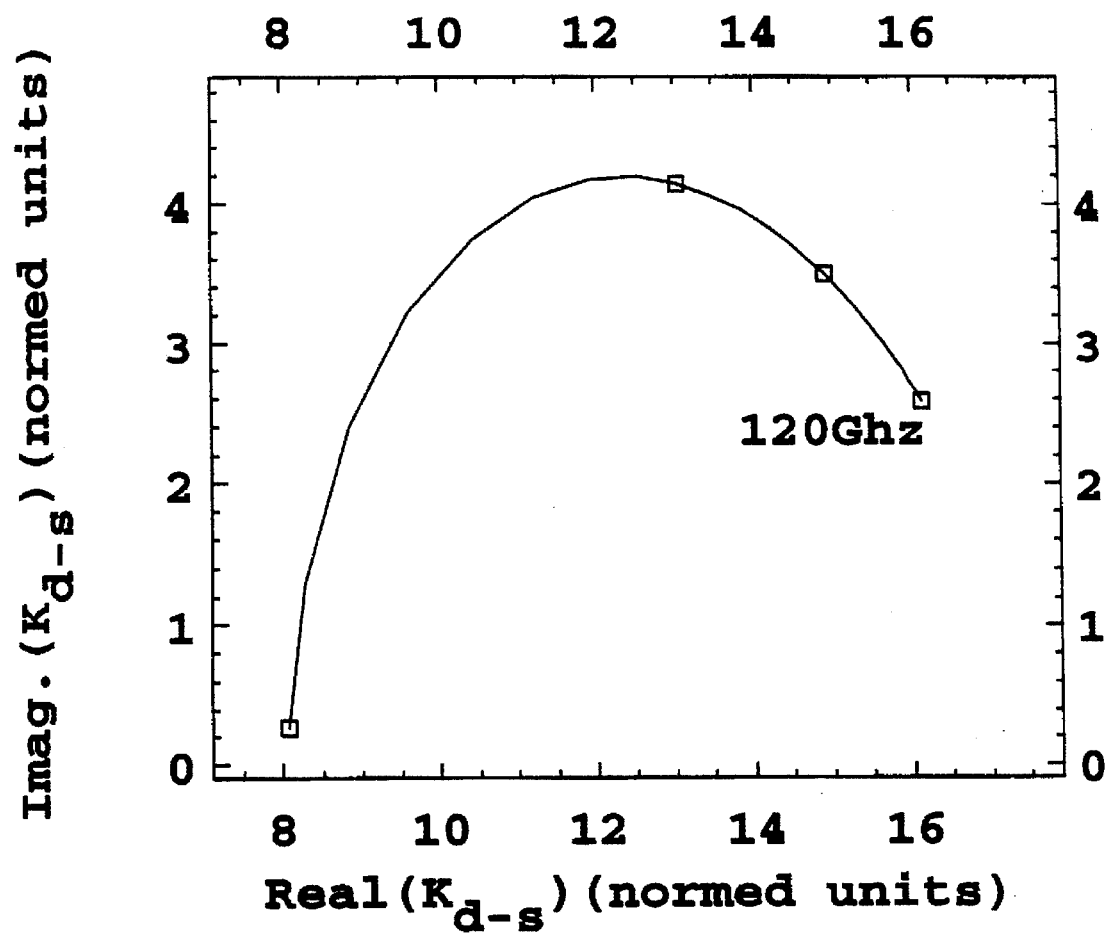
Figure 57:
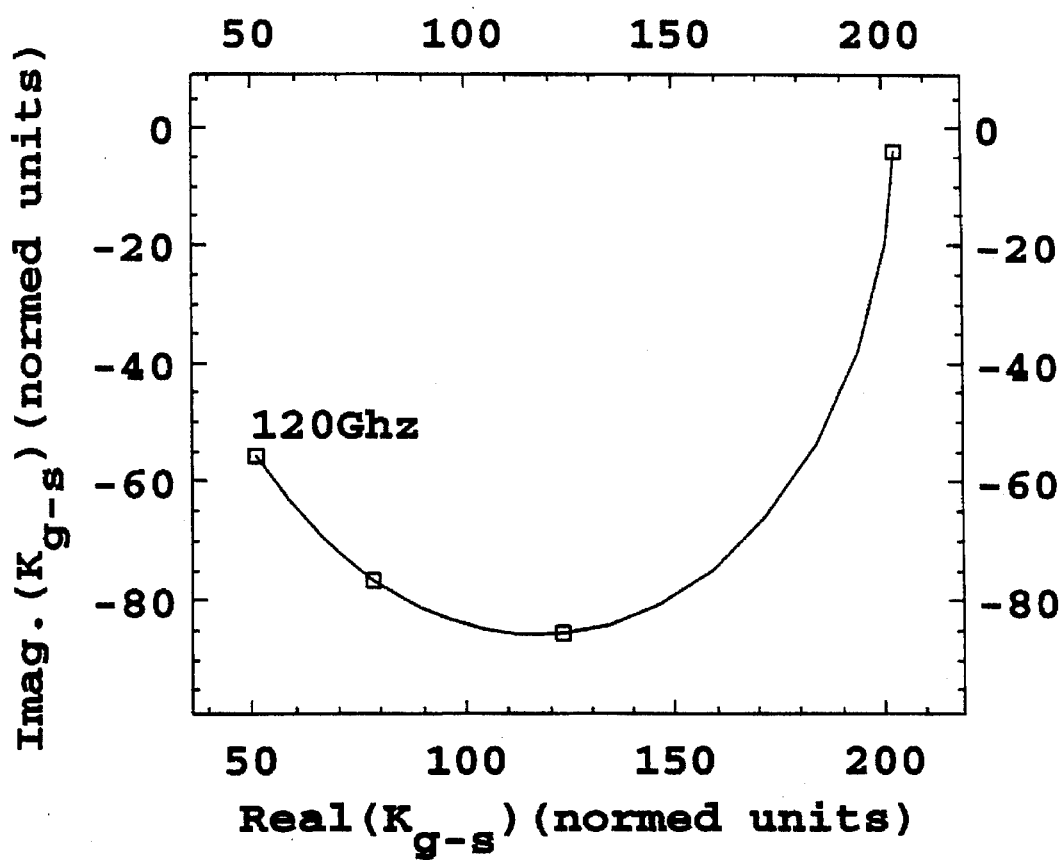
Figure 58:
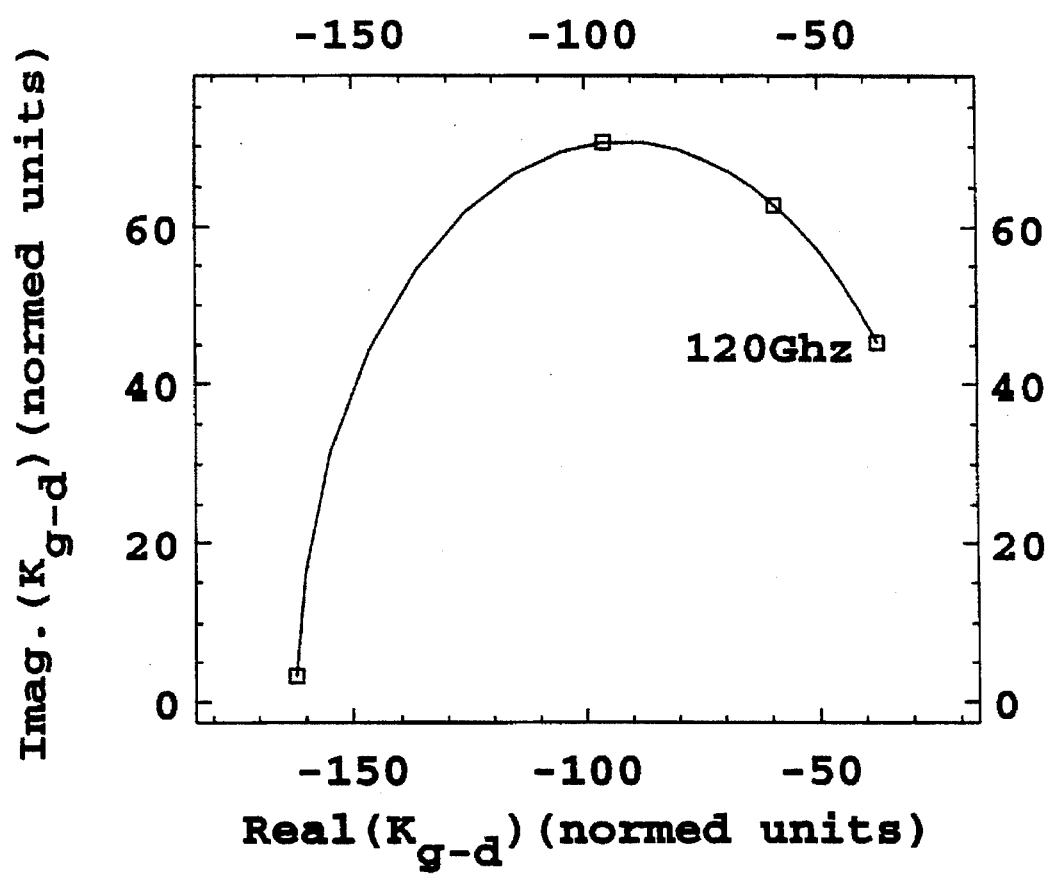
Figure 59:
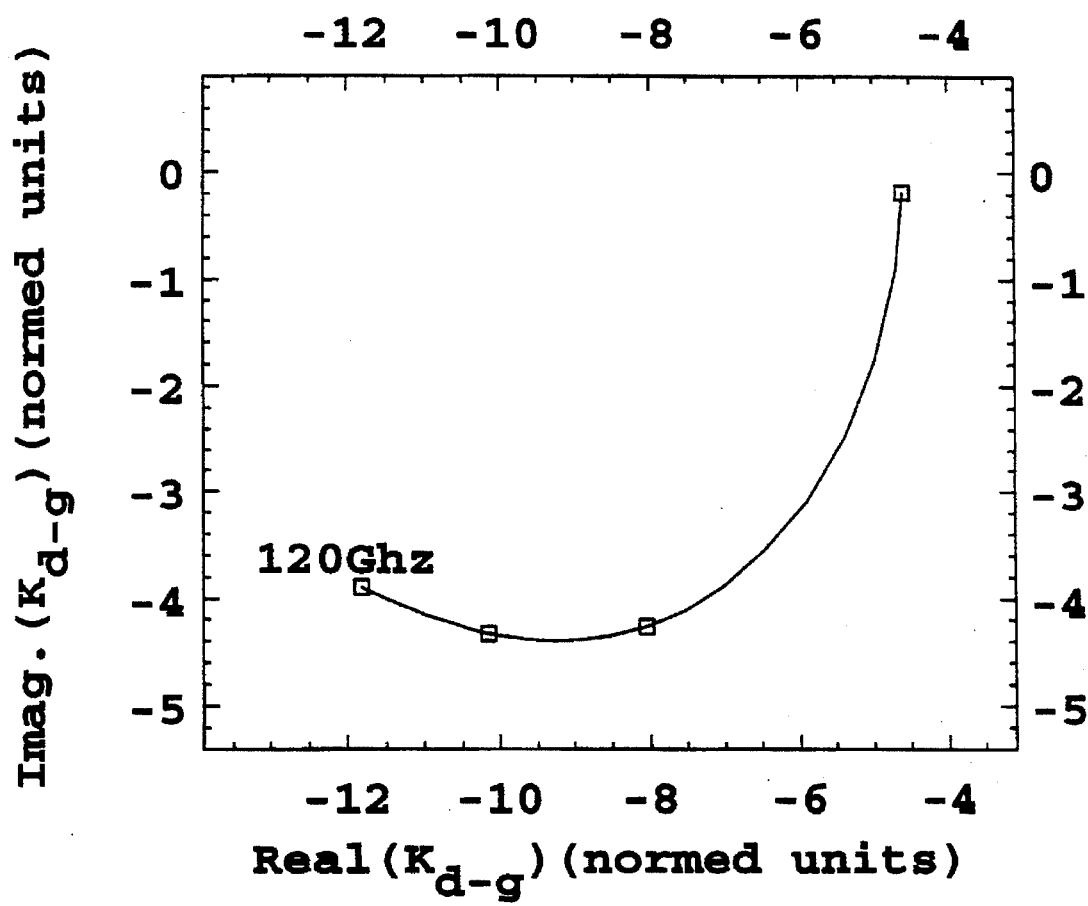
Figure 60:
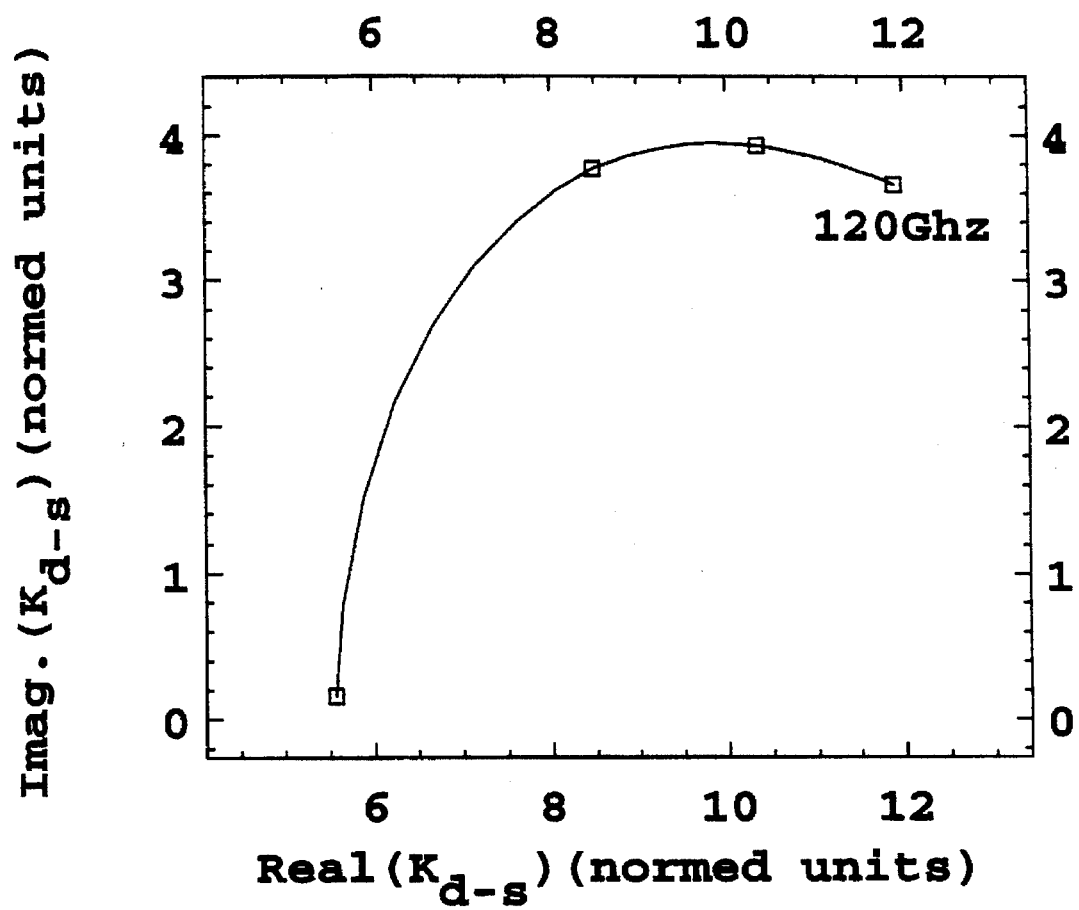
Figure 61:
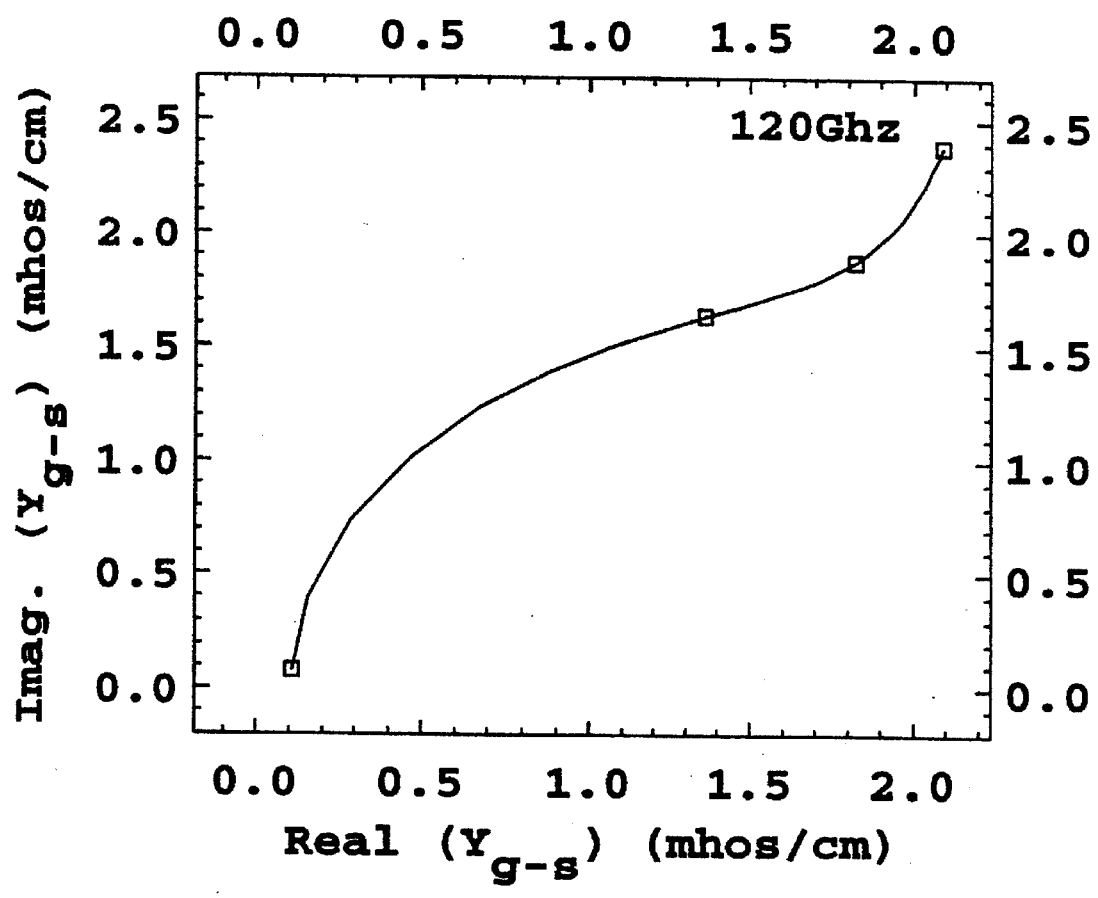
FIGS. 61–72 show the variation in the AC admittance matrix for specific FETs of the present invention in the "reverse" configuration.
Figure 62:
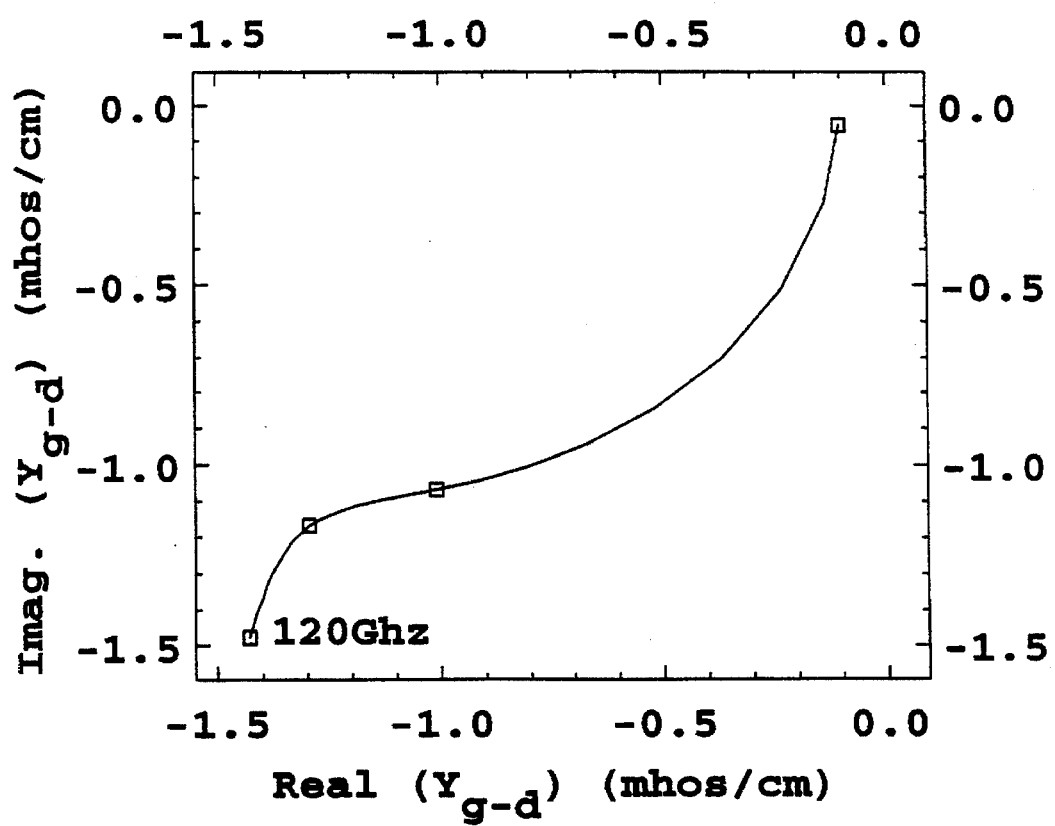
Figure 63:
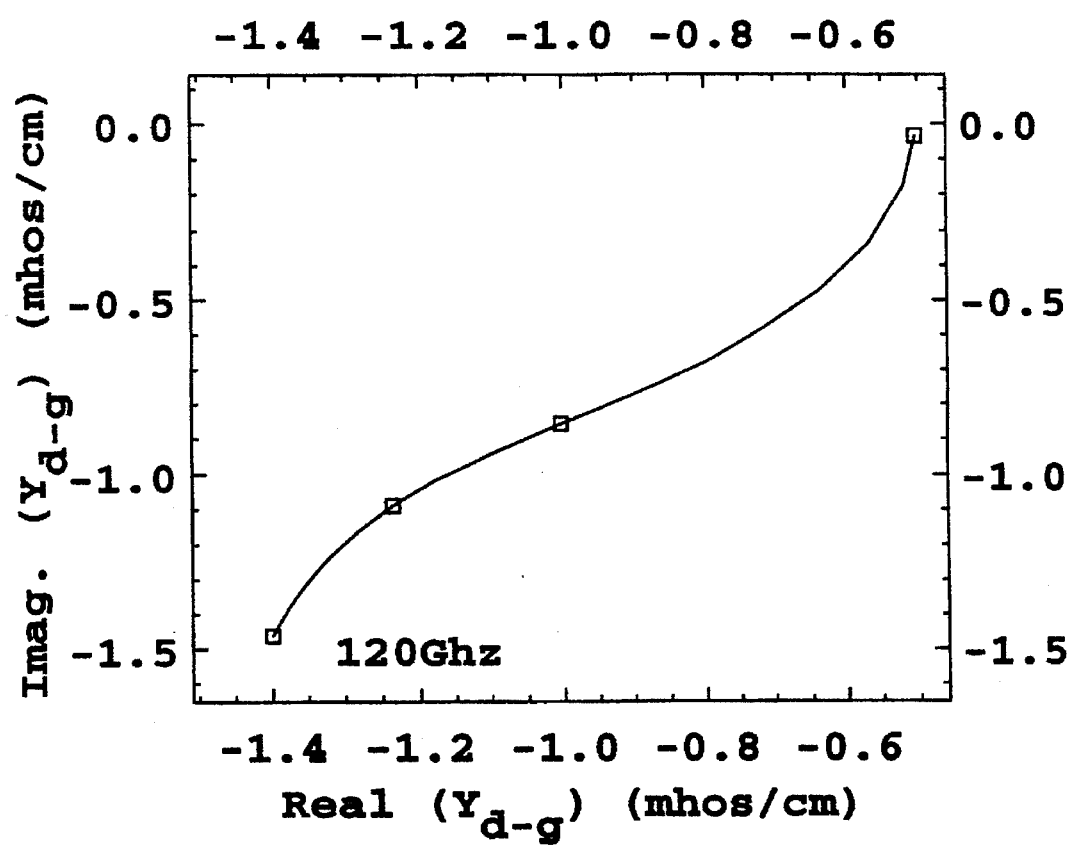
Figure 64:
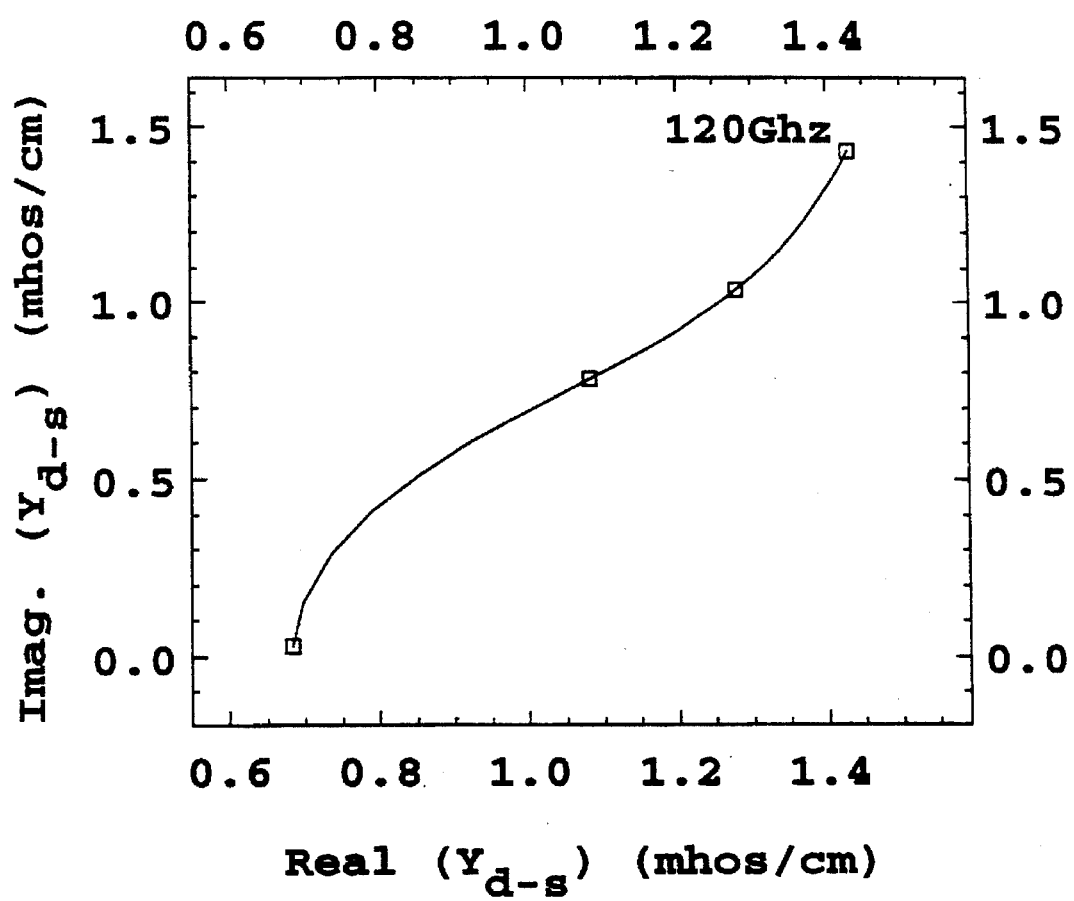
Figure 65:
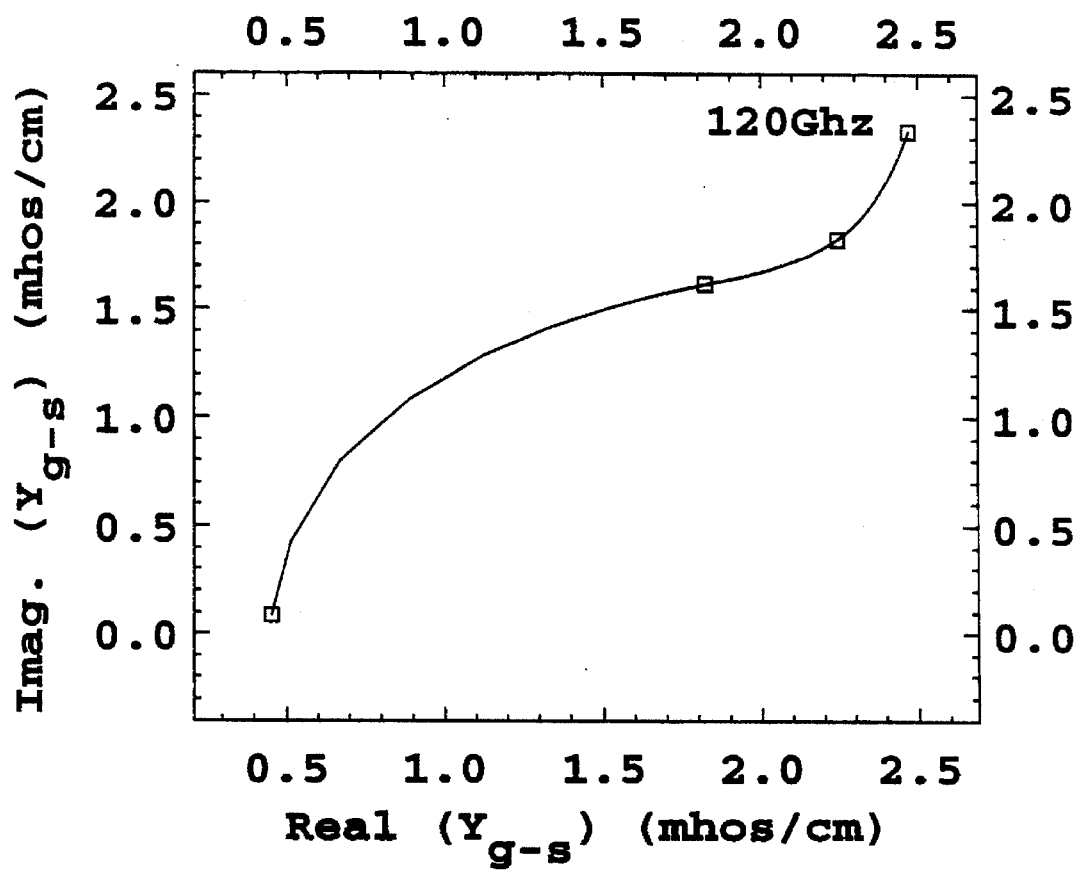
Figure 66:
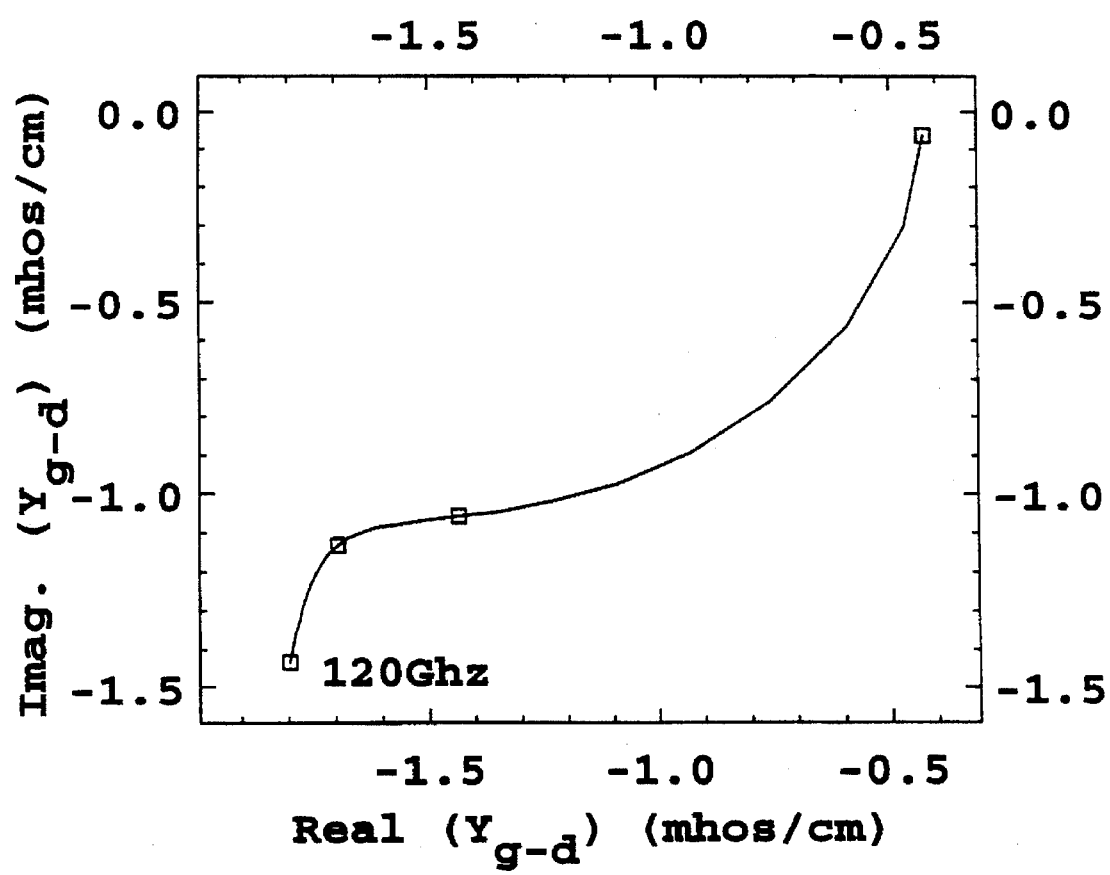
Figure 67:
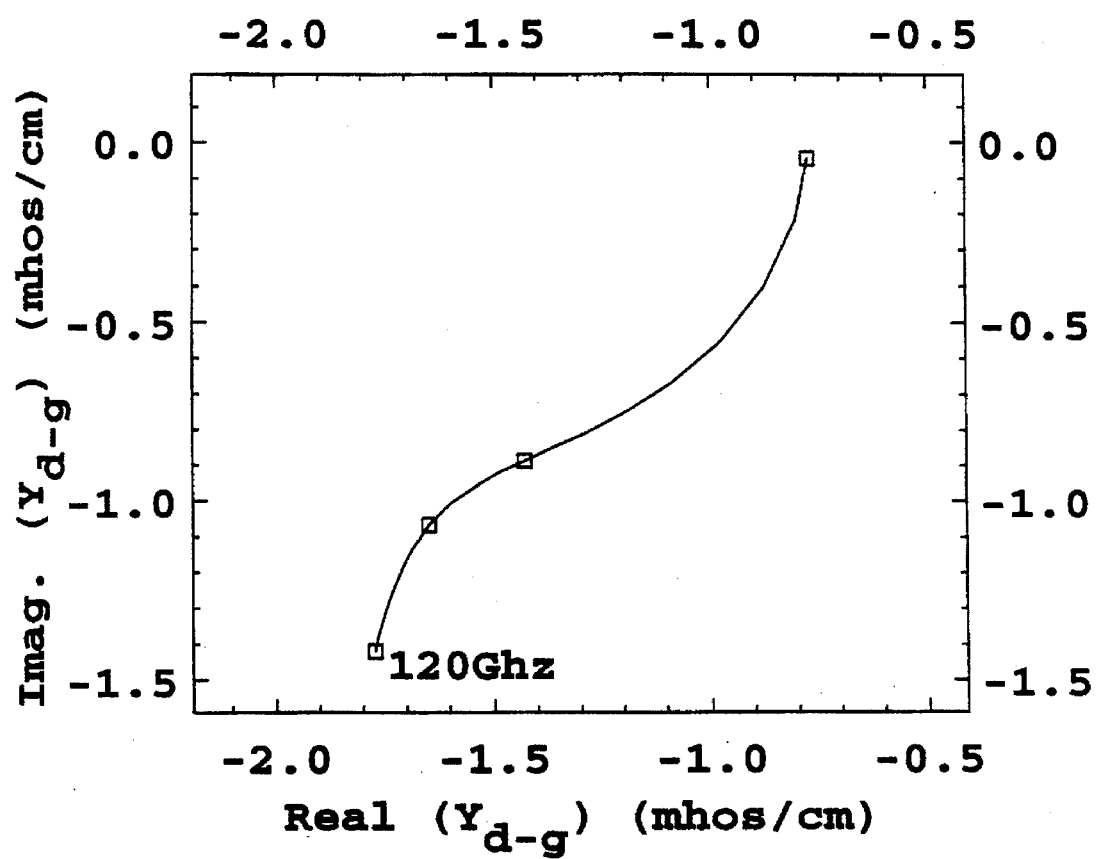
Figure 68:
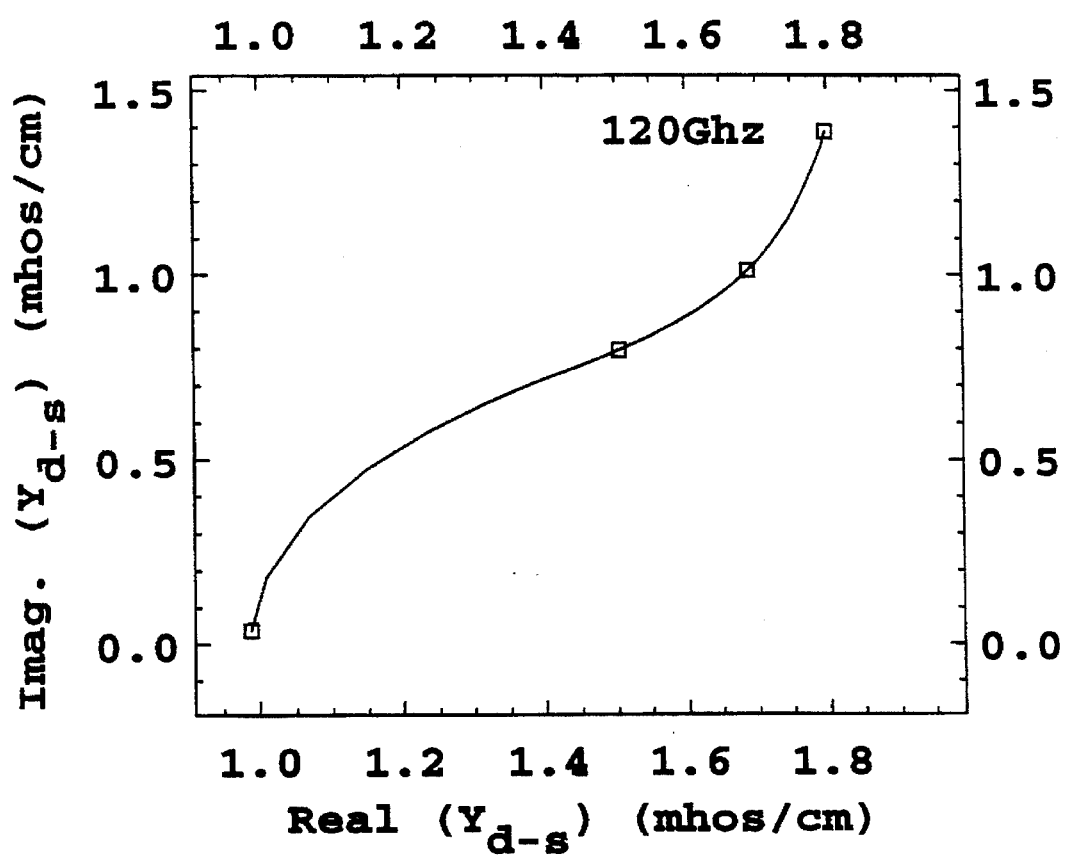
Figure 69:
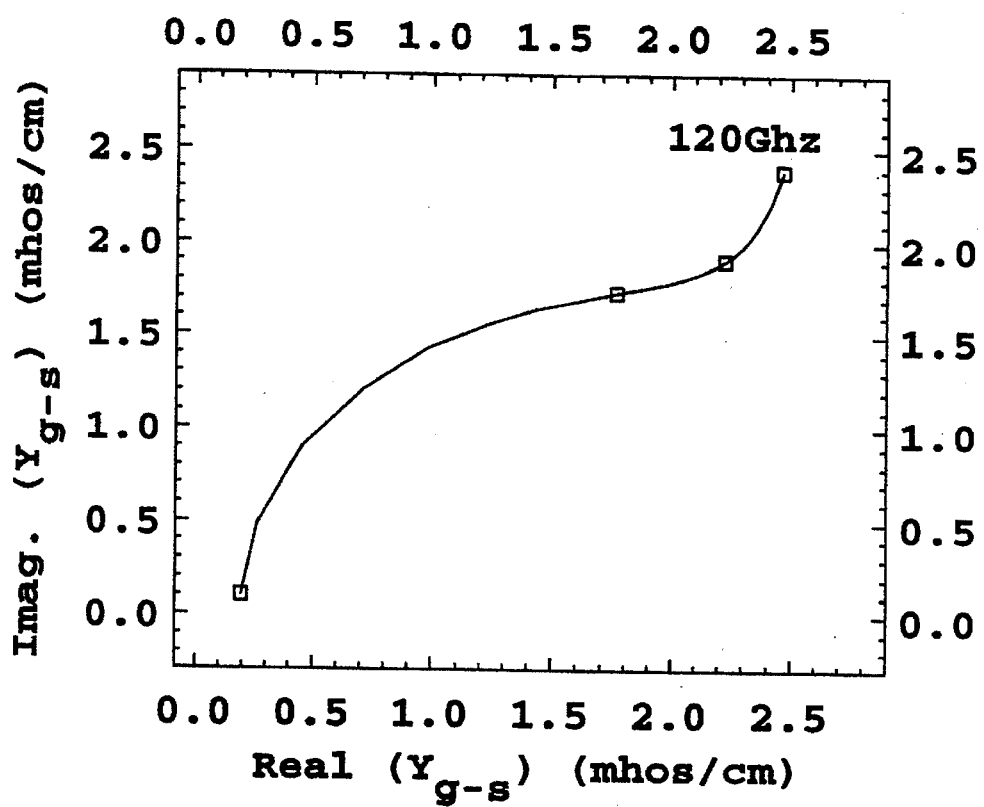
Figure 70:
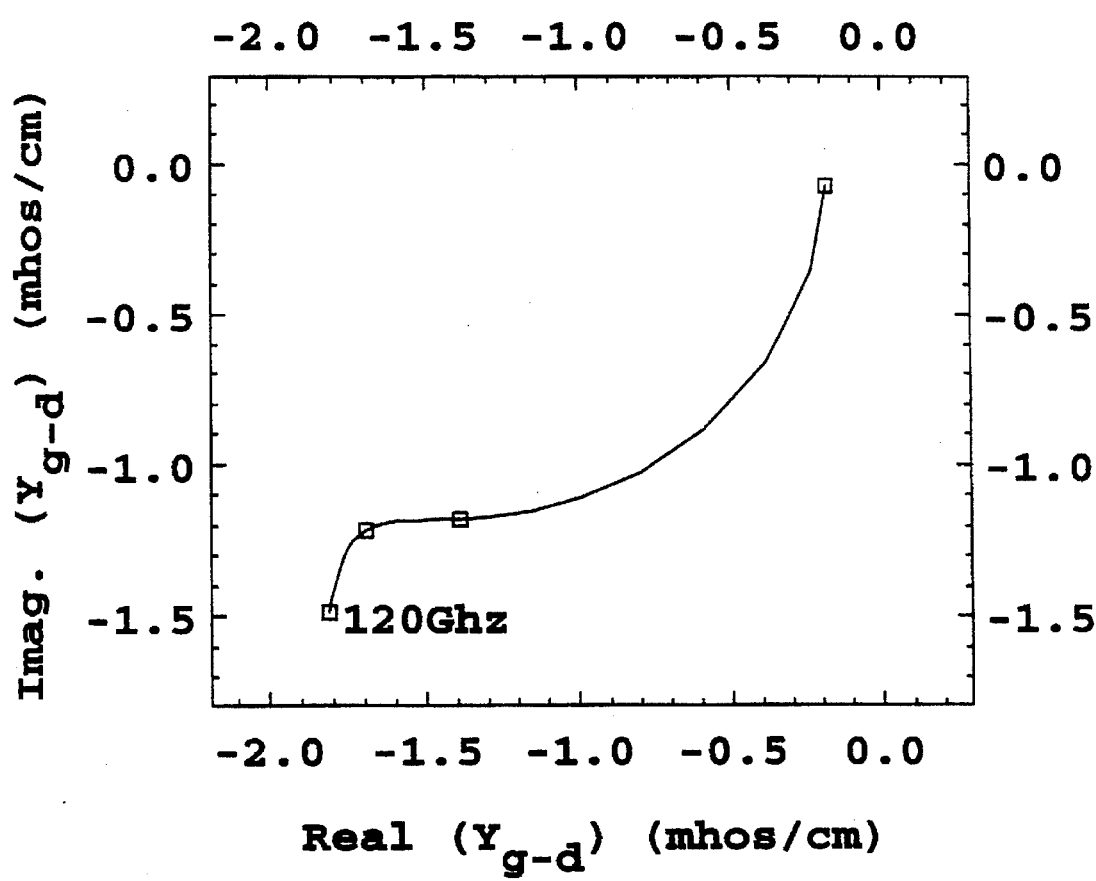
Figure 71:
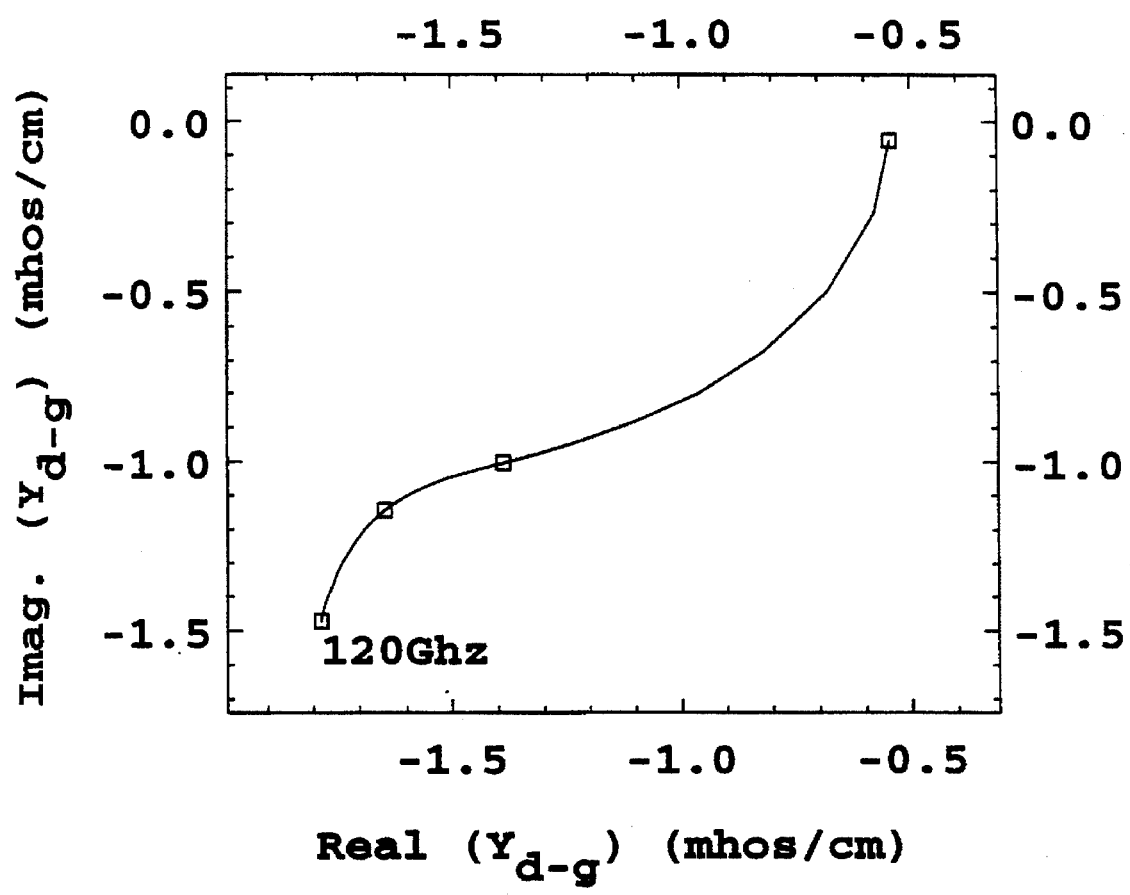
Figure 72:
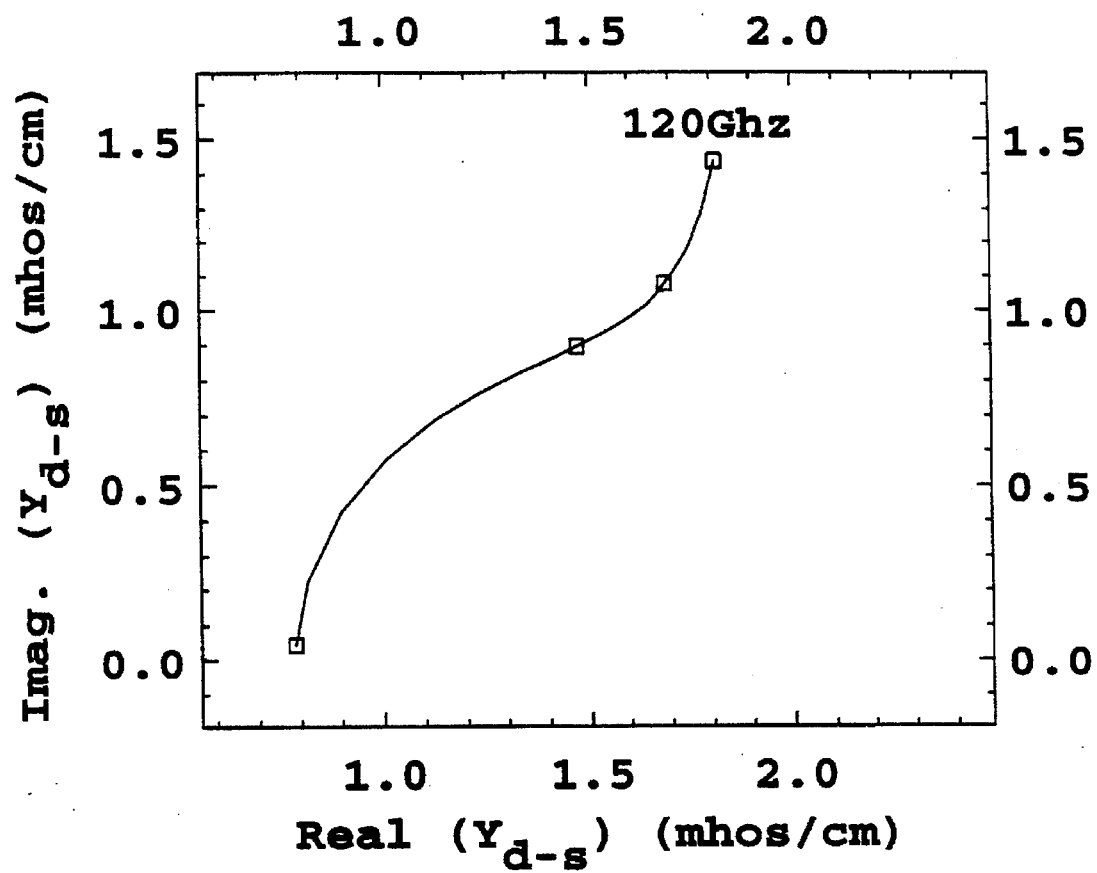
Figure 73:
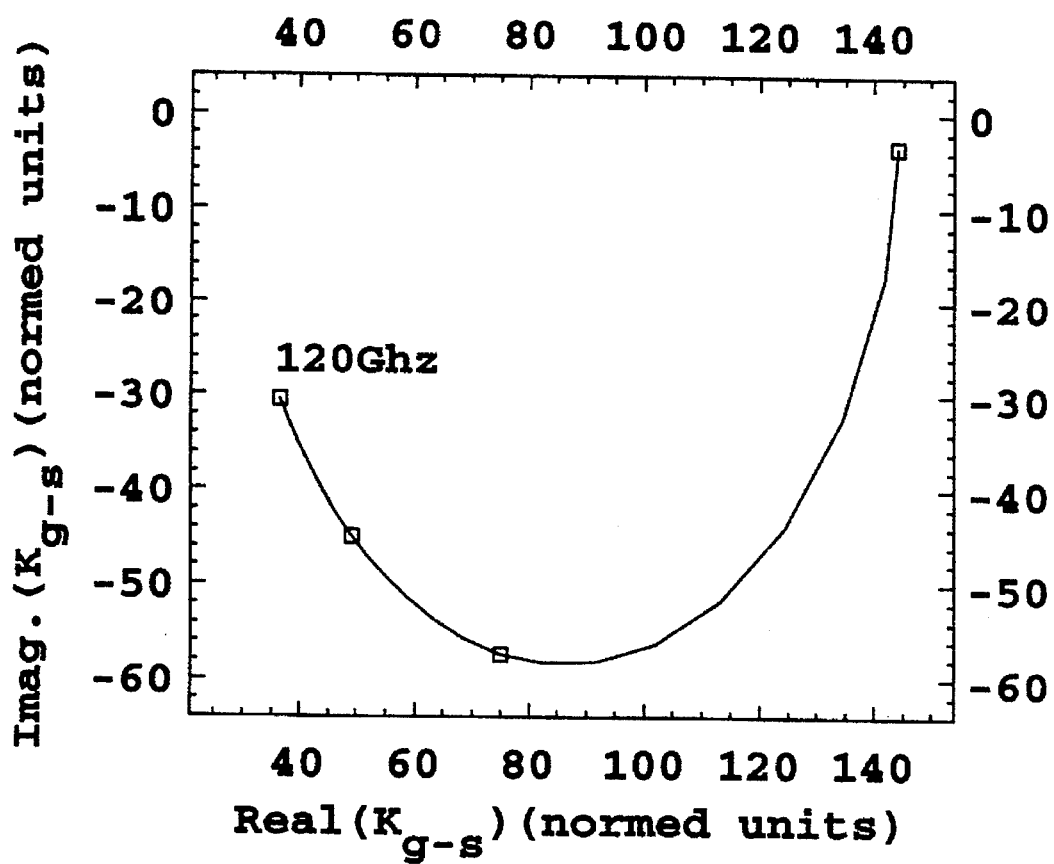
FIGS. 73–84 show the variation in the AC charge matrix for specific FETs of the present invention in the "reverse" configuration.
Figure 74:
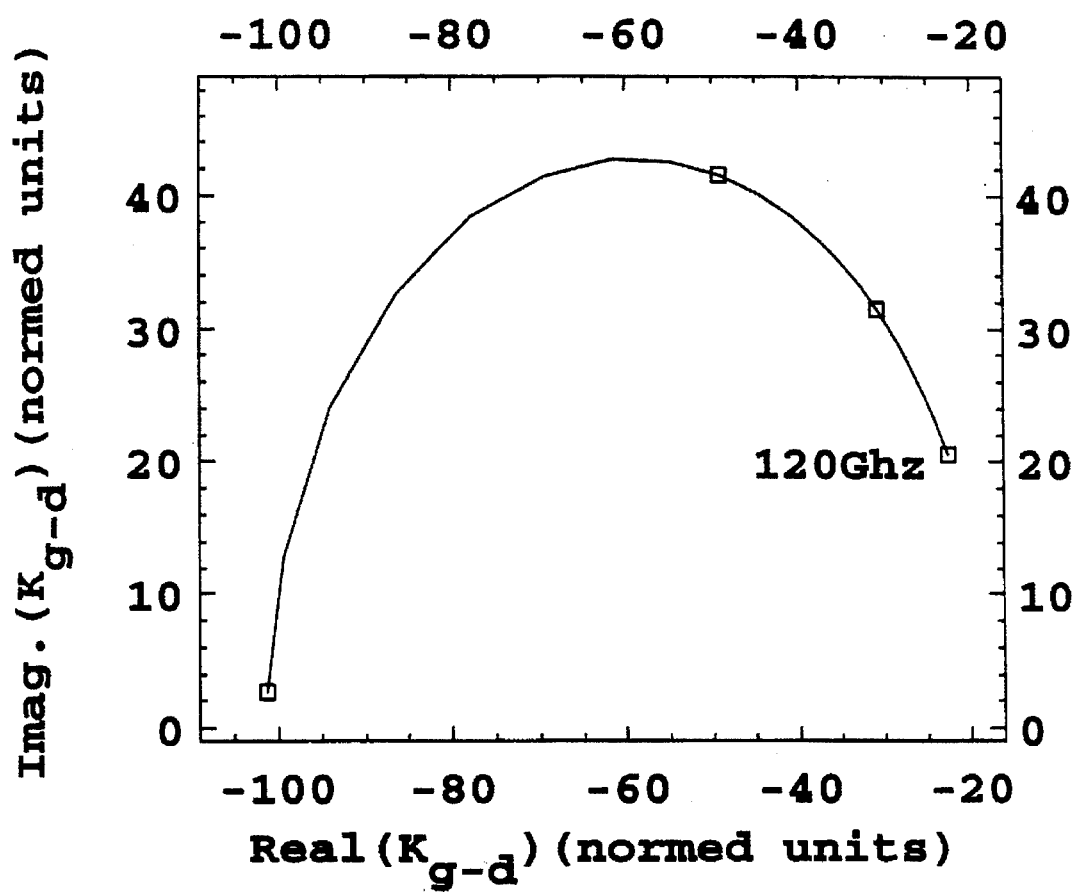
Figure 75:
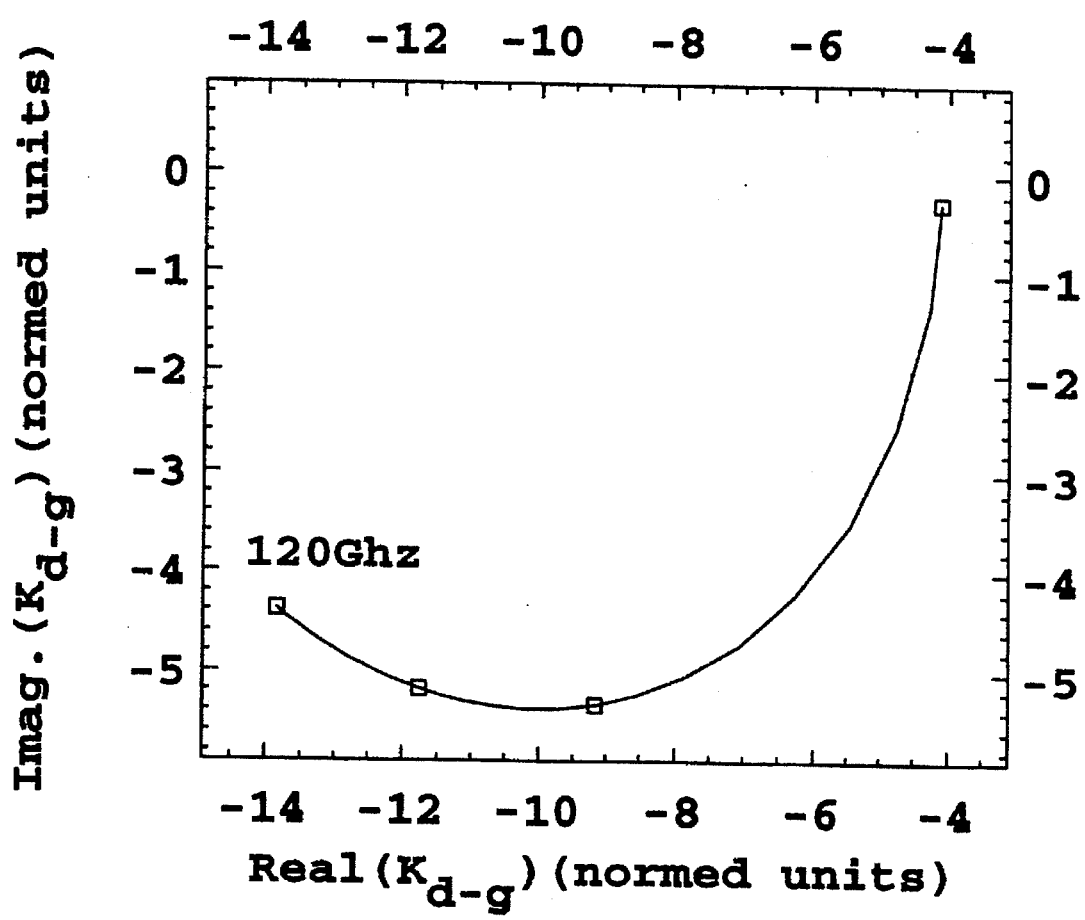
Figure 76:
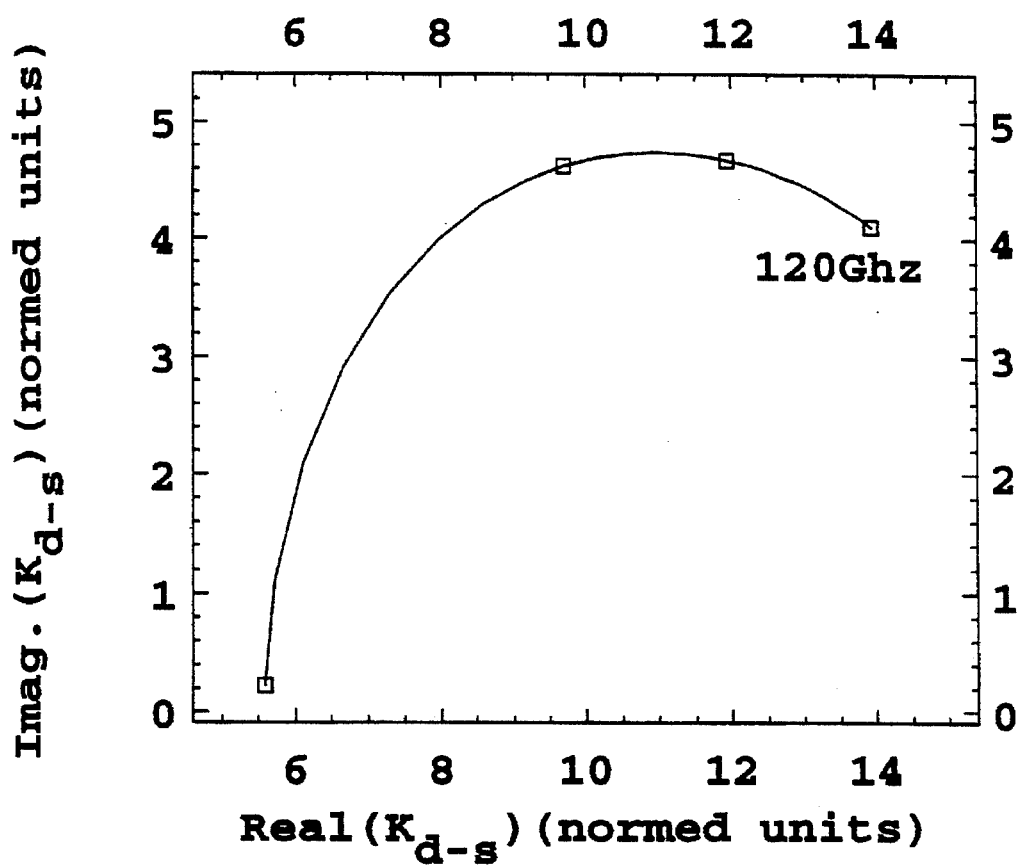
Figure 77:
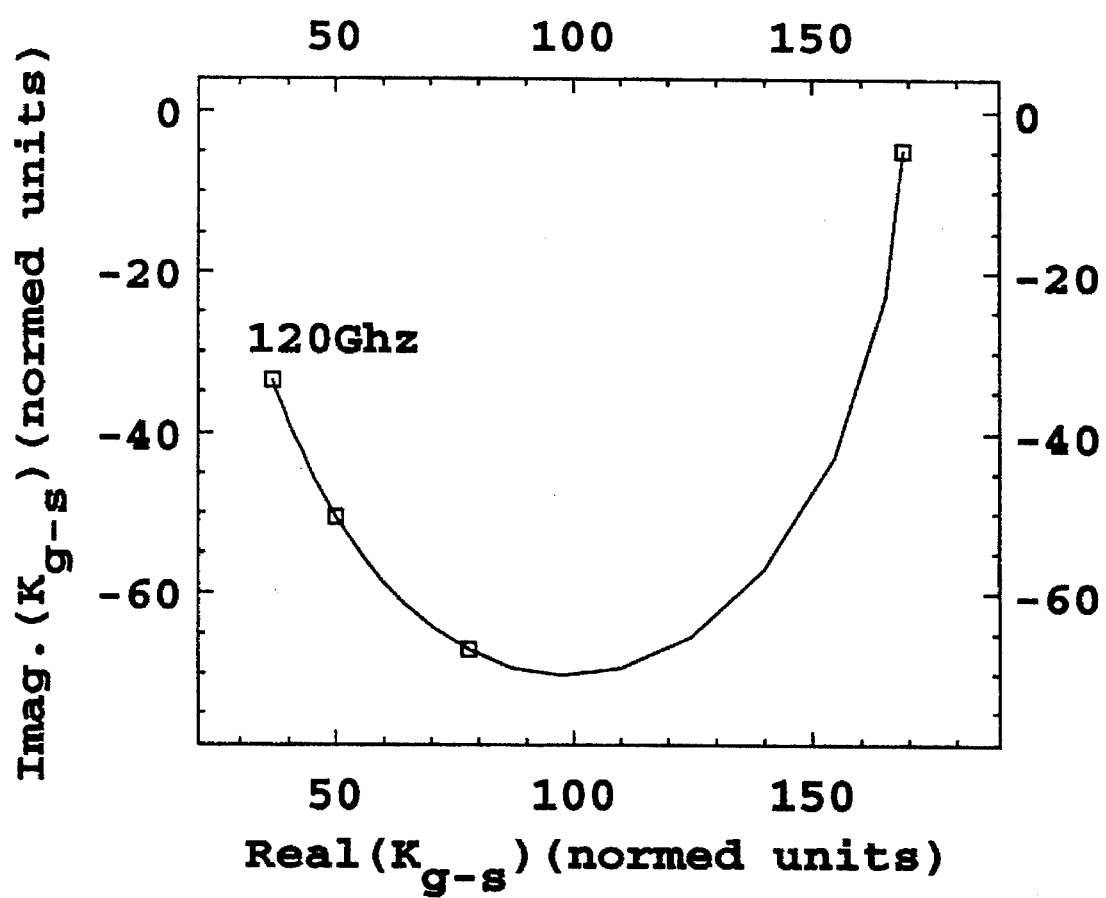
Figure 78:
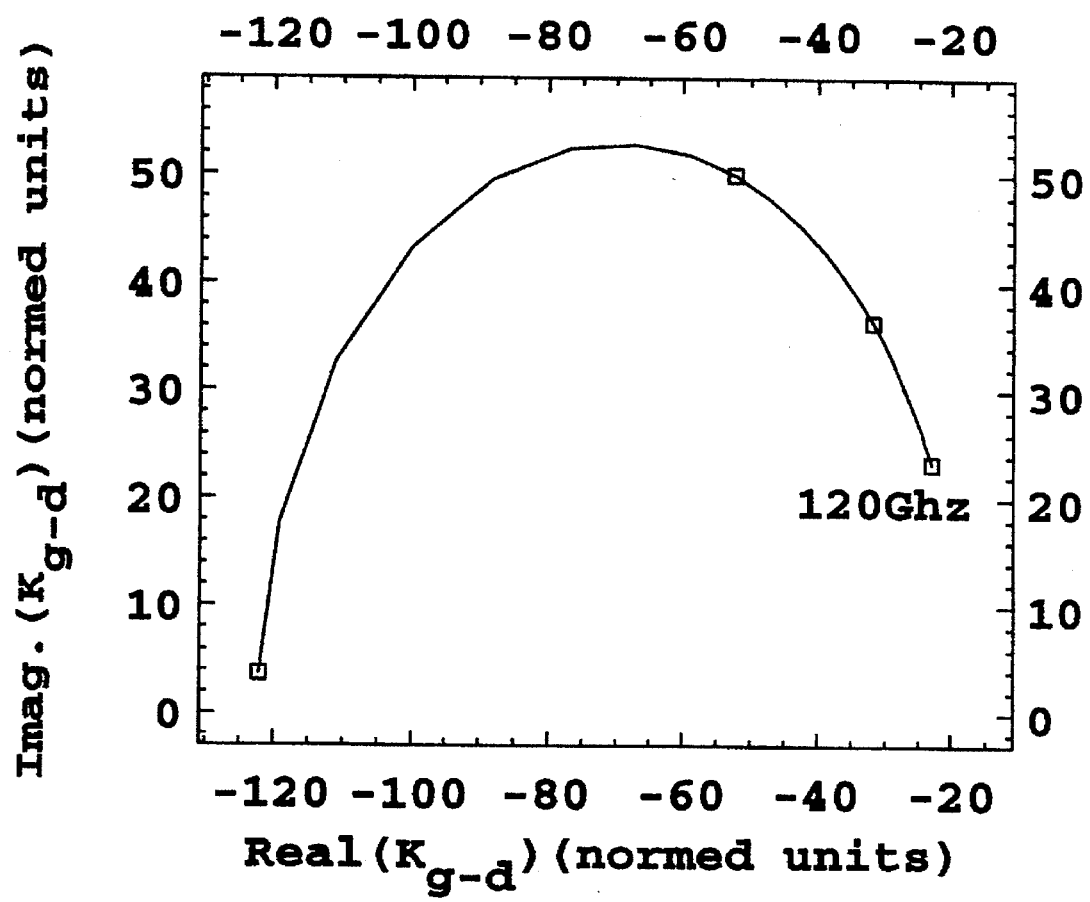
Figure 79:
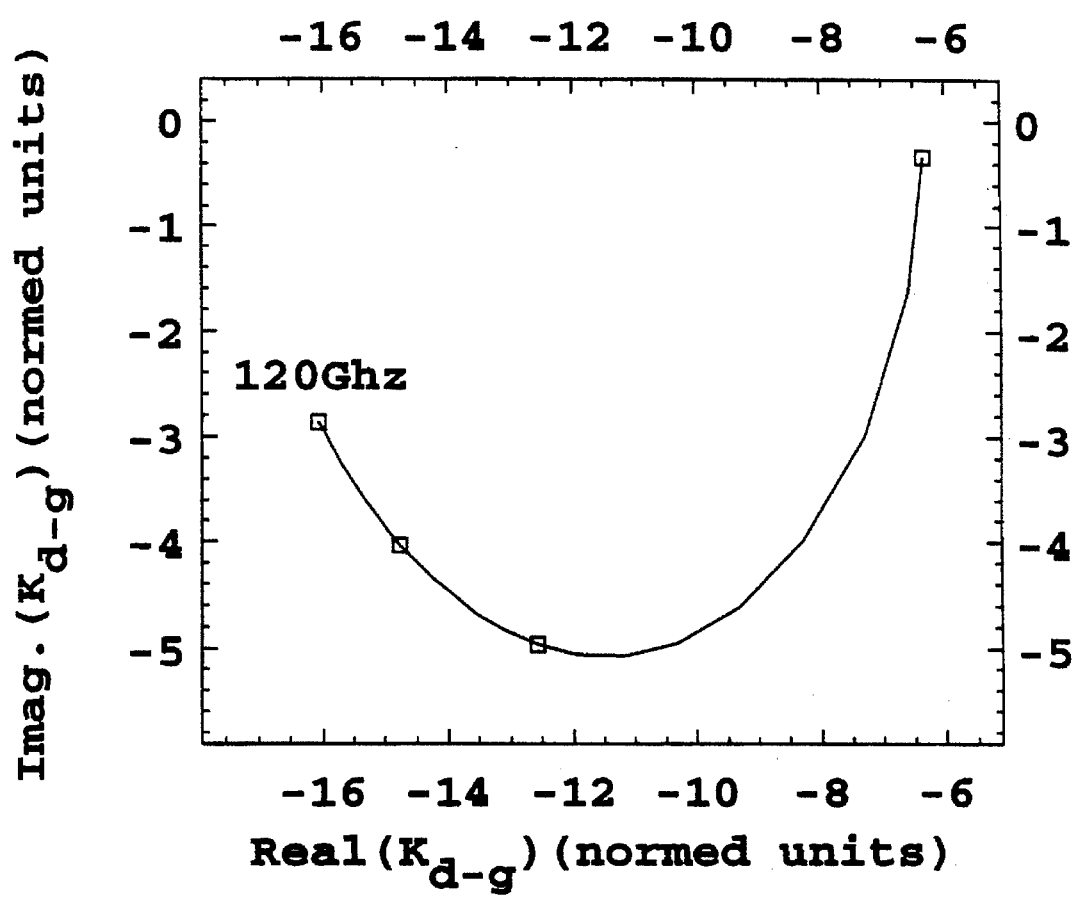
Figure 80:
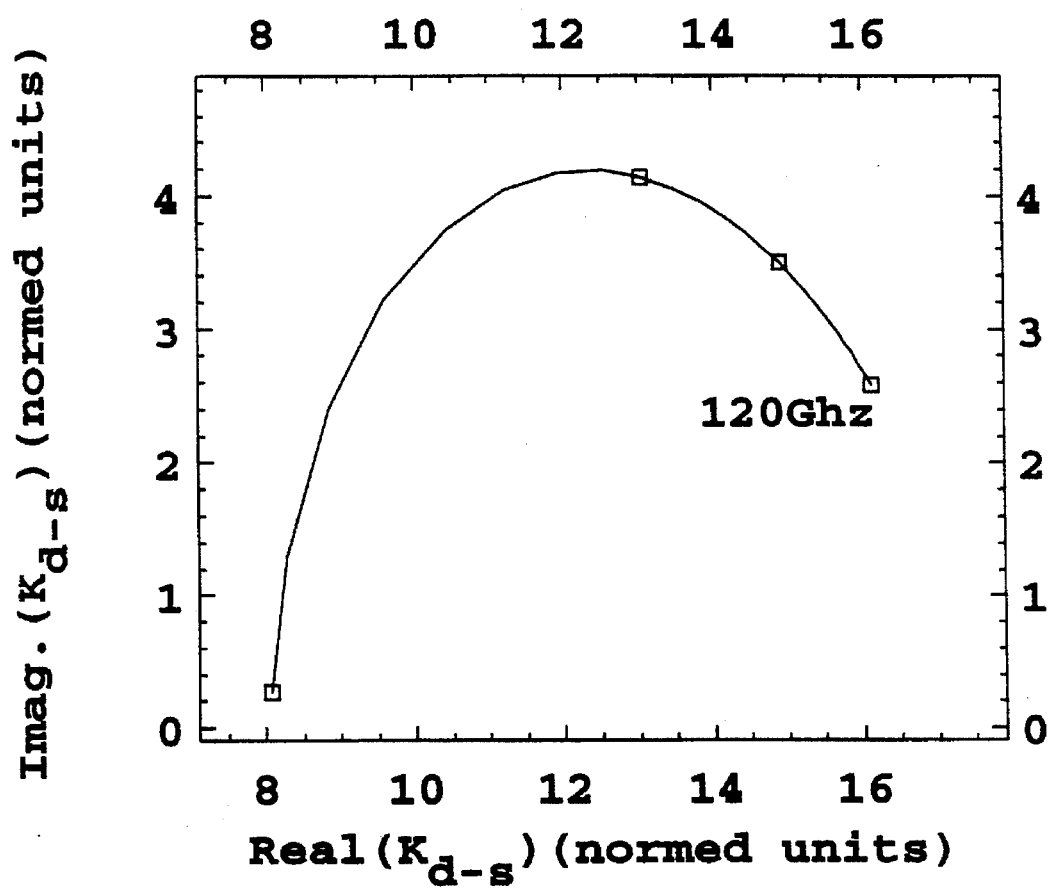
Figure 81:
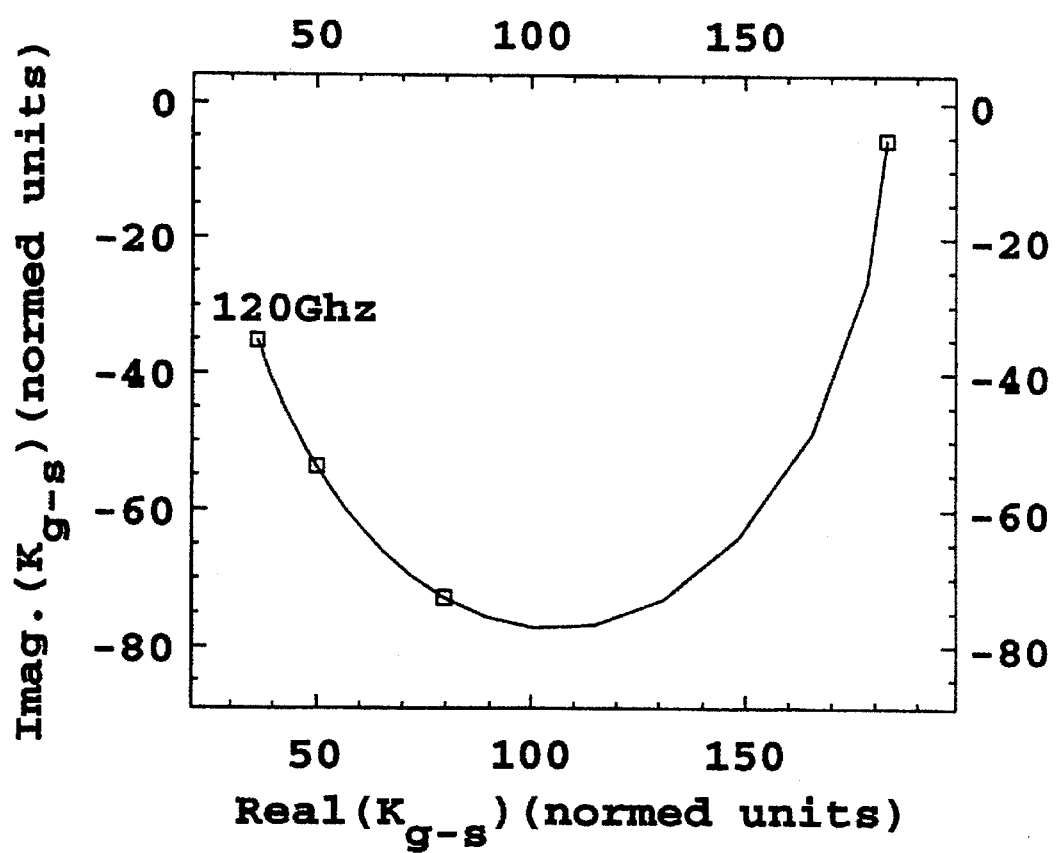
Figure 82:
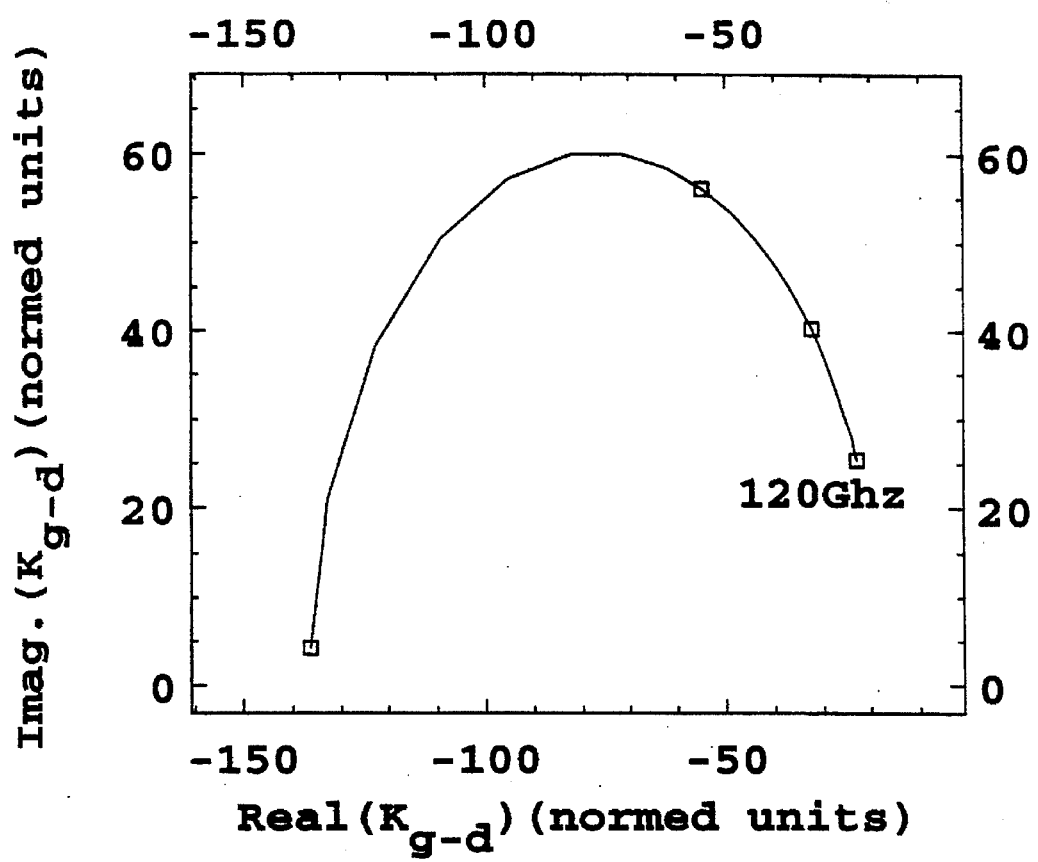
Figure 83:
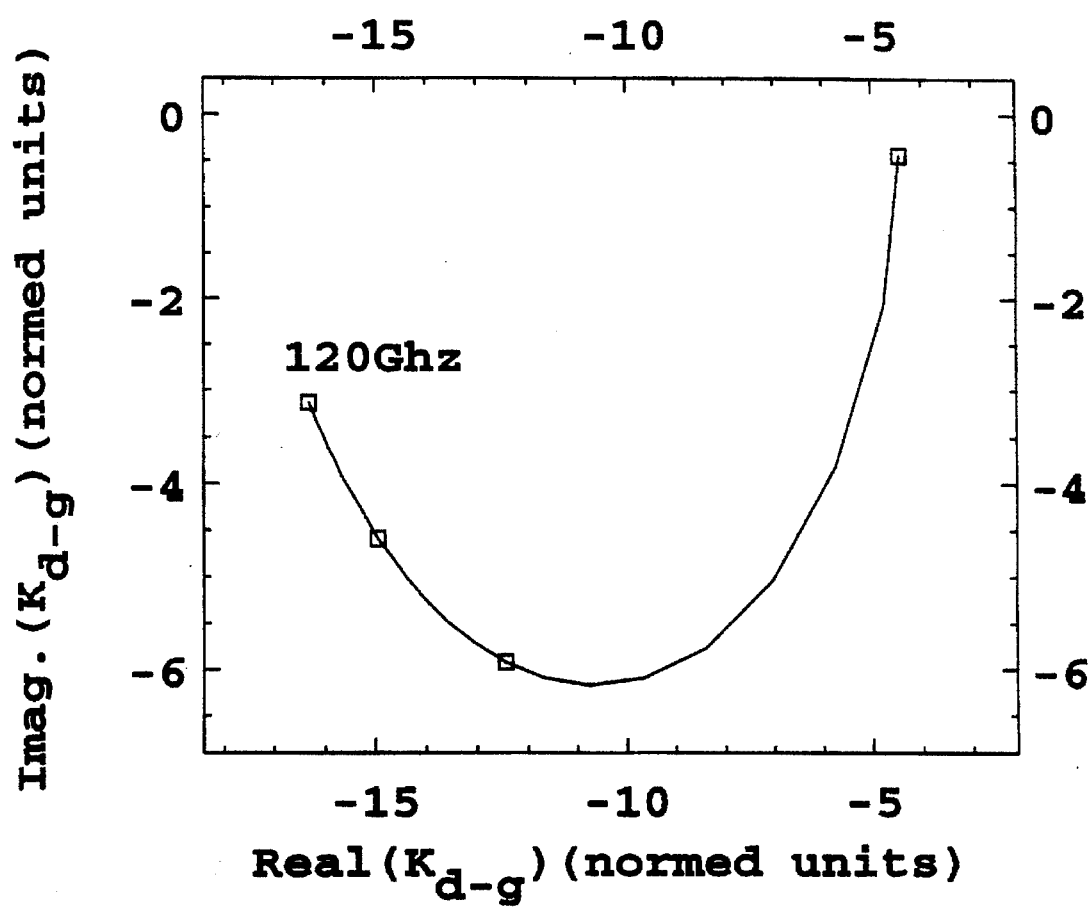
Figure 84:
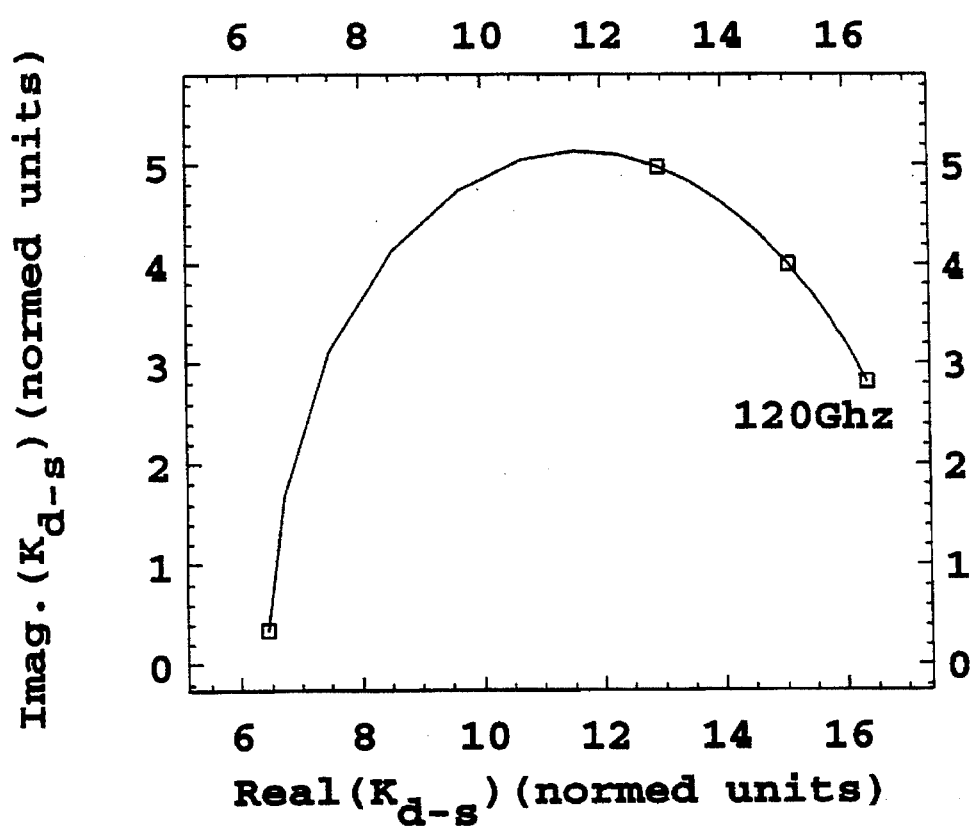

It will be obvious to those of ordinary skill in the art that the AC charge and admittance matrices of FIGS. 13-84, in combination with the series resistance values of Table I and Table II, determine the performance of the TWFET. A different analysis, using transverse electric and magnetic fields, would provide the same results when the same admittance and inductive coupling matrices are obtained and combined with these series resistance values.

While this invention has been explained with reference to the structure disclosed herein, it is not confined to the details set forth and this application is intended to cover any modifications and changes as may come within the scope of the following claims:

Appendix A

The TEM mode for N Coupled Transmission Lines

In this appendix we extend the derivation of R. E. Collin, "The Field Theory of Guided Waves", IEEE Press, New York (1991) for the TEM mode of a single transmission line to derive the transmission line equations for n coupled transmission lines, formed from n+1 perfect conductors:

$$\frac{d}{dz} v = -j\omega L \cdot i \quad (D.1)$$

$$\frac{d}{dz} i = -Y \cdot v$$

where $i$ and $v$ are vectors with components which correspond to the current and voltage on each of n conductors. The (n+1)rst conductor is used as a reference conductor defined to have a potential of zero. L is the inductive coupling matrix, and Y is the admittance coupling matrix defined so that $Y \cdot v$ is the sum of both particle and displacement shunt currents which couple the n transmission lines.

These differential equations can be derived from Maxwell's equations for AC electric and magnetic fields, $\vec{D}$ and $\vec{H}$, which are assumed to have a sinusoidal time dependence:

$$\vec{D} = \vec{D}_0 e^{j\omega t}$$

$$\vec{H} = \vec{H}_0 e^{j\omega t} \quad (D.2)$$

Here $\vec{D}_0$ and $\vec{H}_0$ are complex phasor vector quantities.

With this notation, we can write Maxwell's equations for these fields assuming a homogeneous media with conductivity, $\sigma$, dielectric constant, $\epsilon$, and free space magnetic permeability, $\mu_0$:

$$\vec{\nabla}\cdot\vec{D}=0$$

$$\vec{\nabla}\cdot\vec{H}=0$$

$$\vec{\nabla}\times\vec{D}=-j\omega\epsilon\mu_0\vec{H} \quad (D.3)$$

$$\vec{\nabla}\times\vec{H}=\left(\frac{\sigma}{\epsilon}+j\omega\right)\vec{D}$$

It is then straightforward to derive the following results for transverse fields $\vec{H}_t$ and $\vec{D}_t$ from Maxwell's equations when a propagating TEM mode is assumed:

$$\vec{\nabla}_t\cdot\vec{H}_t=0,\ \vec{\nabla}_t\cdot\vec{D}_t=0$$

$$\vec{\nabla}_t\times\vec{H}_t=0,\ \vec{\nabla}_t\times\vec{D}_t=0$$

$$-j\omega\epsilon\mu_0\vec{H}_t=\hat{z}\times\frac{d}{dz}\vec{D}_t \quad (D.4)$$

$$\left(\frac{\sigma}{\epsilon}+j\omega\right)\vec{D}_t=\hat{z}\times\frac{d}{dz}\vec{H}_t$$

$$-\nabla^2\vec{H}=-\tilde{k}^2\vec{H},\ -\nabla^2\vec{D}=-\tilde{k}^2\vec{D}$$

where $$\tilde{k}^2=\omega^2\mu_0\epsilon\left(1-\frac{j\sigma}{\omega\epsilon}\right) \quad (D.5)$$

The results for the divergence of $\vec{H}_t$ and $\vec{D}_t$ follow directly from the divergence equations of Maxwell, using the TEM assumption of no $\hat{z}$ component for $\vec{D}$ and $\vec{H}$. Similarly, the results for the curl of $\vec{D}_t$ and $\vec{H}_t$ and the results for the cross product of $\hat{z}$ with these vector fields arise from Maxwell's equations for the curl of $\vec{H}$ and $\vec{D}$. Finally, the equations in $\nabla^2\vec{H}$ and $\nabla^2\vec{D}$ follow from taking the curl of both sides of Maxwell's curl equations for $\vec{H}$ and $\vec{D}$ and noting the divergence of $\vec{H}$ and $\vec{D}$ are zero.

This last pair of relationships determines the value of the propagation constant of a TEM mode. If we assume that the propagating fields for this mode have the form $$\vec{D}_t=\vec{D}_{t0}e^{j\omega t-\gamma z}$$

$$\vec{H}_t=\vec{H}_{t0}e^{j\omega t-\gamma z} \quad (D.6)$$

then the preceding results for $\nabla^2\vec{H}$ and $\nabla^2\vec{D}$ determine $\gamma$:

$$\gamma=j\omega(\epsilon\mu_0)^{1/2}\left(1-\frac{j\sigma}{\omega\epsilon}\right)^{1/2} \quad (D.7)$$

The zero curl result for the transverse electric field allows the definition of a potential in the transverse plane. If the reference potential is assigned to the (n+1)rst conductor referred to as the 0th conductor, the potential of the jth conductor of the remaining n conductors is given by:

$$V_j = -\left(\frac{1}{\epsilon}\right)\int_{S_0}^{S_j}\vec{D}_0 e^{j\omega t-\gamma z}\cdot\vec{dl} \quad (D.8)$$

$$= V_{0j}e^{j\omega t-\gamma z}$$

where $S_0$ and $S_j$ are the surfaces of the 0th reference conductor and the jth conductor, respectively, and the integral is taken along any path in a given transverse plane from a point on $S_0$ to a point on $S_j$. The propagating TEM mode thus has a corresponding propagating voltage eigenvector with components $V_{0j}$, as defined above.

The transverse electric field associates a propagating charge vector with this propagating voltage vector. At the surface of any of the n+1 perfect conductors, the transverse electric field must have a purely normal component which decreases to zero just inside the conductor. Consequently this component of the field can be used to calculate the surface charge on the jth conductor, $\rho_j(z,t)$:

$$|\vec{D}_t| = \hat{n}\cdot\vec{D}_t \quad (D.9)$$

$$= \tilde{\rho}_j = \tilde{\rho}_{0j}e^{j\omega t-\gamma z}$$

The transverse electric field at the surface of the jth conductor can also be used to calculate the transverse magnetic field at this surface. The TEM mode results of Equation (D.4) give:

$$-j\omega\mu_0\epsilon\vec{H}_t=-\gamma(\hat{z}\times\vec{D}_t) \quad (D.10)$$

Thus we have:

$$\vec{H}_t = \left(\frac{1}{\eta}\right)(\hat{z}\times\vec{D}_t) \quad (D.11)$$

$$= \left(\frac{1}{\eta}\right)(\hat{z}\times\hat{n})\tilde{\rho}_{0j}e^{j\omega t-\gamma z}$$

where $\eta$ is given by the ratio, $$((j\omega\mu_0\epsilon)/\gamma).$$

The direction of $\vec{H}_t$ can be seen to be tangential to the surface in the transverse plane because it must be perpendicular to both $\hat{z}$ and $\hat{n}$.

The surface current on the perfect conductor can be obtained from this tangential magnetic field at the conductor surface:

$$\vec{J}_{surf} = \hat{n}\times\vec{H}_t \quad (D.12)$$

$$= \left(\left(\frac{\tilde{\rho}_{0j}}{\eta}\right)e^{j\omega t-\gamma z}\right)\hat{z}$$

The surface charge and surface current give corresponding total charge on the jth conductor, $Q_j$, and total $\hat{z}$-current on the jth conductor, $\vec{I}_j$:

$$Q_j(z,t) = \oint_{S_j}\tilde{\rho}_j dl = e^{j\omega t-\gamma z}\oint_{S_j}\tilde{\rho}_{0j}dl \quad (D.13)$$

$$= Q_{0j}e^{j\omega t-\gamma z}$$

$$\vec{I}_j(z,t)=\oint_{S_j}\vec{J}_{surf}(z,t)dl=e^{j\omega t-\gamma z}\left(\frac{1}{\eta}\right)\oint_{S_j}\tilde{\rho}_{0j}dl\ \hat{z} \quad (D.14)$$

$$\vec{I_{0j}}e^{j\omega t-\gamma z} = \left(\frac{1}{\tilde{\eta}}\right)Q_{0j}e^{j\omega t-\gamma z}\hat{z}$$

where the integrals are taken over the surface, $S_j$, in the transverse plane. These definitions demonstrate that the current vector propagating in the $\hat{z}$ direction is proportional to the charge vector propagating in this direction.

In addition to this $\hat{z}$ current, there are shunt particle and shunt displacement currents which flow in the transverse plane. The magnitudes of these currents may be defined by:

$$\begin{aligned}
I_{shunt,part,j} &= \int_{S_j}\left(\frac{\sigma}{\epsilon}\right)\vec{D_t}\cdot\hat{n} \\
&= \left(\frac{\sigma}{\epsilon}\right)Q_{0j}e^{j\omega t-\gamma z} \\
I_{shunt,displ,j} &= \int_{S_j}\frac{d}{dt}\vec{D_t}\cdot\hat{n} \\
&= j\omega Q_{0j}e^{j\omega t-\gamma z}
\end{aligned} \quad (D.15)$$

For n+1 conductors in a transverse plane, we can define matrices K and Y which relate the charges that appear on these conductors to to the voltages applied to them, and the shunt particle and displacement currents to these same voltages:

$$\begin{bmatrix} Q_{01} \\ \cdot \\ \cdot \\ \cdot \\ Q_{0n} \end{bmatrix} = K \cdot \begin{bmatrix} V_{01} \\ \cdot \\ \cdot \\ \cdot \\ V_{0n} \end{bmatrix} \quad (D.16)$$

$$\begin{bmatrix} I_{shunt,part,1} \\ \cdot \\ \cdot \\ \cdot \\ I_{shunt,part,n} \end{bmatrix} = \left(\frac{\sigma}{\epsilon}\right)\begin{bmatrix} Q_{01} \\ \cdot \\ \cdot \\ \cdot \\ Q_{0n} \end{bmatrix} = \left(\frac{\sigma}{\epsilon}\right)K \cdot \begin{bmatrix} V_{01} \\ \cdot \\ \cdot \\ \cdot \\ V_{0n} \end{bmatrix}$$

$$\begin{bmatrix} I_{shunt,displ,1} \\ \cdot \\ \cdot \\ \cdot \\ I_{shunt,displ,n} \end{bmatrix} = j\omega\begin{bmatrix} Q_{01} \\ \cdot \\ \cdot \\ \cdot \\ Q_{0n} \end{bmatrix} = j\omega K \cdot \begin{bmatrix} V_{01} \\ \cdot \\ \cdot \\ \cdot \\ V_{0n} \end{bmatrix}$$

$$\begin{bmatrix} I_{shunt,displ,1} \\ \cdot \\ \cdot \\ \cdot \\ I_{shunt,displ,n} \end{bmatrix} + \begin{bmatrix} I_{shunt,part,1} \\ \cdot \\ \cdot \\ \cdot \\ I_{shunt,part,n} \end{bmatrix} = Y \cdot \begin{bmatrix} V_{01} \\ \cdot \\ \cdot \\ \cdot \\ V_{0n} \end{bmatrix}$$

We can use the relations between the voltage, charge, and current vectors to derive differential equations for the coupled transmission lines. If v is a voltage vector for an eigenmode of the n coupled transmission lines, the z derivative can be used to relate v to a corresponding current vector, i:

$$\begin{aligned}
\frac{d}{dz}v &= -\gamma v \\
&= -\gamma K^{-1} \cdot \begin{bmatrix} Q_{01} \\ \cdot \\ \cdot \\ Q_{0n} \end{bmatrix} \\
&= -\gamma \tilde{\eta} K^{-1} i
\end{aligned} \quad (D.17)$$

If we define L as:

$$L = \epsilon\mu_0 K^{-1} \quad (D.18)$$

and note that $(\gamma\tilde{\eta})$ is $(j\omega\epsilon\mu_0)$, we obtain:

$$\frac{d}{dz}v = -j\omega L \cdot i \quad (D.19)$$

Similarly, the z-derivative of the current eigenvector can be related to the corresponding voltage vector:

$$\begin{aligned}
\frac{d}{dz}i &= -\gamma i \\
&= -\left(\frac{\gamma}{\tilde{\eta}}\right)\cdot\begin{bmatrix} Q_{01} \\ \cdot \\ \cdot \\ Q_{0n} \end{bmatrix} \\
&= -\left(\left(\frac{\sigma}{\epsilon}\right)+j\omega\right)\cdot\begin{bmatrix} Q_{01} \\ \cdot \\ \cdot \\ Q_{0n} \end{bmatrix} \\
&= -Y \cdot v
\end{aligned} \quad (D.20)$$

where we have used the definitions of $\gamma$ and $\eta$ to reduce the factor $$\left(\frac{\gamma}{\tilde{\eta}}\right)$$

to $$\left(\left(\frac{\sigma}{\epsilon}\right)+j\omega\right),$$

which allowed the use of Equations (D.16) to replace the charge vector by the sum of particle and displacement shunt currents. Thus, we obtain the remaining transmission line equation in $$\frac{d}{dz}i:$$

$$\frac{d}{dz}i = -Y \cdot v \quad \text{(D.21)}$$

Appendix B

Growing Power Flow Along the Coupled Transmission Line

This appendix examines conditions which allow an increase in average power flow along a pair of coupled transmission lines. These coupled transmission lines are defined by the differential equations which describe the coupling between the voltage and currents on each transmission line:

$$\frac{d}{dz}v = -Z_{DE}i \quad \text{(C.1)}$$

$$\frac{d}{dz}i = -Y_{DE}v$$

where v is a vector with elements which correspond to the voltages on the two transmission lines, i is a vector with elements which correspond to the currents on these transmission lines, while $Z_{DE}$ and $Y_{DE}$ are coupling matrices of constant coefficients for the differential equations. The average power flow in the +z direction on both transmission lines is given by:

$$P_{average} = \left(\frac{1}{2}\right)Re(v_1\bar{i}_1 + v_2\bar{i}_2) \quad \text{(C.2)}$$

$$= \left(\frac{1}{2}\right)Re(v^T\bar{i})$$

where $\bar{i}$ is the complex conjugate of i, and $v^T$ is the transpose of v. The incremental change in power flow with incremental change in z is given by:

$$\frac{d}{dz}P_{average} = \left(\frac{1}{2}\right)Re\frac{d}{dz}[v^T\bar{i}] \quad \text{(C.3)}$$

$$= \left(\frac{1}{2}\right)Re\left\{\left(\frac{d}{dz}v\right)^T\bar{i} + v^T\left(\frac{d}{dz}\bar{i}\right)\right\}$$

$$= \left(\frac{-1}{2}\right)Re\{(Z_{DE}i)^T\bar{i} + v^T\overline{(Y_{DE}v)}\}$$

Expansion of each term in the above expression for $$\frac{d}{dz}P_{average}$$

using the identity, $$2Re(x) = x + \bar{x} \quad \text{(C.4)}$$

yields the results:

$$2Re\{(Z_{DE}i)^T\bar{i}\} = 2i^*Z_{Oh}i \quad \text{(C.5)}$$

$$2Re\{v^T\overline{(Y_{DE}v)}\} = 2v^*Y_{Oh}v$$

where i* is used to represent the complex conjugate transpose of i, v* is used to represent the complex conjugate transpose of v, and $Z_{Oh}$ and $Y_{Oh}$ are defined by:

$$Z_{Oh} = \left(\frac{1}{2}\right)[Z_{DE} + Z_{DE}*] \quad \text{(C.6)}$$

$$Y_{Oh} = \left(\frac{1}{2}\right)[Y_{DE} + Y_{DE}*]$$

Here we have used $Z^*_{DE}$ to represent the complex conjugate transpose of $Z_{DE}$, and $Y^*_{DE}$ to represent the complex conjugate transpose of $Y_{DE}$.

These results allow $$\frac{d}{dz}P_{average}$$

to be written more compactly:

$$\frac{d}{dz}P_{average} = \left(\frac{-1}{2}\right)\{(i^*Z_{Oh}i)+(v^*Y_{Oh}v)\} \quad \text{(C.7)}$$

$$= \left(\frac{-1}{2}\right)(\tilde{x}^*\tilde{A}\tilde{x})$$

where $\tilde{x}$ is composed of i and v, and $\tilde{A}$ is constructed from $Z_{Oh}$ and $Y_{Oh}$, as:

$$\tilde{x} = \begin{bmatrix} i_1 \\ i_2 \\ v_1 \\ v_2 \end{bmatrix} \quad \text{(C.8)}$$

$$\tilde{A} = \begin{bmatrix} Z_{Oh} & 0 \\ 0 & Y_{Oh} \end{bmatrix}$$

Power flow will decrease in the +z direction if $$\frac{d}{dz}P_{average}$$

is negative. Equation (C.7) states that this will occur for any $\tilde{x}$ if $\tilde{A}$ is positive definite. $\tilde{A}$ is hermitian, and thus is positive definite if each of its eigenvalues is positive. These eigenvalues can be related to the $Z_{DE}$ and $Y_{DE}$ coupling matrices via $Z_{Oh}$ and $Y_{Oh}$, by making use of the fact that the eigenvalues and eigenvectors of $\tilde{A}$ can be constructed from those of $Z_{Oh}$ and $Y_{Oh}$. That is, if $x_{z1}$ and $x_{z2}$, are eigenvectors of $Z_{Oh}$, and $x_{y1}$, and $X_{y2}$ are eigenvectors of $Y_{Oh}$, then the eigenvectors of $\tilde{A}$, noted as $x_1$, $x_2$, $x_3$, and $x_4$, can be constructed by:

$$x_1 = \begin{bmatrix} x_{z1} \\ 0 \\ 0 \end{bmatrix} \quad \text{(C.9)}$$

$$x_2 = \begin{bmatrix} x_{z2} \\ 0 \\ 0 \end{bmatrix}$$

$$x_3 = \begin{bmatrix} 0 \\ 0 \\ x_{y1} \end{bmatrix}$$

$$x_4 = \begin{bmatrix} 0 \\ 0 \\ x_{y2} \end{bmatrix}$$

It is straightforward to show that the eigenvectors $x_1$, $x_2$, $x_3$, and $x_4$, will have the same eigenvalues under the matrix operator, $\tilde{A}$ as the eigenvectors $x_{z1}$, $x_{z2}$, $x_{y1}$, and $x_{y2}$ have under the matrix operators $Z_{Oh}$ and $Y_{Oh}$, respectively. Thus, the conditions for a decrease in power flow along the +z direction can be found by the conditions for positive eigenvalues of $Z_{Oh}$ and $Y_{Oh}$.

Writing $Y_{DE}$ and $Z_{DE}$ in the form:

$$Y_{DE} = \begin{bmatrix} g_{11DE} + jb_{11DE} & g_{12DE} + jb_{12DE} \\ g_{21DE} + jb_{21DE} & g_{22DE} + jb_{22DE} \end{bmatrix} \quad \text{(C.10)}$$

$$Z_{DE} = \begin{bmatrix} r_{11DE} + jx_{11DE} & r_{12DE} + jx_{12DE} \\ r_{21DE} + jx_{21DE} & r_{22DE} + jx_{22DE} \end{bmatrix}$$

gives the following expressions for the corresponding hermitian matrices, $Y_{Oh}$, and $Z_{Oh}$:

$$Y_{Oh} = \left(\frac{1}{2}\right)\begin{bmatrix} 2g_{11DE} & y \\ \bar{y} & 2g_{22DE} \end{bmatrix} \quad \text{(C.11)}$$

$$Z_{Oh} = \left(\frac{1}{2}\right)\begin{bmatrix} 2r_{11DE} & z \\ \bar{z} & 2r_{22DE} \end{bmatrix}$$

where y and z are defined:

$$y = Y_{DE}(1,2) + \overline{Y_{DE}(2,1)}$$

$$z = Z_{DE}(1,2) + \overline{Z_{DE}(2,1)} \quad \text{(C.12)}$$

The eigenvalues of $Y_{Oh}$ and $Z_{Oh}$ can be found by the standard methods which yield characteristic equations for the eigenvalues of $Y_{Oh}$ and $Z_{Oh}$, noted as $\lambda_y$ and $\lambda_z$:

$$\lambda_y^2 - \lambda_y(g_{11DE} + g_{22DE}) + (g_{11DE}g_{22DE}) - (\tfrac{1}{4})|y|^2 = 0$$

$$\lambda_z^2 - \lambda_z(r_{11DE} + r_{22DE}) + (r_{11DE}r_{22DE}) - (\tfrac{1}{4})|z|^2 = 0 \quad \text{(C.13)}$$

These characteristic equations can be rewritten in terms of U-functions of the coupling matrices:

$$U_{Y-DE} = \frac{|Y_{DE}(2,1) - Y_{DE}(1,2)|^2}{4(g_{11DE}g_{22DE} - g_{12DE}g_{21DE})} \quad \text{(C.14)}$$

$$U_{Z-DE} = \frac{|Z_{DE}(2,1) - Z_{DE}(1,2)|^2}{4(r_{11DE}r_{22DE} - r_{12DE}r_{21DE})}$$

The use of these U-function definitions with the results:

$$(g_{11DE}g_{22DE}) - (\tfrac{1}{4})|y|^2 = (g_{11DE}g_{22DE} - \quad \text{(C.15)}$$
$$g_{12DE}g_{21DE}) - (\tfrac{1}{4})[(g_{12DE} - g_{21DE})^2 + (b_{12DE} - b_{21DE})^2]$$

$$(r_{11DE}r_{22DE}) - (\tfrac{1}{4})|z|^2 = (r_{11DE}r_{22DE} - \quad \text{(C.16)}$$
$$r_{12DE}r_{21DE}) - (\tfrac{1}{4})[(r_{12DE} - r_{21DE})^2 + (x_{12DE} - x_{21DE})^2]$$

allows the characteristic equations for $\lambda_y$ and $\lambda_z$ to be rewritten in the form:

$$\lambda_y^2 = \lambda_y(g_{11DE} + g_{22DE}) + \quad \text{(C.17)}$$
$$(g_{11DE}g_{22DE} - g_{12DE}g_{21DE})(1 - U_{Y-DE}) = 0$$

$$\lambda_z^2 = \lambda_z(r_{11DE} + r_{22DE}) +$$
$$(r_{11DE}r_{22DE} - r_{12DE}r_{21DE})(1 - U_{Z-DE}) = 0$$

These equations can be solved for $\lambda_y$ and $\lambda_z$, respectively, to give:

$$\lambda_{y\pm} = \frac{(g_{11DE} + g_{22DE})}{2} \pm \quad \text{(C.18)}$$

$$\left(\frac{1}{2}\right)\{(g_{11DE} + g_{22DE})^2 -$$

$$4(g_{11DE}g_{22DE} - g_{12DE}g_{21DE})(1 - U_{Y-DE})\}^{1/2}$$

$$\lambda_{z\pm} = \frac{(r_{11DE} + r_{22DE})}{2} \pm$$

$$\left(\frac{1}{2}\right)\{(r_{11DE} + r_{22DE})^2 -$$

$$4(r_{11DE}r_{22DE} - r_{12DE}r_{21DE})(1 - U_{Z-DE})\}^{1/2}$$

These results for $\lambda_{y,\pm}$ and $\lambda_{z,\pm}$ can be used to find conditions which determine that there will be a decrease in power flow along the +z direction. As noted earlier, this result occurs when $\tilde{A}$ is positive definite, which is given by positive values for $\lambda_{y,\pm}$ and $\lambda_{z,\pm}$. $\lambda_{y,+}$ and $\lambda_{z,+}$ are positive if $g_{11DE}$, $g_{22DE}$, $r_{11DE}$, and $r_{22DE}$ are all positive. It then remains to find conditions for positive values of $\lambda_{y,-}$ and $\lambda_{z,-}$. These positive values occur when the following inequalities are satisfied:

$$0 < \left(\frac{1}{2}\right)(g_{11DE} + g_{22DE}) - \quad \text{(C.19)}$$

$$\left(\frac{1}{2}\right)\{(g_{11DE} + g_{22DE})^2 - 4(g_{11DE}g_{22DE} -$$

$$g_{12DE}g_{21DE})(1 - U_{Y-DE})\}^{1/2}$$

$$0 < \left(\frac{1}{2}\right)(r_{11DE} + r_{22DE}) -$$

$$\left(\frac{1}{2}\right)\{(r_{11DE} + r_{22DE})^2 - 4(r_{11DE}r_{22DE} -$$

$$r_{12DE}r_{21DE})(1 - U_{Z-DE})\}^{1/2}$$

These inequalities can be simplified to:

$$(g_{11DE}g_{22DE} - g_{12DE}g_{21DE})(1 - U_{Y-DE}) > 0$$

$$(r_{11DE}r_{22DE} - r_{12DE}r_{21DE})(1 - U_{Z-DE}) > 0 \quad \text{(C.20)}$$

Thus, if $g_{11DE}$, $g_{22DE}$, $r_{11DE}$, and $r_{22DE}$ are all positive, and the coupling matrices satisfy:

$$\begin{cases} 1 > U_{Y-DE} > 0 \\ \Delta_G = (g_{11DE}g_{22DE} - g_{12DE}g_{21DE}) > 0 \end{cases} \quad \text{(C.21)}$$

and

-continued $$\begin{cases} 1 > U_{Z-DE} > 0 \\ \Delta_R = (r_{11DE} r_{22DE} - r_{12DE} r_{21DE}) > 0 \end{cases} \quad (C.22)$$

then there will be a decrease in power flow in the +z direction. Conversely, if these conditions are not satisfied, there is the possibility of an increase in power flow along this direction. In this way, the U-functions of the coupling matrices can determine the possibility of an increase in power flow along the coupled length of the transmission lines. This derivation follows a similar analysis developed by Ernest S. Kuh and R. A. Rohrer, *Theory of Linear Active Networks*, Holden-Day, Inc., San Francisco (1967), which relates these same conditions on the U-function of a 2-port network to the possibility of power gain for the 2-port.

What is claimed is:

1. A method of improving the performance of a traveling wave field-effect transistor operated at frequencies in the microwave range or above the microwave range, and having signals propagating therethrough generally from and to electrodes attached thereto defining a traveling wave signal direction, said traveling wave field-effect transistor defining a semiconductor structure, said semiconductor structure, taken in cross section in a transverse direction at right angles to said traveling wave signal direction, corresponding to a field effect transistor defining a maximum frequence of signal amplification, comprising the steps of:

forming a depletion region generally beneath a gate electrode wherein, in a plane transverse to said direction of signal propagation, said depletion region defining an edge located between the gate electrode and a drain electrode region; and separating the depletion region edge from the drain electrode region such that said traveling wave field effect transistor provides useful traveling wave signal gain at frequencies higher than said maximum frequency.

2. The method of claim 1 further comprising the step of:

controlling conductivity of a semiconductor of the traveling-wave field effect transistor.

3. A traveling wave field-effect transistor operated at frequencies in the microwave range or above the microwave range, and having signals propagating therethrough generally from and to electrodes attached thereto defining a traveling wave signal direction, said traveling wave field-effect transistor defining a semiconductor structure, said semiconductor structure, taken in cross section in a transverse direction at right angles to said traveling wave signal direction, corresponding to a field effect transistor defining a maximum frequency of signal amplification, comprising:

at least one gate electrode constructed in said structure, at least one source electrode region constructed in said structure, at least one drain electrode region constructed in said structure, a depletion region generally beneath said gate electrode wherein, in a plane transverse to said direction of signal propagation, said depletion region defining an edge located between the gate electrode and a drain electrode region, and means for separating the depletion region edge from the drain electrode region such that said traveling wave field effect transistor provides useful traveling wave signal gain at frequencies higher than said maximum frequency.

4. A method of improving the performance of a semiconductor structure forming a traveling wave field-effect transistor operated at frequencies in the microwave range or above the microwave range, said structure defining at least one of gate electrode and source and drain electrode regions, said structure having traveling wave signals propagating therethrough defining a traveling wave signal direction and a transverse direction configured at right angles to said traveling wave signal direction, said structure in cross section taken in said transverse direction corresponding to a field effect transistor, comprising the steps of:

forming a depletion region generally beneath said gate electrode wherein, in a plane in said transverse direction and at right angles to said traveling wave signal direction, said depletion region defines an edge, and in that transverse plane determining first shortest straight lines between said gate electrode and the drain electrode region, and determining second shortest straight lines between the between said gate electrode and the source electrode region, separating said depletion region edge from the drain electrode region and adjusting the depletion region edge such that those portions of this edge that are farthest from the gate electrode are closer to any of said second shortest straight lines than to any of said first shortest straight lines.

5. A semiconductor structure forming a traveling wave field-effect transistor operated at frequencies in the microwave range or above the microwave range, said structure defining gate electrode and source and drain electrode regions, said structure having traveling wave signals propagating therethrough defining a traveling wave signal direction and a transverse direction configured at right angles to said traveling wave signal direction, said structure in cross section taken in said transverse direction corresponding to a field effect transistor, comprising:

a depletion region generally beneath said gate electrode wherein, in a plane in said transverse direction and at right angles to said traveling wave signal direction, said depletion region defines an edge, means for determining first shortest straight lines in that transverse plane between said gate electrode and the drain electrode region, means for determining second shortest straight lines in that transverse plane between said gate electrode and the source electrode region, means for separating said depletion region edge from the drain electrode region and adjusting the depletion region edge such that portions of this edge that are farthest from the gate electrode are closer to any of said second straight lines than to any of said first straight lines.

6. A method of improving the performance of a traveling wave field-effect transistor comprising the steps of:

forming a semiconductor structure defining a traveling wave signal propagation direction and a transverse direction configured at right angles to said signal propagation direction, defining a coupling length of said structure in said signal propagation direction having electrodes configured for attaching transmission lines for an input signal and for an output signal, said input and output attachment areas at opposite ends of said coupling length, forming at least one gate electrode extending along said coupling length in the signal propagation direction, forming at least one source electrode extending along said coupling length in the signal propagation direction, forming at least one drain electrode extending along said coupling length in the signal propagation direction, wherein a traveling wave field-effect transistor is formed, attaching transmission line to the electrodes at one end of said coupling length for an input signal, attaching transmission line to the electrodes at said opposite end of said coupling length for an output signal, depleting a region generally beneath said at least one gate electrode, said depletion region, when viewed in a cross section of said semiconductor structure taken in said transverse direction, having an edge, positioning said edge between said at least one gate electrode and said at least one drain electrode region, and, in the transverse plane, defining first shortest straight lines between said at least one gate electrode and the at least one drain electrode region and defining second shortest straight lines between said at least one gate electrode and said at least one source electrode region, separating the depletion region edge from the at least one drain electrode region, and adjusting the depletion region edge such that those portions of this edge that are farthest from the at least one gate electrode are closer to any of said second straight lines than to any of said first straight lines.

7. A traveling wave field-effect transistor operated at frequencies in the microwave range or above the microwave range, and having signals propagating in a direction therethrough generally from and to electrodes attached thereto comprising:

semiconductor structure defining a traveling wave signal propagation direction and a transverse direction configured at right angles to said signal propagation direction, a coupling length of said structure in said signal propagation direction having electrodes configured for attaching transmission lines for an input signal and for an output signal, said input and output attachment areas at opposite ends of said coupling length, at least one gate electrode extending along said coupling length in said signal propagation direction, at least one source electrode extending along said coupling length in said signal propagation direction, at least one drain electrode extending along said coupling length in said signal propagation direction, wherein a traveling wave field-effect transistor is formed, a transmission line attached to the electrodes at one end of said coupling length for an input signal, a transmission line attached to the electrodes at said opposite end of said coupling length for an output signal, a depletion region generally beneath said at least one gate electrode, said depletion region, when viewed in a cross section of said semiconductor structure taken in said transverse direction, having an edge, means for positioning said edge between said at least one gate electrode and said at least one drain electrode region, and, in the transverse plane, means for defining first shortest straight lines between said at least one gate electrode and the at least one drain electrode region and means for defining second shortest straight lines between said at least one gate electrode and said at least one source electrode region, means for separating the depletion region edge from the at least one drain electrode region, and means for adjusting the depletion region edge such that those portions of this edge that are farthest from the at least one gate electrode are closer to any of said second straight lines than to any of said first straight lines.

8. A method of improving the performance of a traveling wave field-effect transistor comprising the steps of:

forming a semiconductor structure defining a traveling wave signal propagation direction and a transverse direction configured at right angles to said traveling wave signal propagation direction, said structure in cross section taken in said transverse direction perpendicular to said traveling wave signal propagation direction corresponding to a field-effect transistor defining a maximum frequency of signal amplification, defining a coupling length of said structure in said traveling wave signal propagation direction having electrodes configured for attaching transmission lines for an input signal and for an output signal, said input and output attachment areas at opposite ends of said coupling length, forming at least one gate electrode extending along said coupling length in the traveling wave signal propagation direction, forming at least one source electrode extending along said coupling length in the traveling wave signal propagation direction, forming at least one drain electrode extending along said coupling length in the traveling wave signal propagation direction, wherein a traveling wave field-effect transistor is formed, attaching transmission line to the electrodes at one end of said coupling length for an input signal, attaching transmission line to the electrodes at said opposite end of said coupling length for an output signal, depleting a region generally beneath said at least one gate electrode, said depletion region, when viewed in a cross section of said semiconductor structure taken in said transverse direction, having an edge, positioning said edge between said at least one gate electrode and said at least one drain electrode region, and separating the depletion region edge from the at least one drain electrode region such that said output signal is related to said input signal by a useful gain factor at frequencies higher than said maximum frequency.

9. A traveling wave field-effect transistor operated at frequencies in the microwave range or above the microwave range, and having traveling wave signals propagating in a direction therethrough generally from and to electrodes attached thereto, comprising:

semiconductor structure defining a traveling wave signal propagation direction and a transverse direction configured at right angles to said traveling wave signal propagation direction, said structure in cross section taken in said transverse direction perpendicular to said traveling wave signal propagation direction, said cross section corresponding to a field-effect transistor defining a maximum frequency of signal amplification, a coupling length of said structure in said traveling wave signal propagation direction having electrodes configured for attaching transmission lines for an input signal and for an output signal, said input and output attachment areas at opposite ends of said coupling length, at least one gate electrode extending along said coupling length in the traveling wave signal propagation direction, at least one source electrode extending along said coupling length in the traveling wave signal propagation direction, at least one drain electrode extending along said coupling length in the traveling wave signal propagation direction, wherein a traveling wave field-effect transistor is formed, input transmission line attached to the electrodes at one end of said coupling length for an input signal, output transmission line attached to the electrodes at said opposite end of said coupling length for an output signal, a depletion region generally beneath said at least one gate electrode, said depletion region, when viewed in a cross section of said semiconductor structure taken in said transverse direction, having an edge, means for positioning said edge between said at least one gate electrode and said at least one drain electrode region, and means for separating the depletion region edge from the at least one drain electrode region such that said output signal is related to said input signal by a useful gain factor at frequencies higher than said maximum frequency.

10. The method of claim 4 or 6 further comprising the step of:

controlling conductivity of a semiconductor of the traveling-wave field effect transistor.

11. The method of claim 1, 2, 10, 3, 4, 6 or 8 further comprising the steps of: forming at least one gate electrode, at least one drain electrode region, and at least one source electrode region, and positioning said edge of said depletion region wherein said edge has a first end portion located between said gate electrode and said drain electrode region and a second end portion distal from said gate electrode in a direction towards said source electrode region, and forming said gate electrode to be about one micron in length.

12. The method of claim 1, 8, 2, 4, 6, or 10, wherein the conductivity of the semiconductor material, when viewed in said cross section taken in said transverse direction, in a region which forms the channel of the field-effect transistor, said semiconductor material extending between the depletion region edge and the source and drain electrode regions is substantially 1.6 Siemens/cm.

13. The method of claim 1, 8, 2, 4, 6 or 10, wherein the conductivity is higher in the local area adjacent to the at least one drain electrode region.

14. The method of claim 1, 8, 4, 6, or 10, comprising the further step of forming a reverse bias between the gate electrode and the drain electrode region which is less than the reverse bias between the gate electrode and the source electrode region.

15. The method of claim 1, 8, 4, or 6 wherein a signal is input to a drain-source electrode pair and the signal is taken from a gate-source electrode pair.

16. The traveling wave field-effect transistor of claim 3 or 9 wherein a conductivity of a semiconductor of the traveling-wave field effect transistor is substantially 1.6 Siemens/cm.

17. The traveling wave field-effect transistor of claim 5 or 7 wherein a conductivity of a semiconductor of the traveling-wave field effect transistor is substantially 1.6 Siemens/cm.

18. The traveling wave field-effect transistor of claim 3, 9, 5 or 7, wherein a conductivity of a semiconductor of the traveling-wave field effect transistor is increased in a local area adjacent to said drain electrode region between the depletion region edge and the drain electrode region.

19. The traveling wave field-effect transistor of claim 16, 17, 18, 5, 7 or 9 further comprising:

means for forming at least one gate electrode, at least one drain electrode region, and at least one source electrode region, and means for positioning said edge of said depletion region wherein said edge has a first end portion located between said gate electrode and said drain electrode region and said edge has a second end portion located distal from said gate electrode in a direction towards said source electrode region, and means for forming said gate electrode to be about one micron in length.

20. The traveling wave field-effect transistor of claim 16, 17, 18, 3, 5, 7 or 9 further comprising:

means for forming a reverse bias between the at least one gate electrode and the at least one drain electrode region which is less than the reverse bias between the at least one gate electrode and the at least one source electrode region.

21. The traveling wave field-effect transistor of claim 3, 9, 5, 16, 17, 18 or 7 wherein a signal is input to a drain-source electrode pair and the signal is taken from a gate-source electrode pair.

* * * * *

UNITED STATES PATENT AND TRADEMARK OFFICE
CERTIFICATE OF CORRECTION

PATENT NO. : 5,627,389
DATED : May 6, 1997
INVENTOR(S) : Alison Schary

It is certified that error appears in the above-identified patent and that said Letters Patent is hereby corrected as shown below:

Title page,
Item [76], the address should read, -- Alison Schary, 77 Bartlett Ave., #2, Arlington, MA 02174 --
Item [56], the "References Cited -- OTHER PUBLICATIONS" section, the correct entry for S. M. Sze should read -- S. M. Sze, "Physics of Semiconductor Devices", 1981 pp. 29, 334, 336-344 --

Column 3,
Line 17, the word "quantifies" should be -- quantities --

Column 4,
Equation near line 5, the quantity in the denominator should be -- $v_c$ -- instead of $v_e$; this equation should read --

$$L = \mu_0 \varepsilon K^{-1} = \left(\frac{1}{v_c^2}\right) K^{-1}$$

Line 61, should read -- terms of a matrix element, $m_{kl}$, in which $m_{kl} = m_{lk}$. This --
Line 62 and line 65, in these lines, the reference to "conductor 1" should be references to -- conductor $l$ --.

Column 6,
Equations near line 45, this equation becomes -- $q_{g.b} = K_{g\text{-}s} \cdot 0 + K_{g\text{-}d} \cdot v_0$ --

Column 9,
In the first of these three equations, the first "=" should be -- - -- sign. With this correction, this first of these three equations would appear as --

$$-\bar{\nabla} \cdot \varepsilon \bar{\nabla} \phi - |q|(N_d - n) = 0$$

Column 13,
Line 9, the last part of the sentence which appears on lines 7-9 should read --
    source electrode 10 and the gate electrode 16, and to the pair of electrodes of the source electrode 10' and the gate electrode 16'.

UNITED STATES PATENT AND TRADEMARK OFFICE
CERTIFICATE OF CORRECTION

PATENT NO. : 5,627,389
DATED : May 6, 1997
INVENTOR(S) : Alison Schary

It is certified that error appears in the above-identified patent and that said Letters Patent is hereby corrected as shown below:

Column 14,
Line 29, this line would read as -- The values for $X_{sg}$, $X_{gd}$, $|X|_{max\text{-}depth}$, and $Y_{max\text{-}depth}$ are --

Column 15,
Line 19, in this line the reference to "MAC" should be -- MAG --.
Line 50-51, the phrase on these two lines should read -- FIGS. 17-20, show the AC admittance matrix elements for Case 2, --
Line 58-59, the reference on these lines to "FIGS. 37-52" should be a reference to -- FIGS. 37-60 --.
Line 63-64, the reference in the phrase on these lines should read -- FIGS. 49-52 show the AC charge matrix elements for Case 4, --

Column 16,
Line 16, in this line the word "dement" should be -- element --.
Line 28, add a -- ' -- to the reference to the gate electrode 16 in this line to form -- 16' --.

Column 17,
Line 13, in this line, the reference should be -- $Y_{max\text{-}depth}$ --
Lines 43-45, the reference should be to -- charge matrix element values --.
Lines 48-51, the sentences on these lines should read
-- FIGS. 73-76 show the AC charge matrix elements foe Case 1,
FIGS. 77-80 show the AC charge matrix elements for Case 2,
FIGS. 81-84 show the AC charge matrix elements for Case 3. --
Line 58, the line should read -- In Table I, Cases 5 and 6 and Table II, Cases 2 and 3, the... --
Line 59, the corrected kine should read as -- TWFETs have localized regions of increased donor density --

Column 18,
Line 5, the correct units are "Siemens/cm" instead of -- Siemens/era --.

UNITED STATES PATENT AND TRADEMARK OFFICE
CERTIFICATE OF CORRECTION

PATENT NO.   : 5,627,389
DATED        : May 6, 1997
INVENTOR(S)  : Alison Schary It is certified that error appears in the above-identified patent and that said Letters Patent is hereby corrected as shown below:

Column 19,
Equations near lines line 5-15 (numbered (D.3)):
The correct equations for these lines (equations numbered (D.3)) are:

$$\vec{\nabla} \cdot \tilde{D} = 0$$

$$\vec{\nabla} \cdot \tilde{H} = 0$$

$$\vec{\nabla} \times \tilde{D} = -j\omega\varepsilon\mu_0 \tilde{H}$$

$$\vec{\nabla} \times \tilde{H} = \left(\frac{\sigma}{\varepsilon} + j\omega\right)\tilde{D}$$

Equations near lines lines 19-31 (numbered (D.4)):
The correct equations for these lines (equations numbered (D.4)) are:

$$\vec{\nabla}_t \cdot \tilde{H}_t = 0, \; \vec{\nabla}_t \cdot \tilde{D}_t = 0$$

$$\vec{\nabla}_t \times \tilde{H}_t = 0, \; \vec{\nabla}_t \times \tilde{D}_t = 0$$

$$-j\omega\varepsilon\mu_0 \tilde{H}_t = \hat{z} \times \frac{d}{dz}\tilde{D}_t$$

$$\left(\frac{\sigma}{\varepsilon} + j\omega\right)\tilde{D}_t = \hat{z} \times \frac{d}{dz}\tilde{H}_t$$

$$-\nabla^2 \tilde{H} = -\tilde{k}^2 \tilde{H}, \; -\nabla^2 \tilde{D} = -\tilde{k}^2 \tilde{D}$$

Lines 44-48, the sentence on these lines should read-- Finally, the equations in $\nabla^2 \tilde{H}$ and $\nabla^2 \tilde{D}$ follow from taking the curl of both sides of Maxwell's curl equations for $\tilde{H}$ and $\tilde{D}$ and noting the divergence of $\tilde{H}$ and $\tilde{D}$ are zero.

UNITED STATES PATENT AND TRADEMARK OFFICE
CERTIFICATE OF CORRECTION

PATENT NO. : 5,627,389
DATED : May 6, 1997
INVENTOR(S) : Alison Schary

It is certified that error appears in the above-identified patent and that said Letters Patent is hereby corrected as shown below:

Column 19, (continued),
Line 63, the word "fie" should be -- the --.

Column 20,
Line 39, and mathematical expression following, the line and mathematical expression which follows it should read -- where $\tilde{\eta}$ is given by the ratio, $$((j\omega\mu_0\varepsilon)/\gamma).$$

--

Line 50, (equation numbered (D.12)), the variable $Js\bar{u}rf$ which appears in this line should be $\tilde{J}_{surf}$.

Column 22,
Line 20, (line before equation numbered (D.19)), this line should read -- and note that $(\gamma\tilde{\eta})$ is $(j\omega\varepsilon\mu_0)$, we obtain:

--

Column 23,
Line 1, this line should read -- where we have used the definitions of $\gamma$ and $\tilde{\eta}$ to reduce the

--

Column 24,
Line 65, in this line the reference to "$X_{y2}$" should be a reference to "$x_{y2}$" (I.e. a lower-case x should be used.)

UNITED STATES PATENT AND TRADEMARK OFFICE
CERTIFICATE OF CORRECTION

PATENT NO. : 5,627,389
DATED : May 6, 1997
INVENTOR(S) : Alison Schary

It is certified that error appears in the above-identified patent and that said Letters Patent is hereby corrected as shown below:

Column 26,
Equation near lines 10-15, numbered (C.17), these equations (which are numbered C.17), should be --

$$\lambda_y^2 - \lambda_y (g_{11DE} + g_{22DE}) + (g_{11DE} g_{22DE} - g_{12DE} g_{21DE})(1 - U_{Y-DE}) = 0$$

$$\lambda_z^2 - \lambda_z (r_{11DE} + r_{22DE}) + (r_{11DE} r_{22DE} - r_{12DE} r_{21DE})(1 - U_{Z-DE}) = 0$$

--

Signed and Sealed this

Twenty-second Day of January, 2002

Attest:

*Attesting Officer*

JAMES E. ROGAN
*Director of the United States Patent and Trademark Office*